(12) United States Patent
Katakami

(10) Patent No.: US 9,728,468 B2
(45) Date of Patent: Aug. 8, 2017

(54) SEMICONDUCTOR DEVICE AND MANUFACTURING METHOD THEREOF

(71) Applicant: FUJITSU SEMICONDUCTOR LIMITED, Yokohama-shi, Kanagawa (JP)

(72) Inventor: Akira Katakami, Kawasaki (JP)

(73) Assignee: FUJITSU SEMICONDUCTOR LIMITED, Yokohama (JP)

( * ) Notice: Subject to any disclaimer, the term of this patent is extended or adjusted under 35 U.S.C. 154(b) by 0 days.

(21) Appl. No.: 14/981,174

(22) Filed: Dec. 28, 2015

(65) Prior Publication Data

US 2016/0133527 A1 May 12, 2016

Related U.S. Application Data

(62) Division of application No. 14/294,654, filed on Jun. 3, 2014, now Pat. No. 9,257,425.

(30) Foreign Application Priority Data

Jun. 14, 2013 (JP) .................................. 2013-125374

(51) Int. Cl.
*H01L 21/8238* (2006.01)
*H01L 27/092* (2006.01)

(52) U.S. Cl.
CPC ............... *H01L 21/823892* (2013.01); *H01L 21/823871* (2013.01); *H01L 27/092* (2013.01)

(58) Field of Classification Search
CPC ........... H01L 27/092; H01L 21/823892; H01L 21/823871; H03K 19/0948
See application file for complete search history.

(56) References Cited

U.S. PATENT DOCUMENTS 5,576,570 A 11/1996 Ohsawa et al.
6,750,527 B1 6/2004 Momohara
(Continued)

FOREIGN PATENT DOCUMENTS

JP 10-125800 A 5/1998
JP 2000-312004 A 11/2000
(Continued)

OTHER PUBLICATIONS

Office Action dated Dec. 27, 2016, issued in counterpart Japanese application No. 2013-125374, with English machine translation. (4 pages).

*Primary Examiner* — Tucker J Wright
(74) *Attorney, Agent, or Firm* — Westerman, Hattori, Daniels & Adrian, LLP

(57) ABSTRACT

A first well in a first conductivity type which is formed at a first region and is electrically connected to a first power supply line, a second well in a second conductivity type being an opposite conductivity type of the first conductivity type which is formed at a second region and is electrically connected to a second power supply line, a third well in the second conductivity type which is integrally formed with the second well at a third region adjacent to the second region, a fourth well in the first conductivity type integrally formed with the first well at a fourth region adjacent to the first region, a fifth well in the first conductivity type which is formed at the third region to be shallower than the third well, and a sixth well in the second conductivity type which is formed at the fourth region to be shallower than the fourth well, are included.

5 Claims, 78 Drawing Sheets

(56) References Cited

U.S. PATENT DOCUMENTS

2002/0036326 A1   3/2002  DeJong et al.
2004/0079999 A1   4/2004  Shibata et al.
2007/0063284 A1   3/2007  Kawahara et al.

FOREIGN PATENT DOCUMENTS

| JP | 2002-50944 A   | 2/2002 |
| JP | 2002-198439 A  | 7/2002 |
| JP | 2003-86685 A   | 3/2003 |
| JP | 2007-042730 A  | 2/2007 |

SEMICONDUCTOR DEVICE AND MANUFACTURING METHOD THEREOF

CROSS-REFERENCE TO RELATED APPLICATION

This application is a Divisional of U.S. application Ser. No. 14/294,654 filed Jun. 3, 2014, which claims priority of prior Japanese Patent Application No. 2013-125374, filed on Jun. 14, 2013, the entire contents of which are incorporated herein by reference.

FIELD

The embodiments discussed herein are directed to a semiconductor device and a manufacturing method thereof.

BACKGROUND

It is proposed to operate a semiconductor device with a lower power supply voltage as a measure for lowering power consumption of the semiconductor device such as an LSI (Large Scale Integration).

However, when the power supply voltage is just set low, driveability of a transistor is lowered.

When the driveability of the transistor is lowered, slew rate of a signal waveform becomes small, and operating speed becomes slower.

It is proposed to set a threshold voltage of the transistor low as a measure to secure the driveability of the transistor even when the power supply voltage is lowered.

[Patent Document 1] Japanese Laid-open Patent Publication No. 2003-86685

[Patent Document 2] Japanese Laid-open Patent Publication No. 2002-198439

[Patent Document 3] Japanese Laid-open Patent Publication No. 2007-42730

[Patent Document 4] Japanese Laid-open Patent Publication No. 2000-312004

However, when the threshold voltage of the transistor is just set low, a leak current increases. A power consumption is increased if the leak current increases. Besides, further downsizing of the semiconductor device has been demanded.

SUMMARY

According to an aspect of the embodiment, a semiconductor device, comprising: a semiconductor substrate that includes a first region, a second region, a third region and a fourth region; a first power supply line; a second power supply line; and a logic cell that includes an input terminal, an output terminal, a first well of a first conductivity type formed in the first region of the semiconductor substrate and electrically connected to the first power supply line, a second well of a second conductivity type that is an opposite conductivity type of the first conductivity type formed the second region of the semiconductor substrate and electrically connected to the second power supply line, a third well of the second conductivity type formed in the third region of the semiconductor substrate; a fourth well of the first conductivity type formed in the fourth region of the semiconductor substrate; a fifth well of the first conductivity type formed in the third region and located shallower than the third well; a sixth well of the second conductivity type formed in the fourth region and located shallower than the fourth well, a first complementary transistor pair that is electrically connected to the input terminal, a first transistor of the first complementary transistor pair includes a first source/drain region of the second conductivity type formed in the first well and a first gate electrode, a second transistor of the first complementary transistor pair includes a second source/drain region of the first conductivity type formed in the second well and a second gate electrode, a second complementary transistor pair that is electrically connected to the output terminal, a third transistor of the second complementary transistor pair includes a third source/drain region of the second conductivity type formed in the fifth well and a third gate electrode that is electrically connected to the fifth well, and a fourth transistor of the second complementary transistor pair includes a fourth source/drain region of the first conductivity type formed in the sixth well and a fourth gate electrode that is electrically connected to the sixth well, is provided.

According to another aspect of the embodiment, a manufacturing method of a semiconductor device, comprising: forming a first well of a first conductivity type in a first region of a semiconductor substrate; forming a second well of a second conductivity type that is opposite to the first conductivity type in a second region of the semiconductor substrate; forming a third well of the second conductivity type in a third region of the semiconductor substrate; forming a fourth well of the first conductivity type in a fourth region of the semiconductor substrate; forming a fifth well of the first conductivity type that is shallower than the third well in the third region; forming a sixth well of the second conductivity type that is shallower than the fourth well at the fourth region; forming a first gate electrode of a first transistor of a first complementary transistor pair on the first well; forming a second gate electrode of a second transistor of the complementary transistor pair on the second well forming a third gate electrode, that is electrically connected to the fifth well, of a third transistor of a second complementary transistor pair on the fifth well; forming a fourth gate electrode, that is electrically connected to the sixth well, of a fourth transistor of the second complementary transistor pair on the sixth well; forming a first source/drain region of the second conductivity type in the first well and of the first transistor; forming a second source/drain region of the first conductivity type in the second well and of the second transistor; forming a third source/drain region of the second conductivity type in the fifth well and of the third transistor; forming a fourth source/drain region of the first conductivity type in the sixth well and of the fourth transistor; and connecting the first well to a first power supply line, and connecting the third well to a second power supply line, wherein the semiconductor device includes a logic cell that includes the first complementary transistor pair and the second complementary transistor pair, the first complementary transistor pair is electrically connected to an input terminal of the logic cell, and the second complementary transistor pair is electrically connected to an output terminal of the logic cell, is provided.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENTS

Figure 81A:
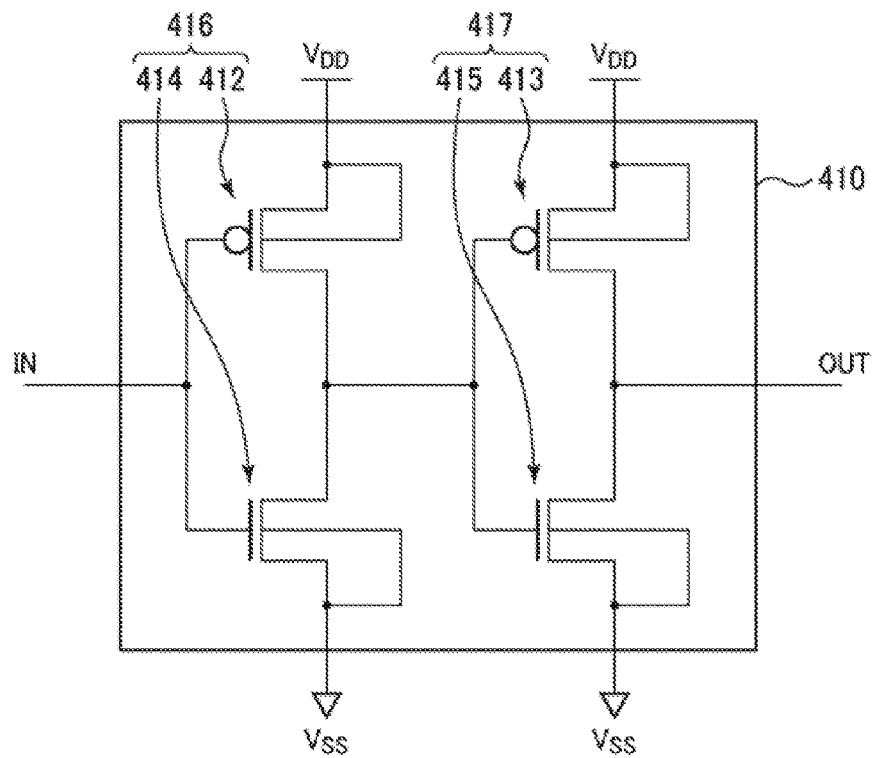
FIGS. 81A, 81B each are a circuit diagram illustrating a logic cell according to a reference example.

FIG. 81A is a circuit diagram illustrating a logic cell according to a reference example (part 1). Here, a buffer circuit is exemplified as the logic cell.

A logic cell 410 is formed by connecting CMOS inverters 416, 417 in plural stages. The CMOS inverter 416 at a first stage is formed by a PMOS transistor 412 and an NMOS transistor 414. The CMOS inverter 417 at a second stage is formed by a PMOS transistor 413 and an NMOS transistor 415. The CMOS inverter 416 at the first stage is connected to an input terminal IN. An output of the CMOS inverter 416 at the first stage is connected to an input of the CMOS inverter 417 at the second stage. An output of the CMOS inverter 417 at the second stage is connected to an output terminal OUT. The PMOS transistors 412, 413 are electrically connected to a power supply potential VDD. The NMOS transistors 414, 415 are electrically connected to a ground potential VSS.

A logic cell 410 using MOS transistors is thereby formed.

As a measure to reduce power consumption of a semiconductor device, it is proposed to operate the semiconductor device with a lower power supply voltage.

However, when the power supply voltage is just set low, driveabilities of the MOS transistors 412 to 415 are incurred. When the driveabilities of the MOS transistors 412 to 415 are lowered, slew rate of a signal waveform becomes smaller, and an operating speed becomes slower.

As a measure to improve the driveabilities of the MOS transistors 412 to 415, it is conceivable to set threshold voltages of the MOS transistors 412 to 415 low.

However, when the threshold voltages of the MOS transistors 412 to 415 are just set low, a leak current increases, and it is impossible to sufficiently reduce power consumption.

Figure 81B:
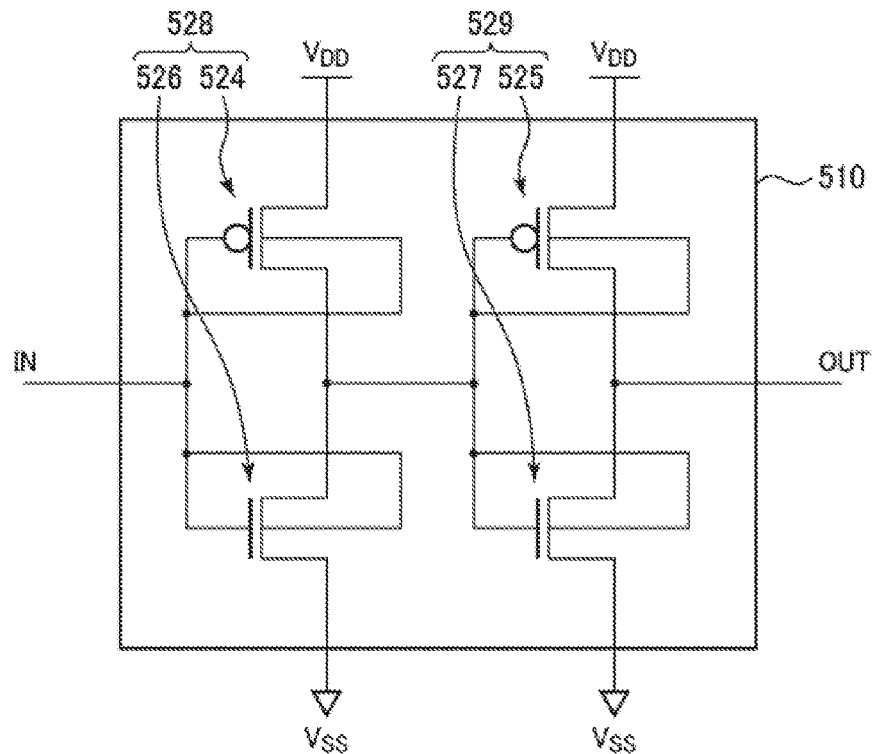

FIG. 81B is a circuit diagram illustrating a logic cell according to a reference example (part 2).

A logic cell 510 is formed by connecting CMOS inverters 528, 529 in plural stages.

The CMOS inverter 528 at a first stage is formed by a P-channel type dynamic threshold voltage MOS transistor (Dynamic Threshold Voltage MOSFET, DTMOS transistor) 524 and an N-channel type DTMOS transistor 526.

The DTMOS transistor is one in which a well where the MOS transistor is formed and a gate of the MOS transistor are electrically connected. In the DTMOS transistor, an input signal applied to the gate is also applied to the well where the transistor is formed, and therefore, it is possible to obtain high driveability in ON state without increasing the leak current in OFF state.

The CMOS inverter 529 at a second stage is formed by a P-channel type DTMOS transistor 525 and an N-channel type DTMOS transistor 527.

The CMOS inverter 528 at the first stage is connected to an input terminal IN. An output of the CMOS inverter 528 at the first stage is connected to an input of the CMOS inverter 529 at the second stage. An output of the CMOS inverter 529 at the second stage is connected to an output terminal OUT. The PMOS transistors 524, 525 are electrically connected to the power supply potential VDD. The NMOS transistors 526, 527 are electrically connected to the ground potential VSS.

The logic cell 510 using the DTMOS transistors 524 to 527 is thereby formed.

In the logic cell 510 as stated above, it is possible to enable speed-up without increasing the leak current because the DTMOS transistors 524 to 527 are used.

However, there is a demerit in the logic cell formed by the DTMOS transistors 524 to 527 in which an input capacitance becomes relatively large, and increasing of power consumption and lowering of operating speed are incurred.

[First Embodiment]

Figure 1:
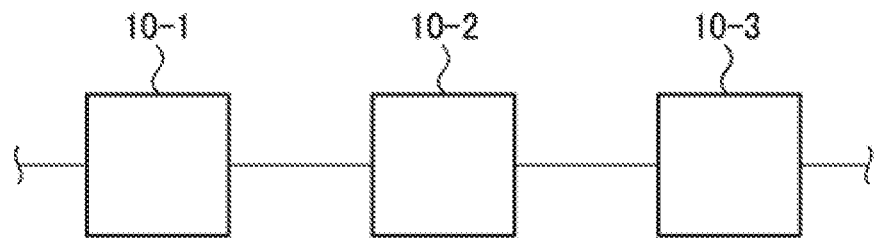
FIG. 1 is a block diagram illustrating a part of a semiconductor device according to a first embodiment.
Figure 52A:
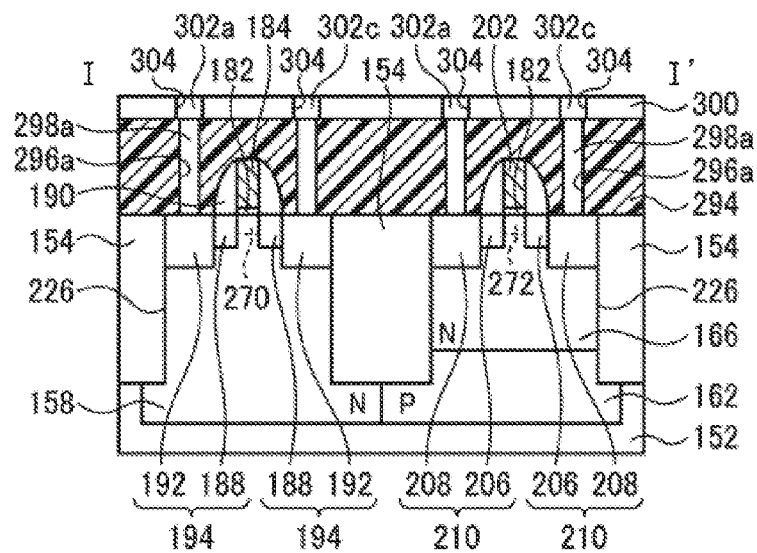
FIGS. 52A, 52B and 52C each are a process chart (part 36) illustrating the manufacturing method of the semiconductor device according to the first embodiment.
Figure 52B:
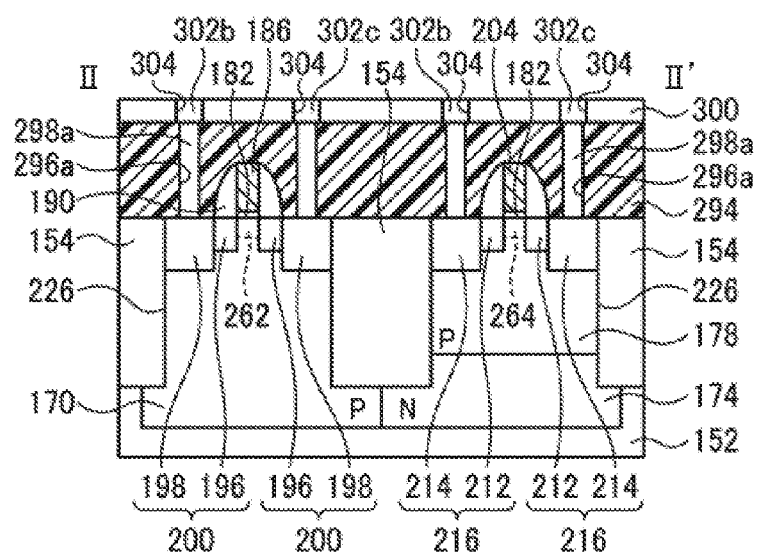
Figure 52C:
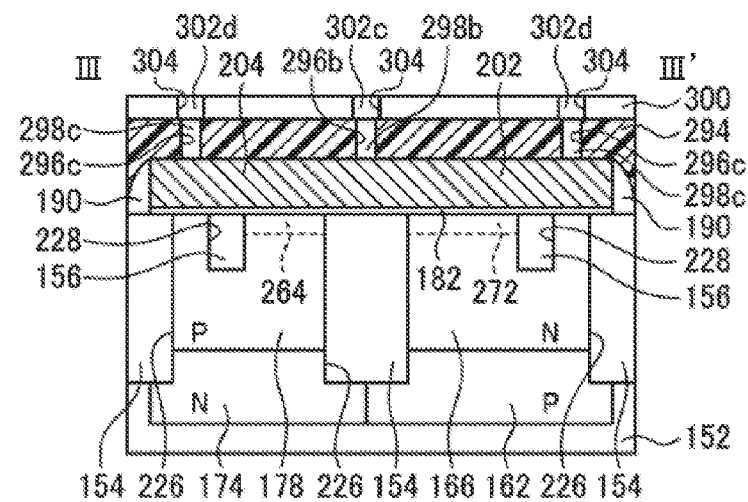

A semiconductor device according to a first embodiment is described by using FIG. 1 to FIG. 52.

(Semiconductor Device)

At first, the semiconductor device according to the embodiment is described by using FIG. 1 to FIG. 9.

FIG. 1 is a block diagram illustrating a part of the semiconductor device according to the embodiment.

The semiconductor device according to the embodiment has a logic circuit (electronic circuit) including plural logic cells (a logic gate, a logic gate cell, a logic element) 10. As the logic cell 10 as stated above, for example, an AND circuit, an OR circuit, a buffer circuit, a flipflop circuit, and so on can be cited.

An output terminal of one logic cell 10-1 is electrically connected to an input terminal of another logic cell 10-2. An output terminal of the logic cell 10-2 is electrically connected to an input terminal of still another logic cell 10-3. An output terminal of the logic cell 10-3 is connected to an input terminal of yet another logic cell (not-illustrated).

These plural logic cells 10 may be the same kind of logic cells 10, or the different kinds of logic cells 10.

There is a case when a signal output from one logic cell 10 is input to plural logic cells 10.

Figure 2:
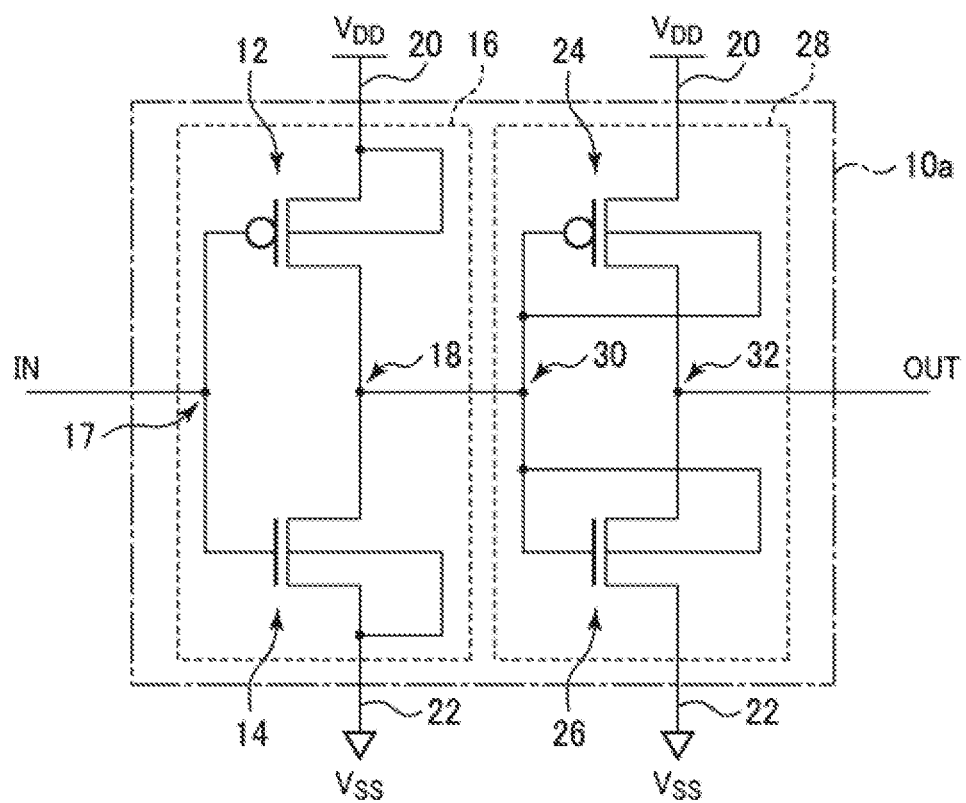
FIG. 2 is a circuit diagram illustrating an example (part 1) of a logic cell according to the first embodiment.

FIG. 2 is a circuit diagram illustrating an example (part 1) of the logic cell according to the embodiment. FIG. 2 illustrates a buffer circuit 10a being an example of the logic cell 10.

As illustrated in FIG. 2, the buffer circuit 10a has a CMOS inverter (complementary transistor pair) 16 including a P-channel type MOS transistor (PMOS transistor) 12 and an N-channel type MOS transistor (NMOS transistor) 14. MOS transistors 12, 14 which are not DTMOS transistors, namely, the MOS transistors 12, 14 whose threshold voltages do not change are used as these MOS transistors 12, 14. In the MOS transistors 12, 14, wells where the MOS transistors 12, 14 are formed are electrically connected to the power supply potential VDD and the ground potential VSS.

In the MOS transistors 12, 14, the threshold voltages are set relatively low so that they are operated by a relatively low power supply voltage VDD while securing driveability. The threshold voltage is set relatively low, and therefore, the leak currents at the MOS transistors 12, 14 become larger than the leak currents at DTMOS transistors 24, 26.

An input terminal IN of the buffer circuit 10a is connected to an input node 17 of the CMOS inverter 16. Namely, the input terminal IN of the buffer circuit 10a is electrically connected to a gate of the PMOS transistor 12 and a gate of the NMOS transistor 14.

A drain of the PMOS transistor 12 and a drain of the NMOS transistor 14 are connected with each other. The drain of the PMOS transistor 12 and the drain of the NMOS transistor 14 are connected to an output node 18 of the CMOS inverter 16.

A source of the PMOS transistor 12 and an N-type well 158 (refer to FIG. 9) where the PMOS transistor 12 is formed are electrically connected. The source of the PMOS transistor 12 and the N-type well 158 where the PMOS transistor 12 is formed are connected to a power supply line 20 which is connected to the power supply potential VDD.

A source of the NMOS transistor 14 and an P-type well 170 (refer to FIG. 9) where the NMOS transistor 14 is formed are electrically connected. The source of the NMOS transistor 14 and the P-type well 170 where the NMOS transistor 14 is formed are connected to a power supply line (ground line) 22 which is connected to the ground potential VSS.

The buffer circuit 10a further has a CMOS inverter (complementary transistor pair) 28 including the P-channel type DTMOS transistor 24 and the N-channel type DTMOS transistor 26.

The DTMOS transistor (dynamic threshold voltage MOS transistor) is one in which the well where the MOS transistor is formed and the gate of the MOS transistor are electrically connected. Accordingly, an input signal applied to the gate of the MOS transistor is also applied to the well where the MOS transistor is formed (well bias).

In the N-channel type DTMOS transistor 26, when an input is in High (H) level, the well bias is in H level, and therefore, the threshold voltage becomes low, and when the input is in Low (L) level, the well bias is in L level, and therefore, the threshold voltage does not become low.

In the P-channel type DTMOS transistor 24, when the input is in H level, the well bias is also in H level, and therefore, the threshold voltage does not become low, and when the input is in Low (L) level, the well bias is also in L level, and therefore, the threshold voltage becomes low.

In the DTMOS transistors 24, 26, it is possible to obtain a large drive current in ON state without increasing a leak current in OFF state because of the operations as stated above.

The output node 18 of the CMOS inverter 16 formed by the MOS transistors 12, 14 is connected to an input node 30 of the CMOS inverter 28 formed by the DTMOS transistors 24, 26. Namely, the output node 18 of the CMOS inverter 16 is electrically connected to a gate of the P-channel type DTMOS transistor 24 and a gate of the N-channel type DTMOS transistor 26.

The gate of the P-channel type DTMOS transistor 24 is electrically connected to an N-type well 166 (refer to FIG.

9) where the DTMOS transistor 24 is formed. The gate of the N-channel type DTMOS transistor 26 is electrically connected to a P-type well 178 (refer to FIG. 9) where the DTMOS transistor 26 is formed.

A source of the P-channel type DTMOS transistor 24 is connected to the power supply line 20 which is connected to the power supply potential VDD. A source of the N-channel type DTMOS transistor 26 is connected to the power supply line (ground line) 22 which is connected to the ground potential VSS.

A drain of the P-channel type DTMOS transistor 24 and a drain of the N-channel type DTMOS transistor 26 are connected with each other. The drain of the P-channel type DTMOS transistor 24 and the drain of the N-channel type DTMOS transistor 26 are connected to an output node 32 of the CMOS inverter 28. The output node 32 of the CMOS inverter 28 is connected to an output terminal OUT of the buffer circuit 10*a*.

As stated above, the buffer circuit 10*a* according to the present embodiment has plural complementary transistor pairs 16, 28 connected in plural stages. The MOS transistors 12, 14 which are not the DTMOS transistors are used for the complementary transistor pair 16 which is electrically connected to the input terminal IN of the buffer circuit 10*a*, namely, the complementary transistor pair 16 at a first stage from among the plural complementary transistor pairs 16, 28. On the other hand, the DTMOS transistors 24, 26 are used for the complementary transistor pair 28 which is electrically connected to the output terminal OUT of the buffer circuit 10*a*, namely, the complementary transistor pair 28 at a final stage from among the plural complementary transistor pairs 16, 28.

An input capacitance of each of the MOS transistors 12, 14 which are not the DTMOS transistors is smaller than that of the DTMOS transistor. However, the leak current becomes large when the threshold voltage is set low so that it can operate with low power supply voltage.

On the other hand, an input capacitance of each of the DTMOS transistors 24, 26 is large though the leak current does not become large.

According to the buffer circuit 10*a* of the present embodiment, the MOS transistors 12, 14 which are not the DTMOS transistors are used for the complementary transistor pair 16 at the first stage, and therefore, the buffer circuit 10*a* whose input capacitance is small is obtained. On the other hand, the DTMOS transistors 24, 26 are used for the complementary transistor pairs 28 at other than the first stage, and therefore, it is possible to secure high driveability without increasing the leak current. Therefore, according to the buffer circuit 10*a* of the present embodiment, it is possible to lower the power supply voltage while preventing lowering of operating speed, and to reduce power consumption.

The buffer circuit 10*a* of the present embodiment is thereby formed.

Figure 3:
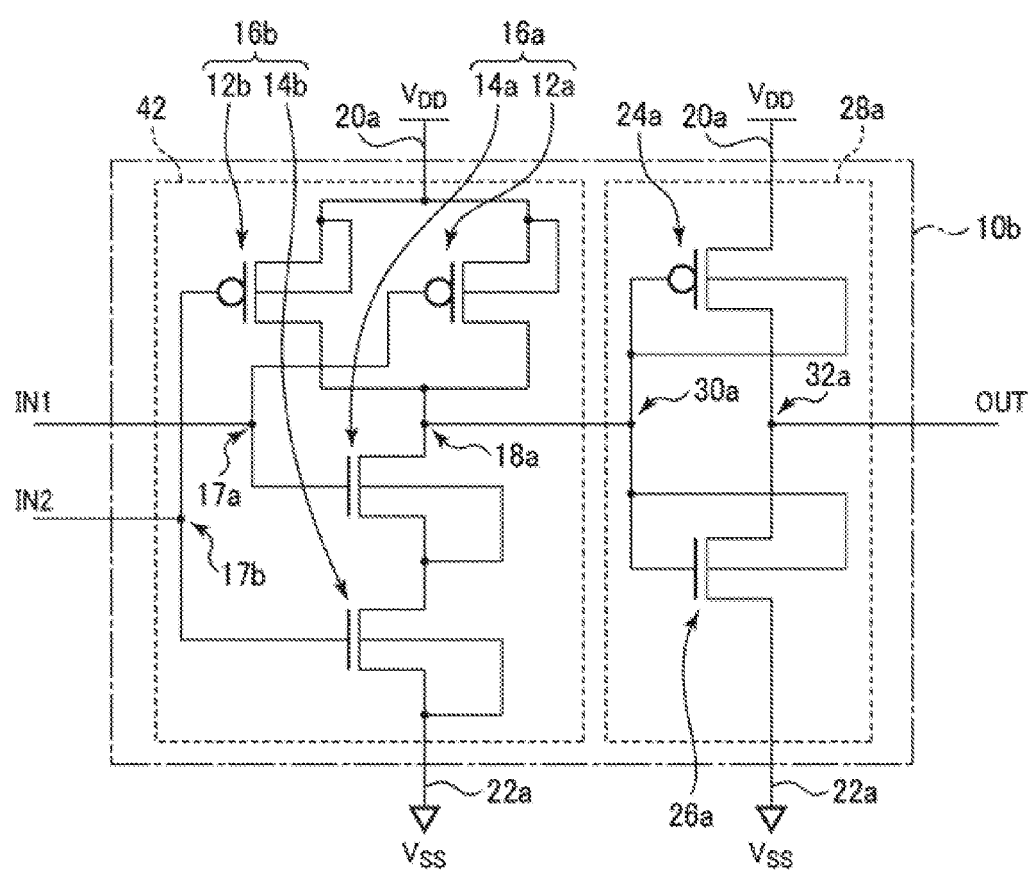
FIG. 3 is a circuit diagram illustrating an example (part 2) of the logic cell according to the first embodiment.

FIG. 3 is a circuit diagram illustrating an example (part 2) of the logic cell of the present embodiment. FIG. 3 illustrates an AND circuit 10*b* being an example of the logic cell 10.

As illustrated in FIG. 3, the AND circuit 10*b* of the present embodiment has a NAND circuit 42 including PMOS transistors 12*a*, 12*b* and NMOS transistors 14*a*, 14*b*. The MOS transistors 12*a*, 12*b*, 14*a*, 14*b* which are not the DTMOS transistors are used for the NAND circuit 42.

An input terminal IN1 is electrically connected to a gate of the PMOS transistor 12*a* and a gate of the NMOS transistor 14*a*. In other words, an input node 17*a* of a complementary transistor pair 16*a* including the PMOS transistor 12*a* and the NMOS transistor 14*a* is connected to the input terminal IN1.

An input terminal IN2 is electrically connected to a gate of the PMOS transistor 12*b* and a gate of the NMOS transistor 14*b*. In other words, an input node 17*b* of a complementary transistor pair 16*b* including the PMOS transistor 12*b* and the NMOS transistor 14*b* is connected to the input terminal IN2.

A drain of the PMOS transistor 12*a*, a drain of the PMOS transistor 12*b* and a drain of the NMOS transistor 14*a* are electrically connected. The drain of the PMOS transistor 12*a*, the drain of the PMOS transistor 12*b* and the drain of the NMOS transistor 14*a* are connected to an output node 18*a* of the NAND circuit 42.

A source of the PMOS transistor 12*a* and an N-type well where the PMOS transistor 12*a* is formed are electrically connected. The source of the PMOS transistor 12*a* and the N-type well where the PMOS transistor 12*a* is formed are connected to a power supply line 20*a* which is connected to the power supply potential VDD.

A source of the PMOS transistor 12*b* and an N-type well where the PMOS transistor 12*b* is formed are electrically connected. The source of the PMOS transistor 12*b* and the N-type well where the PMOS transistor 12*b* is formed are connected to the power supply line 20*a* which is connected to the power supply potential VDD.

A source of the NMOS transistor 14*a* and a P-type well where the NMOS transistor 14*a* is formed are electrically connected. The source of the NMOS transistor 14*a* and the P-type well where the NMOS transistor 14*a* is formed are electrically connected to a drain of the NMOS transistor 14*a*.

A source of the NMOS transistor 14*b* and a P-type well where the NMOS transistor 14*b* is formed are electrically connected. The source of the NMOS transistor 14*b* and the P-type well where the NMOS transistor 14*b* is formed are connected to a power supply line 22*a* which is connected to the ground potential VSS.

The NAND circuit 42 is thereby formed.

The AND circuit 10*b* further has a CMOS inverter (complementary transistor pair) 28*a* including a P-channel type DTMOS transistor 24*a* and an N-channel type DTMOS transistor 26*a*.

The output node 18*a* of the NAND circuit 42 is connected to an input node 30*a* of the CMOS inverter 28*a*. Namely, the output node 18*a* of the NAND circuit 42 is electrically connected to a gate of the P-channel type DTMOS transistor 24*a* and a gate of the N-channel type DTMOS transistor 26*a*.

The gate of the P-channel type DTMOS transistor 24*a* is electrically connected to an N-type well where the DTMOS transistor 24*a* is formed. The gate of the N-channel type DTMOS transistor 26*a* is electrically connected to a P-type well where the DTMOS transistor 26*a* is formed.

A source of the P-channel type DTMOS transistor 24*a* is connected to the power supply line 20*a* which is connected to the power supply potential VDD. A source of the N-channel type DTMOS transistor 26*a* is connected to the power supply line 22*a* which is connected to the ground potential VSS.

A drain of the P-channel type DTMOS transistor 24*a* and a drain of the N-channel type DTMOS transistor 26*a* are connected with each other. The drain of the P-channel type DTMOS transistor 24*a* and the drain of the N-channel type DTMOS transistor 26*a* are connected to an output node 32*a* of the CMOS inverter 28*a*. The output node 32*a* of the CMOS inverter 28*a* is connected to an output terminal OUT of the AND circuit 10*b*.

As stated above, the MOS transistors 12a, 12b, 14a, 14b which are not the DTMOS transistors are used for the complementary transistor pairs 16a, 16b at a first stage also in the AND circuit 10b of the present embodiment. On the other hand, the DTMOS transistors 24a, 26a are used for the complementary transistor pair 28a at a final stage. Accordingly, it is possible to lower the power supply voltage and to reduce the power consumption while preventing the lowing of the operating speed also in the present embodiment.

The AND circuit 10b according to the present embodiment is thereby formed.

Figure 4:
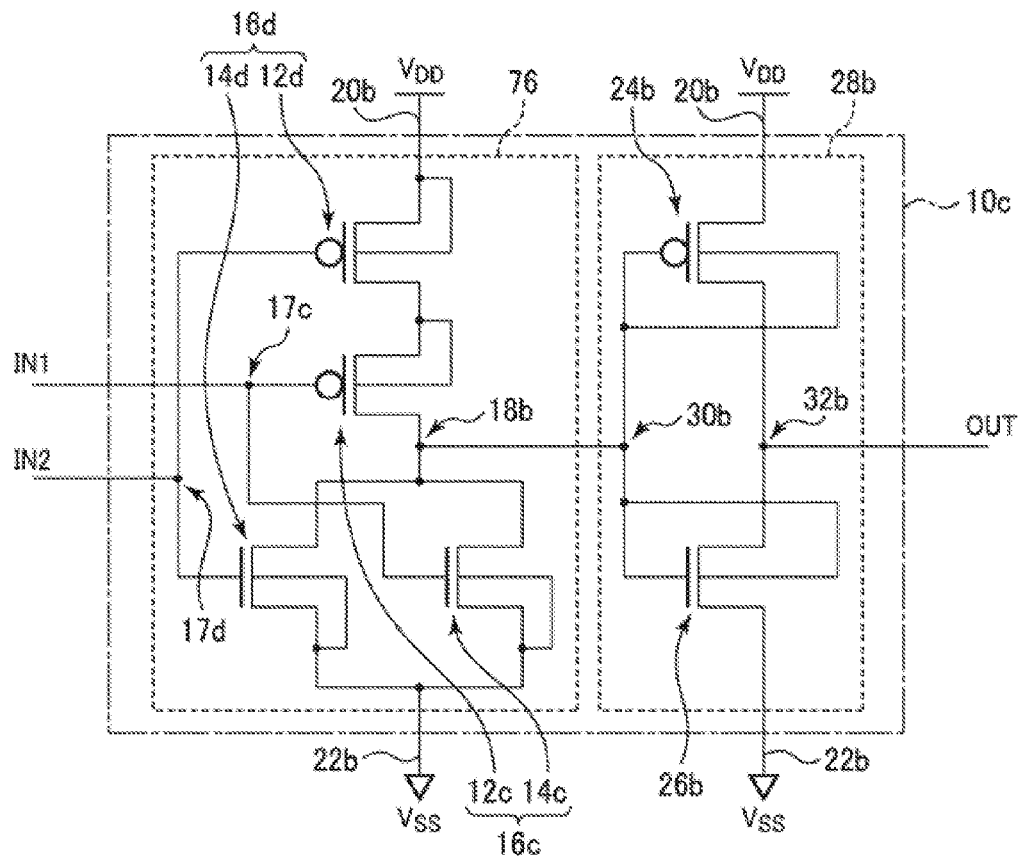
FIG. 4 is a circuit diagram illustrating an example (part 3) of the logic cell according to the first embodiment.

FIG. 4 is a circuit diagram illustrating an example (part 3) of the logic cell of the present embodiment. FIG. 4 illustrates an OR circuit 10c being an example of the logic cell 10.

As illustrated in FIG. 4, the OR circuit 10c of the present embodiment has a NOR circuit 76 including PMOS transistors 12c, 12d and NMOS transistors 14c, 14d. The MOS transistors 12c, 12d, 14c, 14d which are not the DTMOS transistors are used for the NOR circuit 76.

An input terminal IN1 is electrically connected to a gate of the PMOS transistor 12c and a gate of the NMOS transistor 14c. In other words, an input node 17c of a complementary transistor pair 16c including the PMOS transistor 12c and the NMOS transistor 14c is connected to the input terminal IN1.

An input terminal IN2 is electrically connected to a gate of the PMOS transistor 12d and a gate of the NMOS transistor 14d. In other words, an input node 17d of a complementary transistor pair 16d including the PMOS transistor 12d and the NMOS transistor 14d is connected to the input terminal IN2.

A source of the PMOS transistor 12c and an N-type well where the PMOS transistor 12c is formed are electrically connected. The source of the PMOS transistor 12c and the N-type well where the PMOS transistor 12c is formed are connected to a drain of the PMOS transistor 12d.

A source of the PMOS transistor 12d and an N-type well where the PMOS transistor 12d is formed are electrically connected. The source of the PMOS transistor 12d and the N-type well where the PMOS transistor 12d is formed are connected to a power supply line 20b which is connected to the power supply potential VDD.

A drain of the PMOS transistor 12c, a drain of the NMOS transistor 14c, and a drain of the NMOS transistor 14d are connected to an output node 18b of the NOR circuit 76.

A source of the NMOS transistor 14c and a P-type well where the NMOS transistor 14c is formed are electrically connected. The source of the NMOS transistor 14c and the P-type well where the NMOS transistor 14c is formed are connected to a power supply line 22b which is connected to the ground potential VSS.

A source of the NMOS transistor 14d and a P-type well where the NMOS transistor 14d is formed are electrically connected. The source of the NMOS transistor 14d and the P-type well where the NMOS transistor 14d is formed are connected to the power supply line 22b which is connected to the ground potential VSS.

The NOR circuit 76 is thereby formed.

The OR circuit 10c further has a CMOS inverter (complementary transistor pair) 28b including a P-channel type DTMOS transistor 24b and an N-channel type DTMOS transistor 26b.

The output node 18b of the NOR circuit 76 is connected to an input node 30b of the CMOS inverter 28b including the P-channel type DTMOS transistor 24b and the N-channel type DTMOS transistor 26b. Namely, the output node 18b of the NOR circuit 76 is electrically connected to a gate of the P-channel type DTMOS transistor 24b and a gate of the N-channel type DTMOS transistor 26b.

The gate of the P-channel type DTMOS transistor 24b is electrically connected to an N-type well where the DTMOS transistor 24b is formed. The gate of the N-channel type DTMOS transistor 26b is electrically connected to a P-type well where the DTMOS transistor 26b is formed.

A source of the P-channel type DTMOS transistor 24b is connected to the power supply line 20b which is connected to the power supply potential VDD. A source of the N-channel type DTMOS transistor 26b is connected to the power supply line 22b which is connected to the ground potential VSS.

A drain of the P-channel type DTMOS transistor 24b and a drain of the N-channel type DTMOS transistor 26b are connected with each other. The drain of the P-channel type DTMOS transistor 24b and the drain of the N-channel type DTMOS transistor 26b are connected to an output node 32b of the CMOS inverter 28b. The output node 32b of the CMOS inverter 28b is connected to an output terminal OUT of the OR circuit 10c.

As stated above, the OR circuit 10c of the present embodiment also has the plural complementary transistor pairs 16c, 16d, 28b connected in plural stages. Besides, the complementary transistor pairs 16c, 16d which are electrically connected to the input terminals IN1, IN2 of the OR circuit 10c, namely, the complementary transistor pairs 16c, 16d at a first stage are formed by the MOS transistors 12c, 12d, 14c, 14d which are not the DTMOS transistors. On the other hand, the complementary transistor pair 28b which is electrically connected to the output terminal OUT of the OR circuit 10c, namely, the complementary transistor pair 28b at a final stage is formed by the DTMOS transistors 24b, 26b.

Also in the present embodiment, the MOS transistors 12c, 12d, 14c, 14d which are not the DTMOS transistors are used for the complementary transistor pairs 16c, 16d at the first stage which are required to make the input capacitance small. On the other hand, the DTMOS transistors 24b, 26b whose leak currents are small are used for ones other than the first stage to form the complementary transistor pair 28b. Accordingly, it is possible to reduce the power consumption while preventing the lowing of the operating speed also in the present embodiment.

The OR circuit 10c according to the present embodiment is thereby formed.

Figure 5:
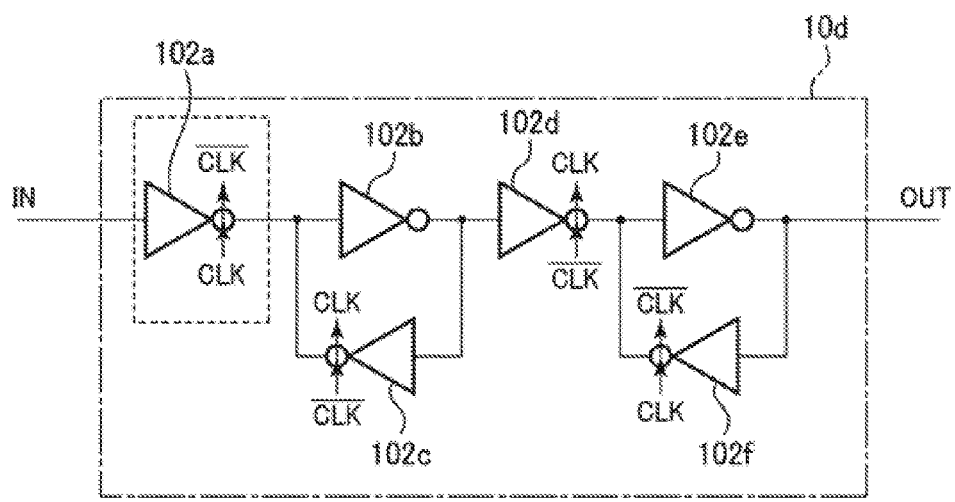
FIG. 5 is a circuit diagram illustrating an example (part 4) of the logic cell according to the first embodiment.

FIG. 5 is a circuit diagram illustrating an example (part 4) of the logic cell of the present embodiment. FIG. 5 illustrates a flipflop circuit 10d being an example of the logic cell 10. More specifically, FIG. 5 illustrates a D-type flipflop circuit 10d using a clocked inverter.

As illustrated in FIG. 5, the flipflop circuit 10d has inverters 102a to 102f connected in plural stages.

An input terminal IN is connected to an input terminal of the clocked inverter 102a. An output terminal of the clocked inverter 102a is connected to an input terminal of the inverter 102b. An output terminal of the inverter 102b is connected to an input terminal of the clocked inverter 102c and an input terminal of the clocked inverter 102d. An output terminal of the clocked inverter 102c is connected to the input terminal of the inverter 102b.

An output terminal of the clocked inverter 102d is connected to an input terminal of the inverter 102e. An output terminal of the inverter 102e is connected to an input terminal of the clocked inverter 102f. An output terminal of the clocked inverter 102f is connected to the input terminal of the inverter 102e. The output terminal of the inverter 102e is connected to an output terminal OUT of the flipflop circuit 10d.

Figure 6A:
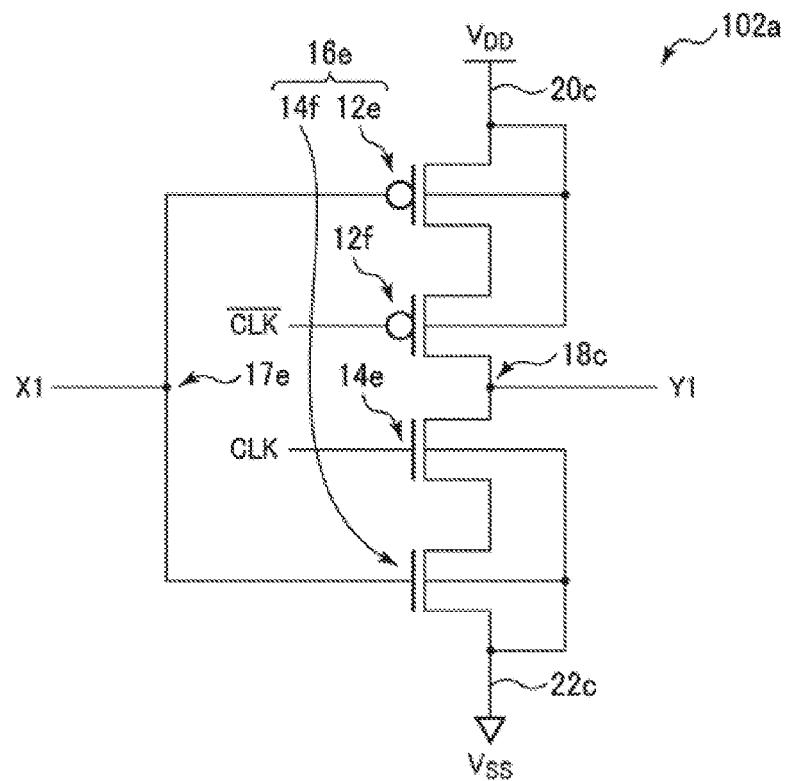
FIGS. 6A and 6B each are a circuit diagram (part 1) of an inverter used for a flipflop circuit.

FIG. 6A is a circuit diagram of the clocked inverter 102a used for a first stage of the flipflop circuit 10d.

As illustrated in FIG. 6A, the clocked inverter 102a has a PMOS transistor 12e, a PMOS transistor 12f, an NMOS transistor 14e, and an NMOS transistor 14f. MOS transistors which are not the DTMOS transistors are used as these MOS transistors 12e, 12f, 14e and 14f.

An input terminal X1 is connected to a gate of the PMOS transistor 12e and a gate of the NMOS transistor 14f. Namely, the input terminal X1 is connected to an input node 17c of a complementary transistor pair 16e formed by the PMOS transistor 12e and the NMOS transistor 14f.

A source of the PMOS transistor 12e is connected to a power supply line 20c which is electrically connected to the power supply potential VDD. A drain of the PMOS transistor 12e is connected to a source of the PMOS transistor 12f. A drain of the PMOS transistor 12f is connected to a drain of the NMOS transistor 14e. The drain of the PMOS transistor 12f and the drain of the NMOS transistor 14e are connected to an output node 18c of the clocked inverter 102a. The output node 18c of the clocked inverter 102a is connected to an output terminal Y1.

An N-type well where the PMOS transistor 12e is formed and an N-type well where the PMOS transistor 12f is formed are connected to the power supply line 20c which is electrically connected to the power supply potential VDD.

A source of the NMOS transistor 14e is connected to a drain of the NMOS transistor 14f. A source of the NMOS transistor 14f is connected to a power supply line 22c which is connected to the ground potential VSS. A P-type well where the NMOS transistor 14e is formed and a P-type well where the NMOS transistor 14f is formed are connected to the power supply line 22c which is connected to the ground potential VSS.

A clock signal/CLK is connected to a gate of the PMOS transistor 12f. A clock signal CLK is connected to a gate of the NMOS transistor 14e.

The clocked inverter 102a is thereby formed.

As stated above, the clocked inverter 102a at the first stage has the complementary transistor pair 16e including the PMOS transistor 12e and the NMOS transistor 14f. The MOS transistors 12e, 14f which are not the DTMOS transistors are used for the complementary transistor pair 16e.

Figure 6B:
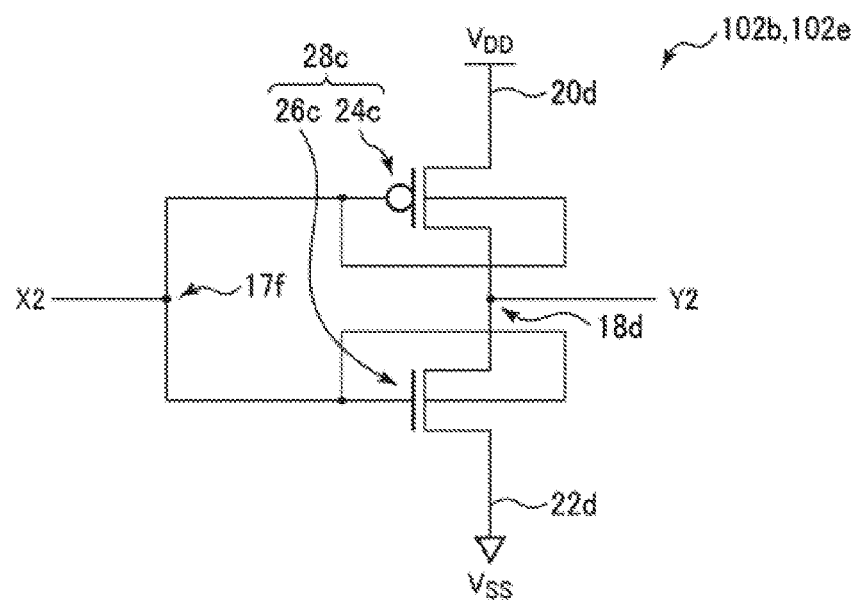

FIG. 6B is a circuit diagram of each of the inverters 102b, 102e which are used for the flipflop circuit 10d at other than the first stage.

As illustrated in FIG. 6B, the inverters 102b, 102e used for other than the first stage each have a complementary transistor pair 28c including a P-channel type DTMOS transistor 24c and an N-channel type DTMOS transistor 26c.

An input terminal X2 of each of the inverters 102b, 102e is connected to an input node 17f of a CMOS inverter 28c including the P-channel type DTMOS transistor 24c and the N-channel type DTMOS transistor 26c. Namely, the input terminal X2 of each of the inverters 102b, 102e is electrically connected to a gate of the P-channel type DTMOS transistor 24c and a gate of the N-channel type DTMOS transistor 26c.

The gate of the P-channel type DTMOS transistor 24c is electrically connected to an N-type well where the DTMOS transistor 24c is formed. The gate of the N-channel type DTMOS transistor 26c is electrically connected to a P-type well where the DTMOS transistor 26c is formed.

A source of the P-channel type DTMOS transistor 24c is connected to a power supply line 20d which is connected to the power supply potential VDD. A source of the N-channel type DTMOS transistor 26c is connected to a power supply line 22d which is connected to the ground potential VSS.

A drain of the P-channel type DTMOS transistor 24c and a drain of the N-channel type DTMOS transistor 26c are connected with each other. The drain of the P-channel type DTMOS transistor 24c and the drain of the N-channel type DTMOS transistor 26c are connected to an output node 18d of the CMOS inverter 28c. The output node 18d of the CMOS inverter 28c is connected to an output terminal Y2 of each of the inverter circuits 102b, 102e.

The inverters 102b, 102e used for other than the first stage are thereby formed.

Each of the inverters 102b, 102e used for other than the first stage has the complementary transistor pair 28c including the P-channel type DTMOS transistor 24c and the N-channel type DTMOS transistor 26c.

Figure 7:
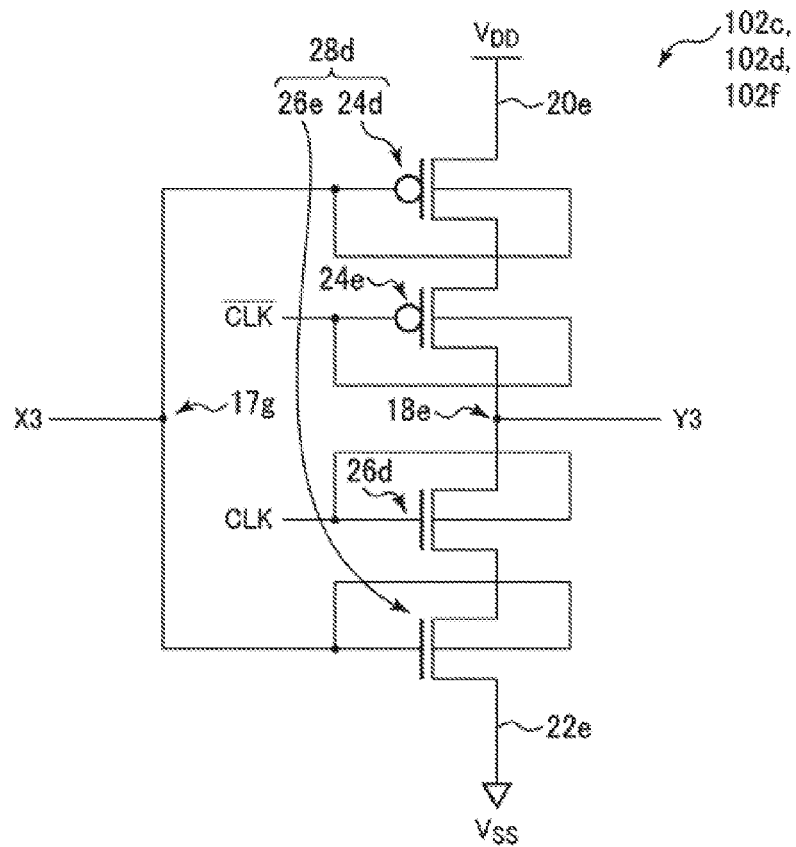
FIG. 7 is a circuit diagram (part 2) of the inverter used for the flipflop circuit.

FIG. 7 is a circuit diagram of each of the clocked inverters 102c, 102d, 102f used for other than the first stage of the flipflop circuit 10d.

As illustrated in FIG. 7, each of the clocked inverters 102c, 102d, 102f has P-channel type DTMOS transistors 24d, 24e and N-channel type DTMOS transistors 26d, 26e.

An input terminal X3 is connected to a gate of the P-channel type DTMOS transistor 24d and a gate of the N-channel type DTMOS transistor 26e. Namely, the input terminal X3 is connected to an input node 17g of a complementary transistor pair 28d including the P-channel type DTMOS transistor 24d and the N-channel type DTMOS transistor 26e.

The clock signal/CLK is connected to a gate of the P-channel type DTMOS transistor 24e. The clock signal CLK is connected to a gate of the N-channel type DTMOS transistor 26d.

A source of the P-channel type DTMOS transistor 24d is connected to a power supply line 20e which is electrically connected to the power supply potential VDD.

A gate of the P-channel type DTMOS transistor 24d and an N-type well where the DTMOS transistor 24d is formed are electrically connected.

A drain of the P-channel type DTMOS transistor 24d is connected to a source of the P-channel type DTMOS transistor 24e.

A gate of the P-channel type DTMOS transistor 24e and an N-type well where the DTMOS transistor 24e is formed are electrically connected.

A drain of the P-channel type DTMOS transistor 24e and a drain of the N-channel type DTMOS transistor 26d are connected with each other. The drain of the P-channel type DTMOS transistor 24e and the drain of the N-channel type DTMOS transistor 26d are connected to an output node 18e. The output node 18e is connected to an output terminal Y3 of each of the clocked inverters 102c, 102d, 102f.

A source of the N-channel type DTMOS transistor 26d is connected to a drain of the N-channel type DTMOS transistor 26e.

A gate of the N-channel type DTMOS transistor 26d and a P-type well where the DTMOS transistor 26d is formed are electrically connected.

A source of the N-channel type DTMOS transistor 26e is connected to a power supply line 22e which is electrically connected to the ground potential VSS.

A gate of the N-channel type DTMOS transistor 26e and a P-type well where the DTMOS transistor 26e is formed are electrically connected.

The clocked inverters 102c, 102d, 102f each using the DTMOS transistors 24d, 24e, 26d, 26e are thereby formed.

The flipflop circuit 10d in which the inverters 102a to 102f are connected in plural stages is thereby formed.

Also in the flipflop circuit 10d of the present embodiment, the MOS transistors 12e, 14f which are not the DTMOS transistors are used for the complementary transistor pair 16e connected to the input terminal IN. On the other hand, in the complementary transistor pairs 28c, 28d at other than the first stage, the DTMOS transistors 24c, 24d, 26c, 26e are used. Accordingly, it is possible to lower the power supply voltage and to lower the power consumption while preventing the lowing of the operating speed also in the present embodiment.

Figure 8:
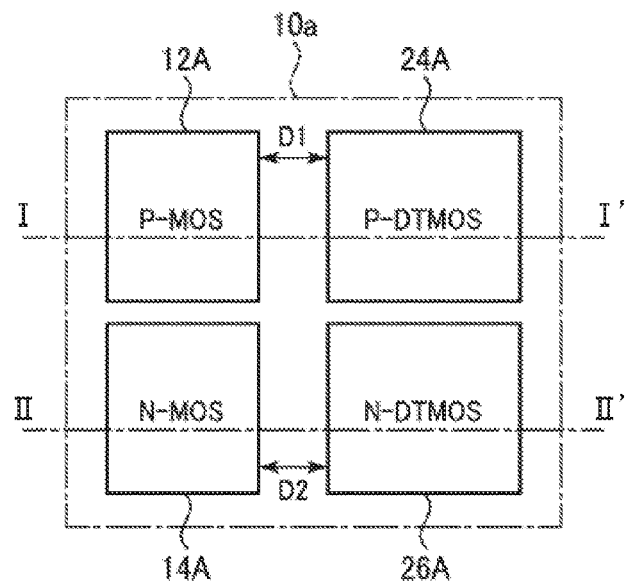
FIG. 8 is a plan view illustrating an example of a layout of a transistor in the logic cell of the semiconductor device according to the first embodiment.

FIG. 8 is a plan view illustrating an example of a layout of a transistor in the logic cell of the semiconductor device according to the present embodiment.

Here, the buffer circuit 10a is exemplified to be described as the logic cell 10, but the logic cell 10 is not limited to the buffer circuit 10a, and it is possible to apply to various kinds of logic cells 10.

A region 12A where a P-type MOS transistor is formed and a region 14A where an N-type MOS transistor is formed are disposed to be adjacent in a longitudinal direction of a drawing in FIG. 8. The longitudinal direction of the drawing in FIG. 8 corresponds to a longitudinal direction of gate wirings 274, 276 (refer to FIG. 51).

A region 24A where a P-type DTMOS transistor is formed and a region 26A where an N-type DTMOS transistor is formed are disposed to be adjacent in the longitudinal direction of the drawing in FIG. 8.

The region 12A where the PMOS transistor is formed and the region 24A where the P-channel type DTMOS transistor is formed are disposed to be adjacent in a horizontal direction of the drawing in FIG. 8. The horizontal direction of the drawing in FIG. 8 is a direction perpendicular to the longitudinal direction of the gate wirings 274, 276.

The region 14A where the NMOS transistor is formed and the region 26A where the N-channel type DTMOS transistor is formed are disposed to be adjacent in the horizontal direction of the drawing in FIG. 8.

Figure 9A:
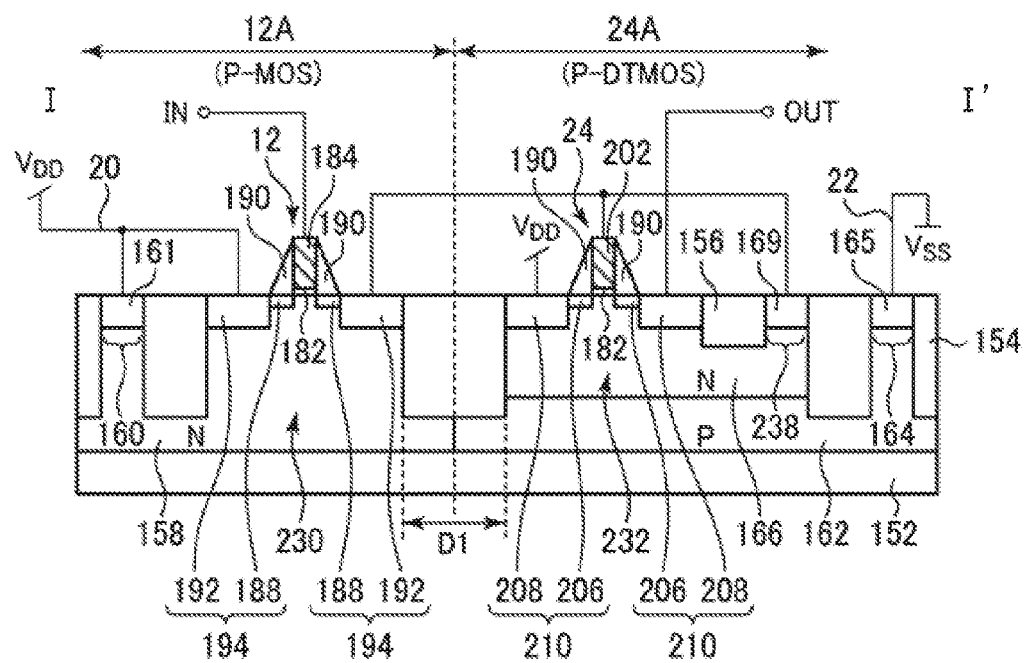
FIGS. 9A and 9B each are a sectional view illustrating a part of the semiconductor device according to the first embodiment.
Figure 9B:
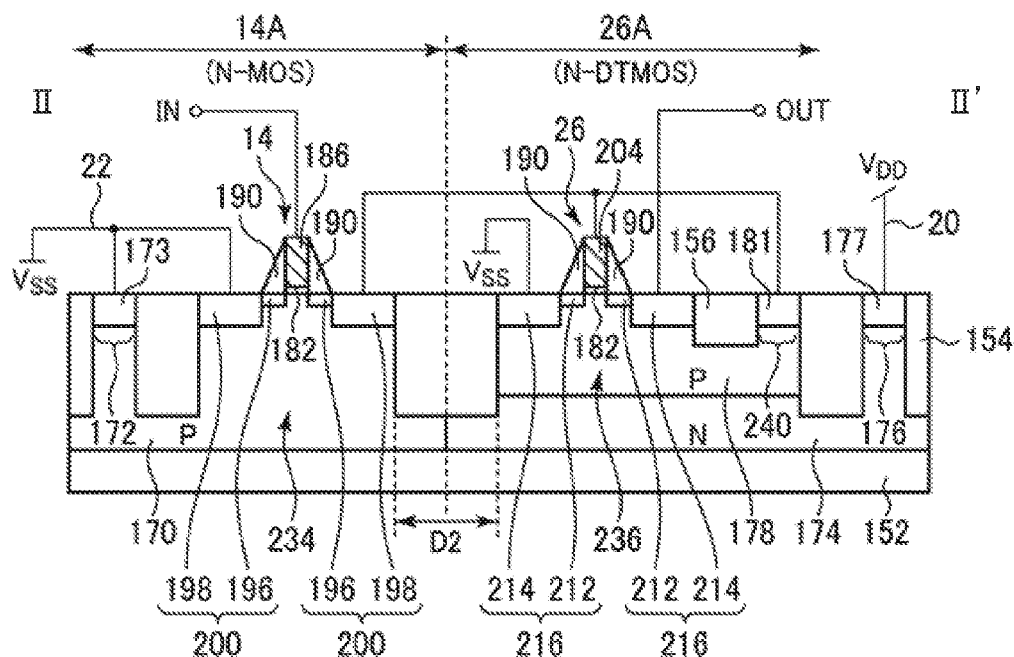

FIG. 9 each are a sectional view illustrating a part of the semiconductor device according to the present embodiment. FIG. 9A is a sectional view corresponding to a I-I' line in FIG. 8, and FIG. 9B is a sectional view corresponding to a II-II' line in FIG. 8.

As illustrated in FIG. 9, element isolation regions 154 and element isolation regions 156 formed to be shallower than the element isolation regions 154 are formed at a semiconductor substrate 152. As the semiconductor substrate 152, for example, a P-type silicon substrate is used. The element isolation regions 154, 156 are formed by, for example, the STI (Shallow Trench Isolation) method. As a material of the element isolation regions 154, 156, for example, silicon dioxide is used. The element region 158 where the PMOS transistor 12 is formed and the element region 170 where the NMOS transistor 14 is formed are defined by the element isolation regions 154.

A later-described well tap region (contact region) 160 to electrically connect the N-type well 158 to the power supply potential VDD is defined by the element isolation regions 154. A later-described well tap region 164 to electrically connect a P-type well 162 to the ground potential VSS is defined by the element isolation regions 154. A later-described well tap region 238 to connect the N-type well 166 to the gate of the P-channel type DTMOS transistor 24 is defined by the element isolation region 154 and the element isolation region 156.

A later-described well tap region 172 to electrically connect the P-type well 170 to the ground potential VSS is defined by the element isolation regions 154. A later-described well tap region 176 to electrically connect the N-type well 174 to the power supply potential VDD is defined by the element isolation regions 154. A later-described well tap region 240 to connect the P-type well 178 to the gate of the N-channel type DTMOS transistor 26 is defined by the element isolation region 154 and the element isolation region 156.

Figure 32A:
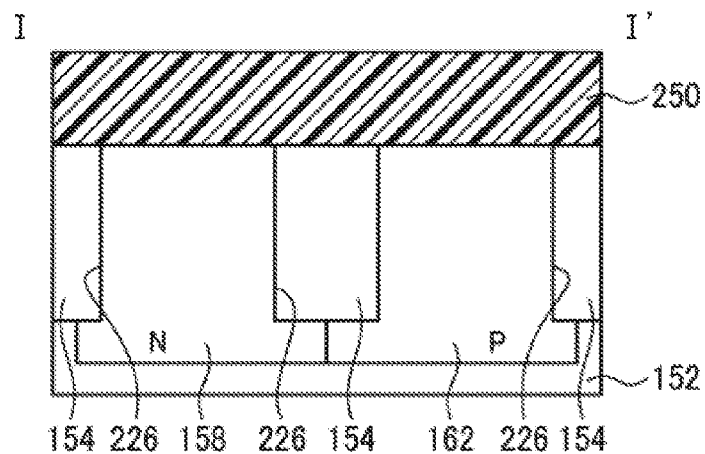
FIGS. 32A, 32B and 32C each are a process chart (part 16) illustrating the manufacturing method of the semiconductor device according to the first embodiment.
Figure 32B:
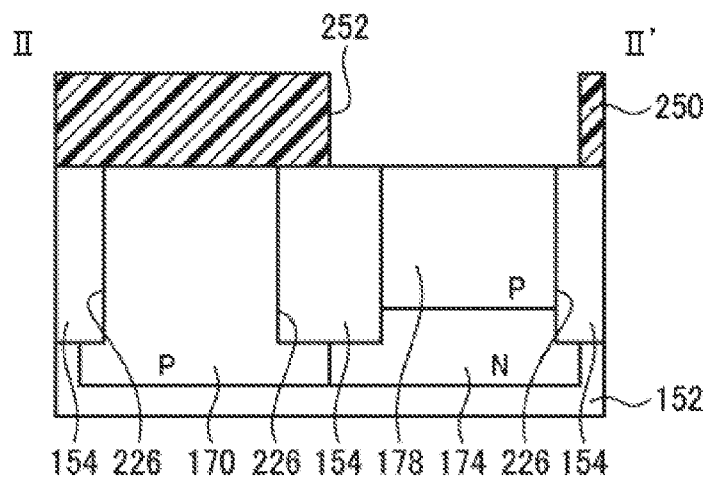
Figure 32C:
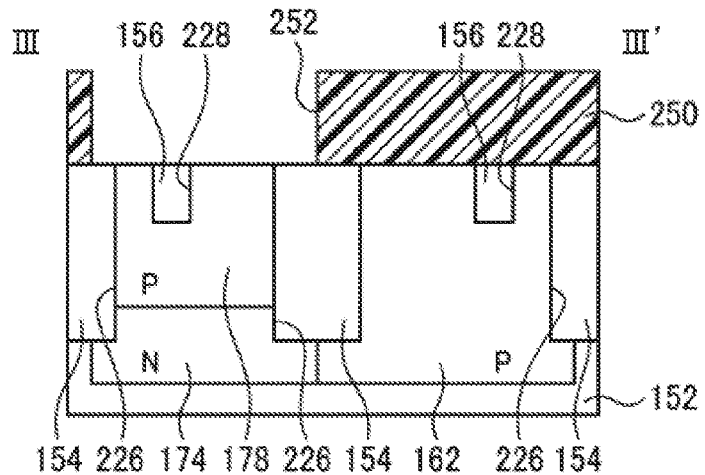
Figure 33:
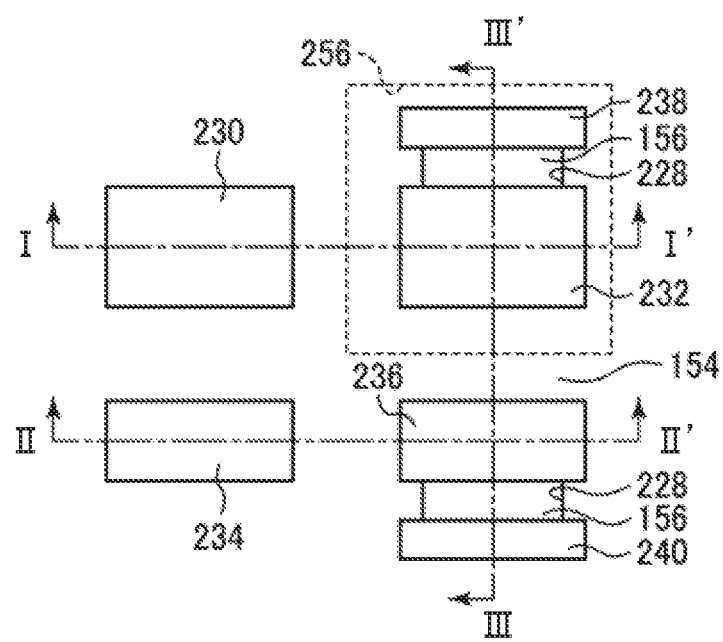
FIG. 33 is a process chart (part 17) illustrating the manufacturing method of the semiconductor device according to the first embodiment.
Figure 34A:
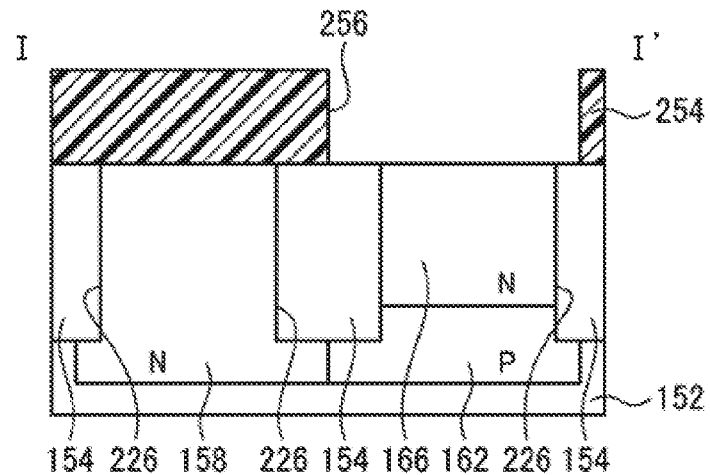
FIGS. 34A, 34B and 34C each are a process chart (part 18) illustrating the manufacturing method of the semiconductor device according to the first embodiment.
Figure 34B:
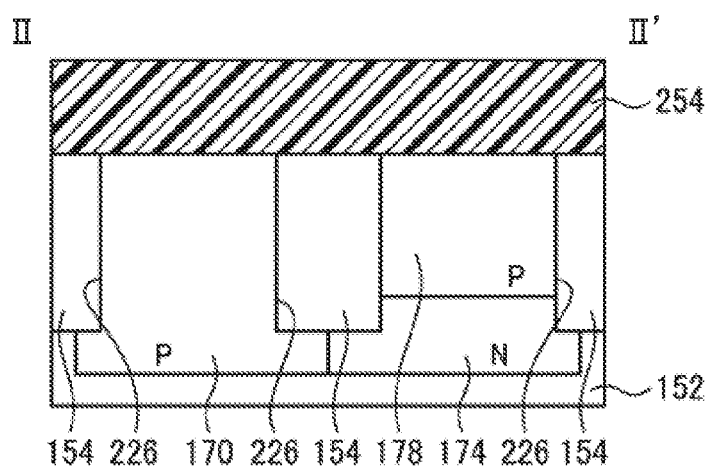
Figure 34C:
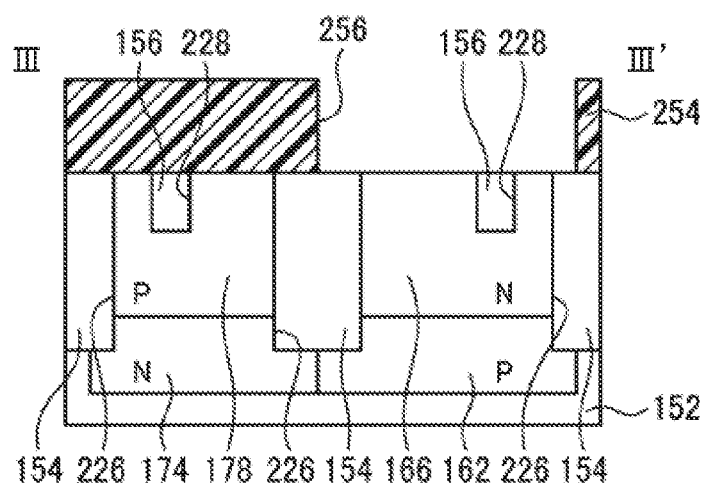
Figure 35:
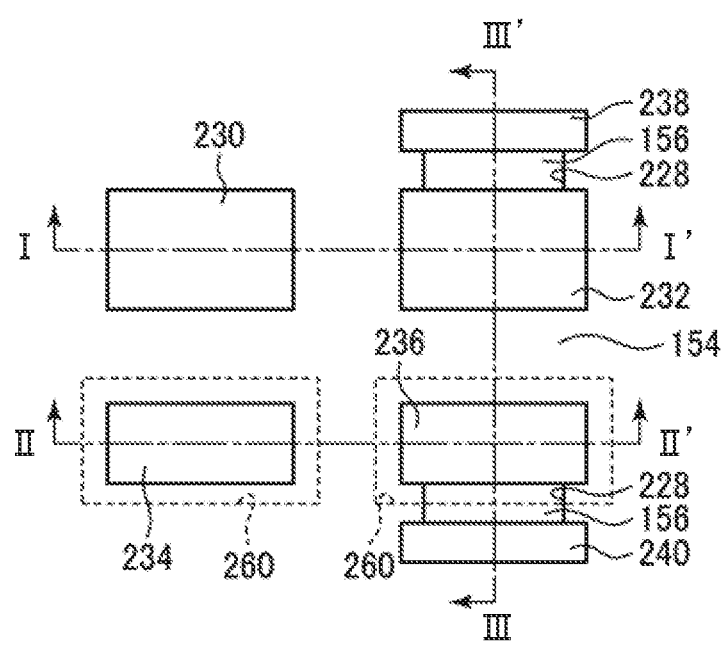
FIG. 35 is a process chart (part 19) illustrating the manufacturing method of the semiconductor device according to the first embodiment.
Figure 36A:
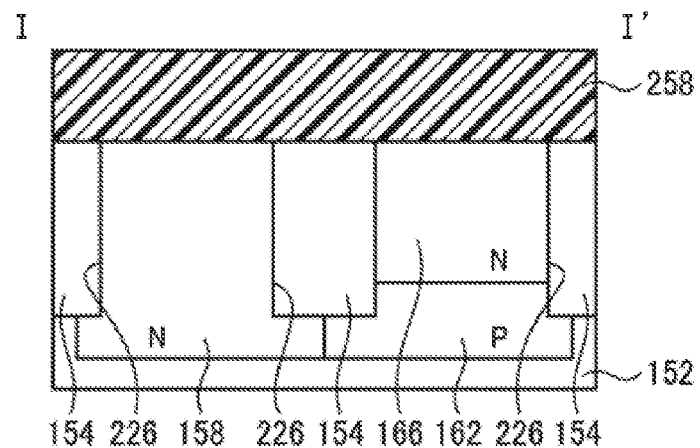
FIGS. 36A, 36B and 36C each are a process chart (part 20) illustrating the manufacturing method of the semiconductor device according to the first embodiment.
Figure 36B:
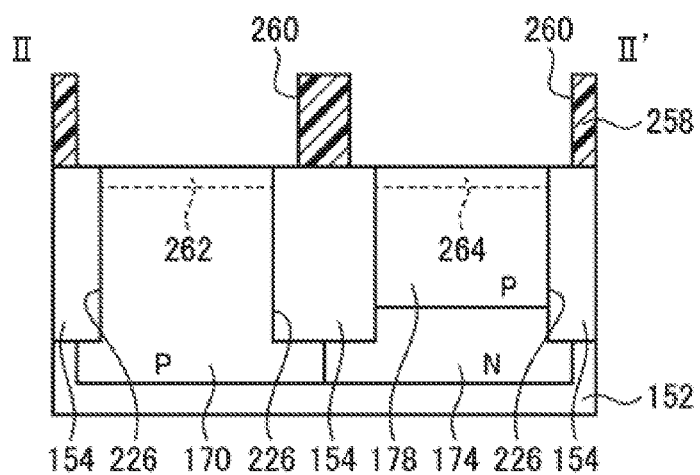
Figure 36C:
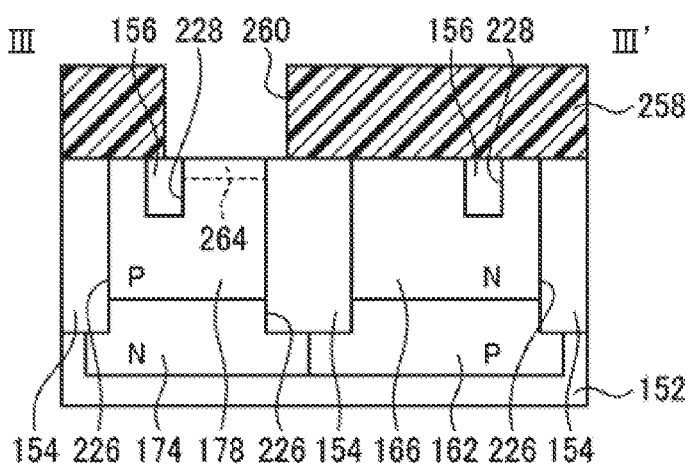
Figure 37:
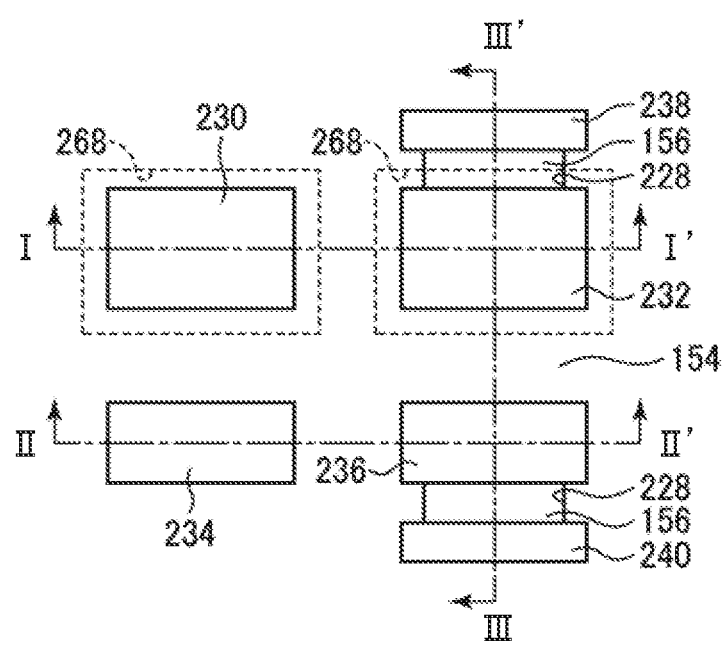
FIG. 37 is a process chart (part 21) illustrating the manufacturing method of the semiconductor device according to the first embodiment.
Figure 38A:
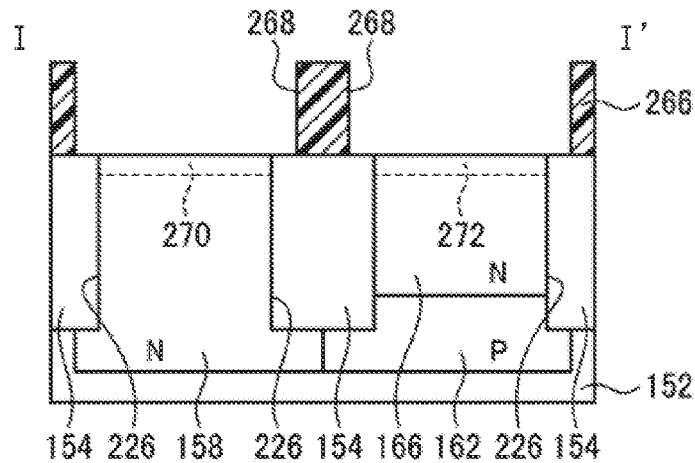
FIGS. 38A, 38B and 38C each are a process chart (part 22) illustrating the manufacturing method of the semiconductor device according to the first embodiment.
Figure 38B:
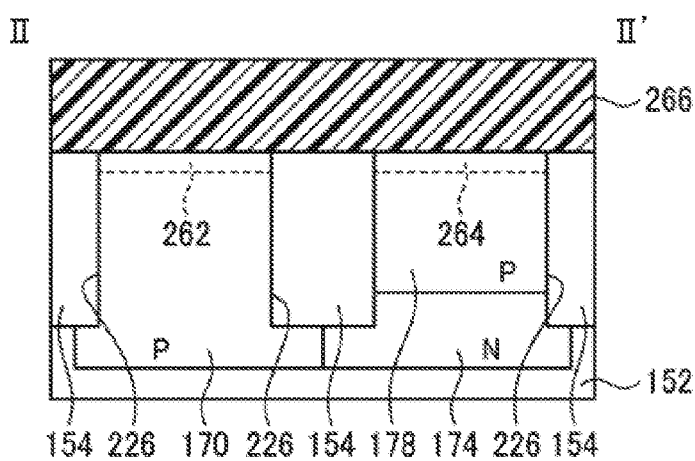
Figure 38C:
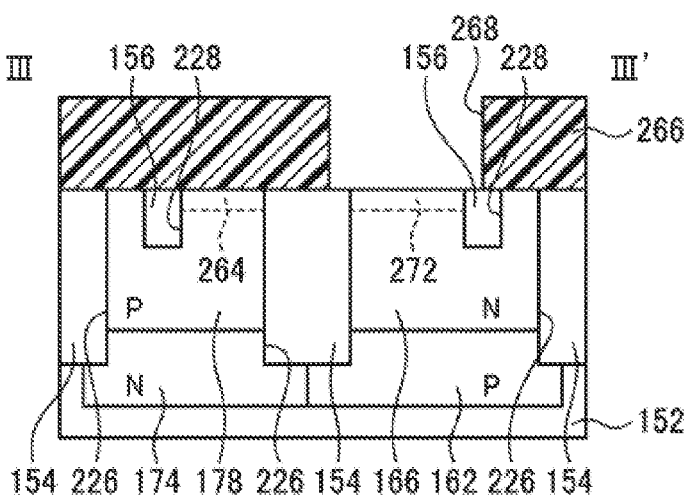

As illustrated in FIG. 9A, the N-type well 158 is formed at a region including an element region 230 (refer to FIG. 32) where the PMOS transistor 12 is formed. The N-type well 158 is formed to include the well tap region 160 to electrically connect the N-type well 158 to the power supply potential VDD.

Figure 25:
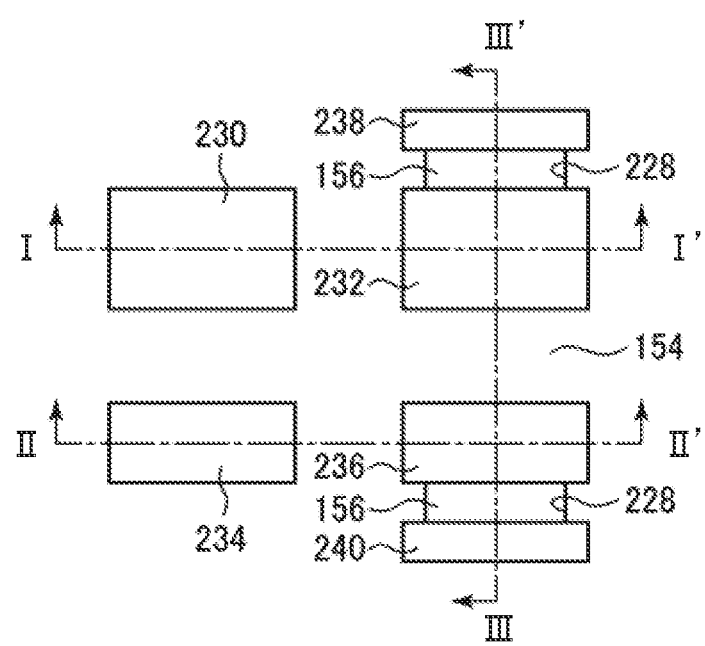
FIG. 25 is a process chart (part 9) illustrating the manufacturing method of the semiconductor device according to the first embodiment.
Figure 26A:
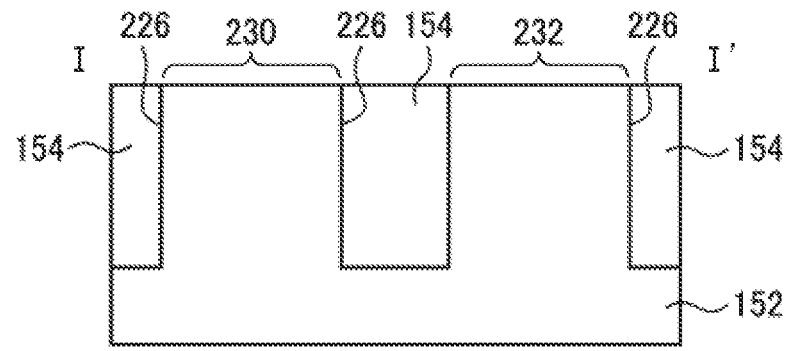
FIGS. 26A, 26B and 26C each are a process chart (part 10) illustrating the manufacturing method of the semiconductor device according to the first embodiment.
Figure 26B:
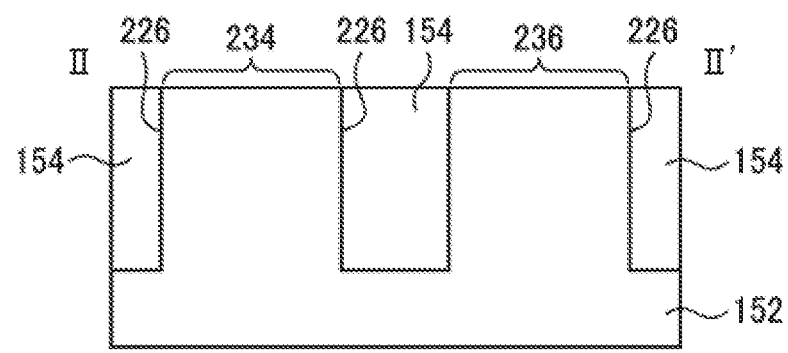
Figure 26C:
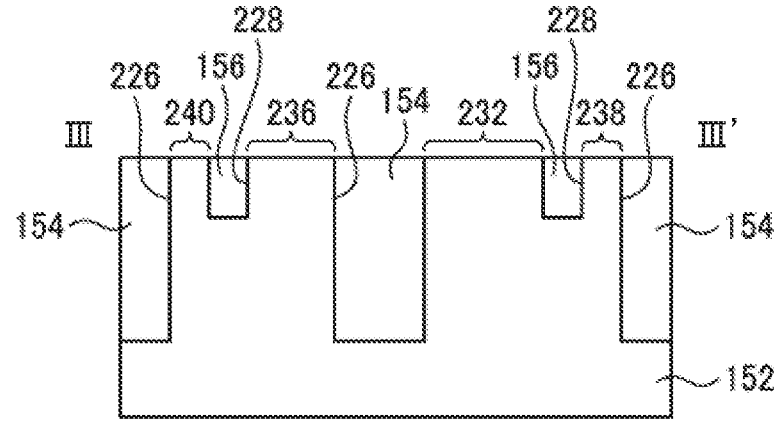
Figure 27:
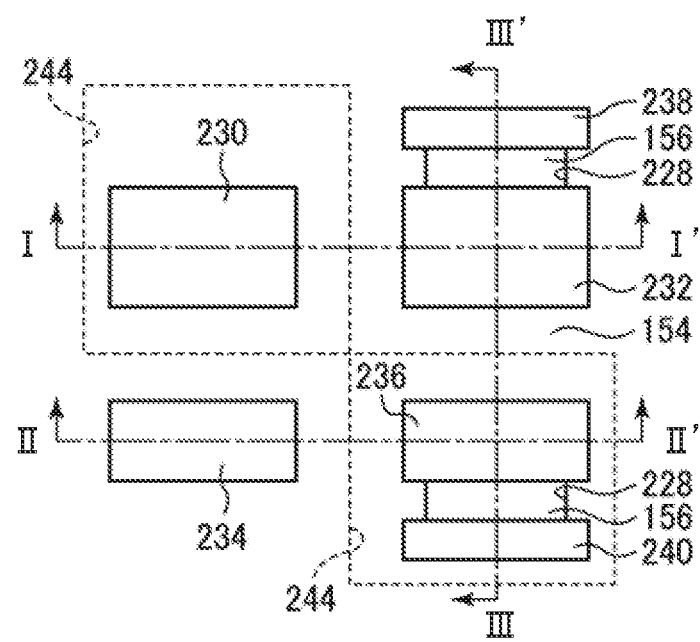
FIG. 27 is a process chart (part 11) illustrating the manufacturing method of the semiconductor device according to the first embodiment.
Figure 28A:
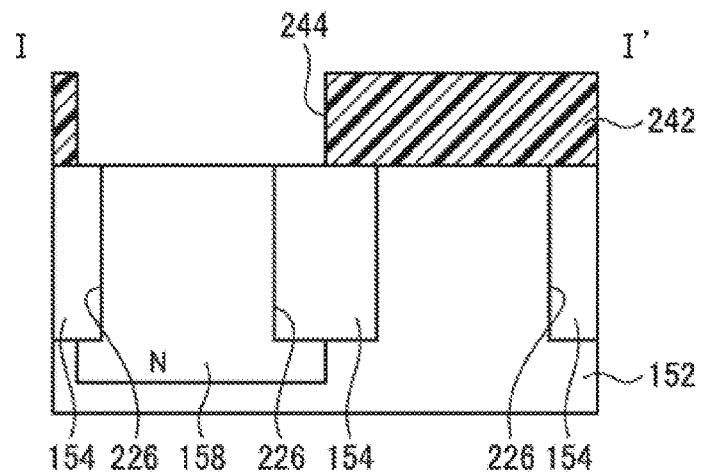
FIGS. 28A, 28B and 28C each are a process chart (part 12) illustrating the manufacturing method of the semiconductor device according to the first embodiment.
Figure 28B:
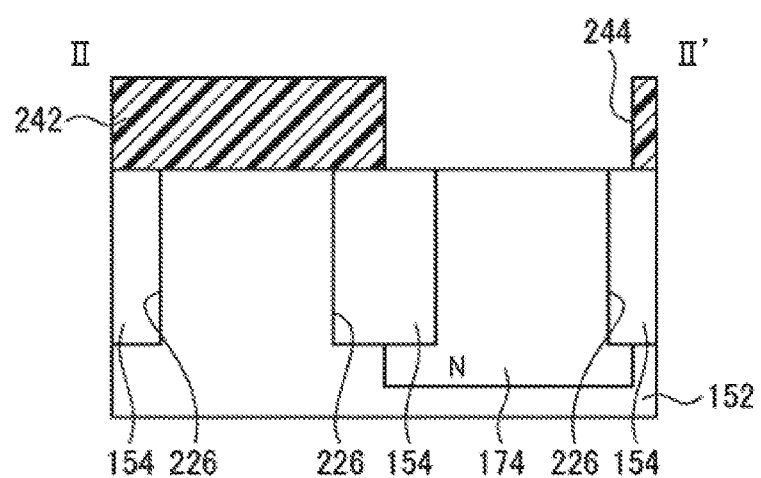
Figure 28C:
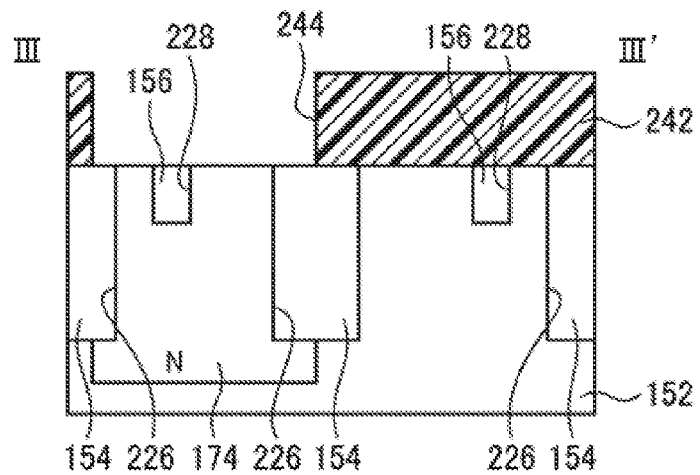
Figure 29:
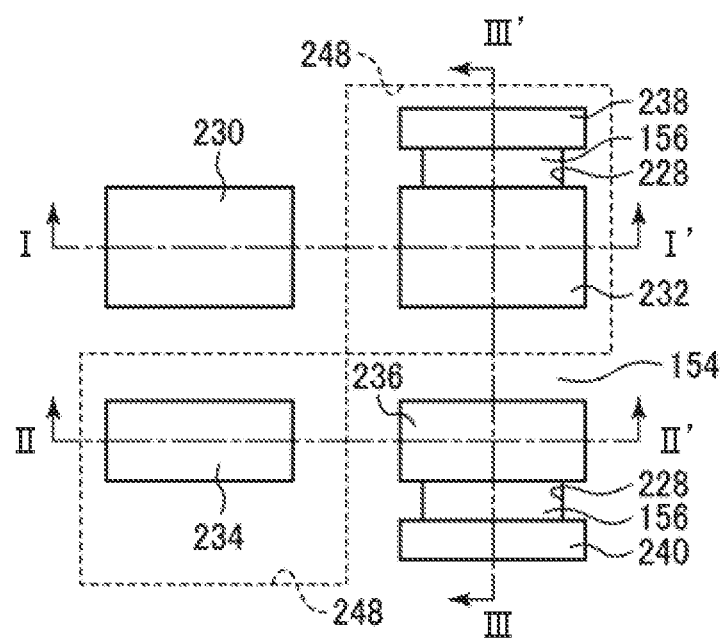
FIG. 29 is a process chart (part 13) illustrating the manufacturing method of the semiconductor device according to the first embodiment.
Figure 30A:
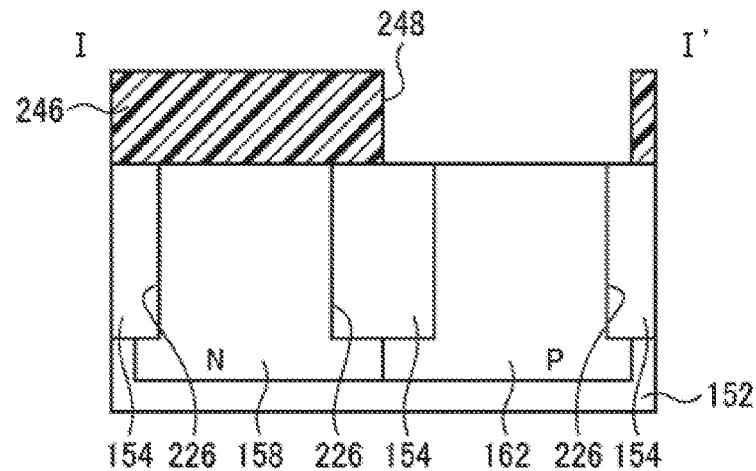
FIGS. 30A, 30B and 30C each are a process chart (part 14) illustrating the manufacturing method of the semiconductor device according to the first embodiment.
Figure 30B:
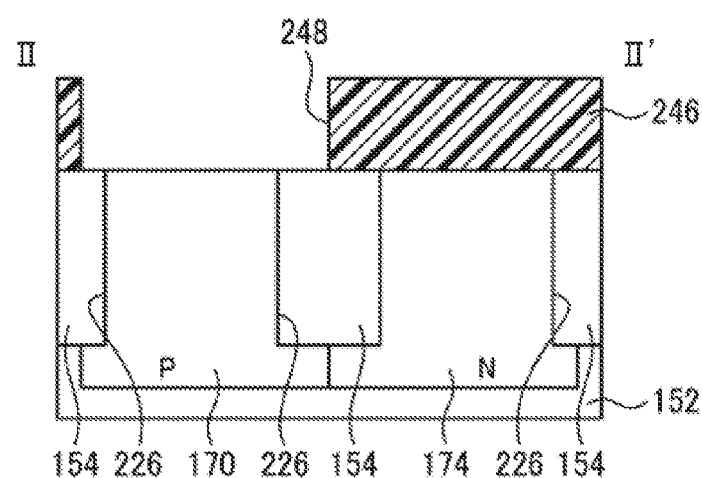
Figure 30C:
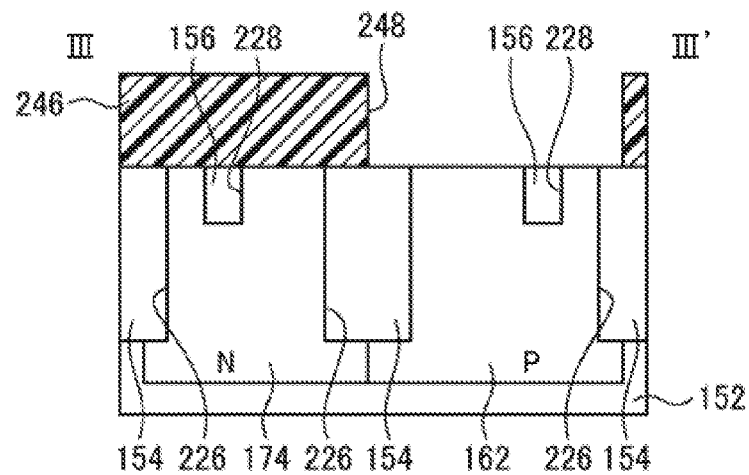
Figure 31:
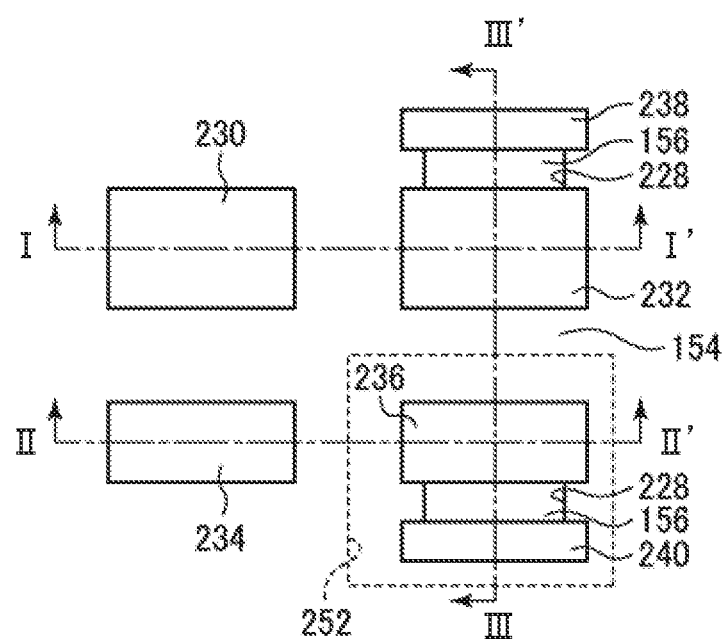
FIG. 31 is a process chart (part 15) illustrating the manufacturing method of the semiconductor device according to the first embodiment.

The P-type well 162 is formed at a region including an element region 232 (refer to FIG. 25) where the P-channel type DTMOS transistor 24 is formed. The P-type well 162 is formed to include the well tap region 164 to electrically connect the P-type well 162 to the ground potential VSS. A lower surface of the P-type well 162 positions at downward of a lower surface of the element isolation region 154.

The N-type well 166 is formed at the region including the element region 232 where the P-channel type DTMOS transistor 24 is formed. The N-type well 166 is formed to include the well tap region 238 to electrically connect the N-type well 166 to the gate of the P-channel type DTMOS transistor 24. The N-type well 166 is formed to be shallower than the P-type well 162. A lower surface of the N-type well 166 positions at upward of the lower surface of the element isolation region 154, and at downward of a lower surface of the element isolation region 156.

As illustrated in FIG. 9B, the P-type well 170 is formed at a region including an element region 234 (refer to FIG. 25) where the NMOS transistor 14 is formed. The P-type well 170 is formed to include the well tap region 172 to electrically connect the P-type well 170 to the ground potential VSS.

The N-type well 174 is formed at a region including an element region 236 (refer to FIG. 25) where the N-channel type DTMOS transistor 26 is formed. The N-type well 174 is formed to include the well tap region 176 to electrically connect the N-type well 174 to the power supply potential VDD. A lower surface of the N-type well 174 positions at downward of the lower surface of the element isolation region 154.

The P-type well 178 is formed at the region including the element region 236 where the N-channel type DTMOS transistor 26 is formed. The P-type well 178 is formed to include the well tap region 240 to electrically connect the P-type well 178 to the gate of the N-channel type DTMOS transistor 26. The P-type well 178 is formed to be shallower than the N-type well 174. A lower surface of the P-type well 178 positions at upward of the lower surface of the element isolation region 154, and at downward of the lower surface of the element isolation region 156.

A depth of the N-type well 158 and a depth of the N-type well 174 are the same. Besides, a depth of the P-type well 162 and a depth of the P-type well 170 are the same.

A gate electrode 184 of the PMOS transistor 12 is formed on the N-type well 158 via a gate insulating film 182.

A gate electrode 186 of the NMOS transistor 14 is formed on the P-type well 170 via the gate insulating film 182.

The gate electrode 184 of the PMOS transistor 12 and the gate electrode 186 of the NMOS transistor 14 are connected with each other. Namely, a part of gate wirings formed on the N-type well 158 and the P-type well 170 becomes the gate electrode 184 of the PMOS transistor 12, and another part of the gate wirings becomes the gate electrode 186 of the NMOS transistor 14.

P-type extension regions (low-concentration impurity regions) 188 each forming a shallow impurity region in an extension source/drain structure are formed in the semiconductor substrate 152 at both sides of the gate electrode 184 of the PMOS transistor 12.

A sidewall insulating film 190 is formed at a sidewall part of the gate electrode 184.

P-type high-concentration impurity regions 192 each forming a deep impurity region in the extension source/drain structure are formed in the semiconductor substrate 152 at both sides of the gate electrode 184 where the sidewall insulating film 190 is formed.

Source/drain regions 194 in the extension source/drain structure are each formed by the low-concentration impurity region 188 and the high-concentration impurity region 192.

The PMOS transistor 12 having the gate electrode 184 and the source/drain regions 194 is thereby formed.

N-type extension regions (low-concentration impurity regions) 196 each forming a shallow impurity region in the extension source/drain structure are formed in the semiconductor substrate 152 at both sides of the gate electrode 186 of the NMOS transistor 14.

The sidewall insulating film 190 is formed at a sidewall part of the gate electrode 186.

N-type high-concentration impurity regions 198 each forming a deep impurity region in the extension source/drain structure are formed in the semiconductor substrate 152 at both sides of the gate electrode 186 where the sidewall insulating film 190 is formed.

Source/drain regions 200 in the extension source/drain structure are each formed by the low-concentration impurity region 196 and the high-concentration impurity region 198.

The NMOS transistor 14 having the gate electrode 186 and the source/drain regions 200 is thereby formed.

A gate electrode 202 of the P-channel type DTMOS transistor 24 is formed on the N-type well 166 via the gate insulating film 182.

A gate electrode 204 of the N-channel type DTMOS transistor 26 is formed on the P-type well 178 via the gate insulating film 182.

The gate electrode 202 of the P-channel type DTMOS transistor 24 and the gate electrode 204 of the N-channel type DTMOS transistor 26 are connected with each other. Namely, parts of gate wirings formed on the N-type well 166 and the P-type well 178 become the gate electrode 202 of the P-channel type DTMOS transistor 24 and the gate electrode 204 of the N-channel type DTMOS transistor 26.

P-type extension regions (low-concentration impurity regions) 206 each forming a shallow impurity region in the extension source/drain structure are formed in the semiconductor substrate 152 at both sides of the gate electrode 202 of the P-channel type DTMOS transistor 24.

The sidewall insulating film 190 is formed at a sidewall part of the gate electrode 202.

P-type high-concentration impurity regions 208 each forming a deep impurity region in the extension source/drain structure are formed in the semiconductor substrate 152 at both sides of the gate electrode 202 where the sidewall insulating film 190 is formed.

Source/drain regions 210 in the extension source/drain structure are each formed by the low-concentration impurity region 206 and the high-concentration impurity region 208.

The P-channel type DTMOS transistor 24 having the gate electrode 202 and the source/drain regions 210 is thereby formed.

The gate electrode 202 of the P-channel type DTMOS transistor 24 is electrically connected to the N-type well 166 via an N-type contact layer 169 formed at the well tap region 238.

N-type extension regions (low-concentration impurity regions) 212 each forming a shallow impurity region in the extension source/drain structure are formed in the semiconductor substrate 152 at both sides of the gate electrode 204 of the N-channel type DTMOS transistor 26.

The sidewall insulating film 190 is formed at a sidewall part of the gate electrode 204.

N-type high-concentration impurity regions 214 each forming a deep impurity region in the extension source/drain structure are formed in the semiconductor substrate 152 at both sides of the gate electrode 204 where the sidewall insulating film 190 is formed.

Source/drain regions 216 in the extension source/drain structure are each formed by the low-concentration impurity region 212 and the high-concentration impurity region 214.

The N-channel type DTMOS transistor 26 having the gate electrode 204 and the source/drain regions 216 is thereby formed.

The gate electrode 204 of the N-channel type DTMOS transistor 26 is electrically connected to the P-type well 178 via a P-type contact layer 181 formed at the well tap region 240.

The N-type well 158 is electrically connected to the power supply potential VDD via an N-type contact layer 161 formed at the well tap region 160 and the power supply line 20. The P-type well 162 is electrically connected to the ground potential VSS via a P-type contact layer 165 formed at the well tap region 164 and the power supply line 22.

The P-type well 170 is electrically connected to the ground potential VSS via a P-type contact layer 173 formed at the well tap region 172 and the power supply line 22. The N-type well 174 is electrically connected to the power supply potential VDD via an N-type contact layer 177 formed at the well tap region 176 and the power supply line 20.

The semiconductor device according to the present embodiment is thereby formed.

As stated above, in the semiconductor device of the present embodiment, the MOS transistors 12, 14 which are not the DTMOS transistors are used for the first stage from among the complementary transistor pairs 16, 28 in plural stages included in the logic cell 10. The input capacitance of each of the MOS transistors 12, 14 is relatively small, and therefore, the logic cell 10 whose input capacitance is relatively small can be obtained, and it is possible to prevent that slew rate of a waveform of an input signal of the logic cell 10 becomes smaller. On the other hand, the DTMOS transistors 24, 26 are used for the final stage from among the complementary transistor pairs 16, 28 in plural stages included in the logic cell 10. In each of the DTMOS transistors 24, 26, the leak current is small, and driveability is high. According to the present embodiment, it is possible to make the power supply voltage low and to reduce the power consumption while preventing the lowering of the operating speed.

(Evaluation Result)

Evaluation results of the semiconductor device according to the present embodiment are described by using FIG. 10 to FIG. 16.

In simulations illustrated in FIG. 10 to FIG. 15, an input signal is changed from L level to H level, and an electric potential at a measuring terminal (Monitor terminal) is found. The electric potential of the input signal in L level is set to be "0" (zero) V, and the electric potential of the input signal in H level is set to be 0.5 V. A period from the time when the input signal changes from L level to H level until an electric potential of an output terminal reaches 50% of the electric potential of H level is set to be a delay time. The 50% of the electric potential of H level is illustrated in each of FIG. 10 to FIG. 14 by using a dotted line.

Figure 10A:
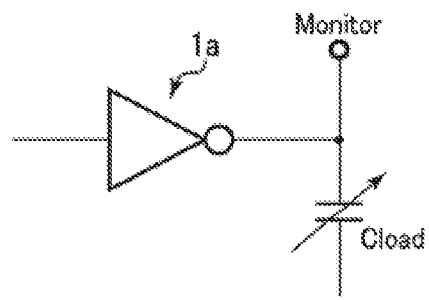
FIGS. 10A and 10B each are a view illustrating a simulation (part 1)
Figure 10B:
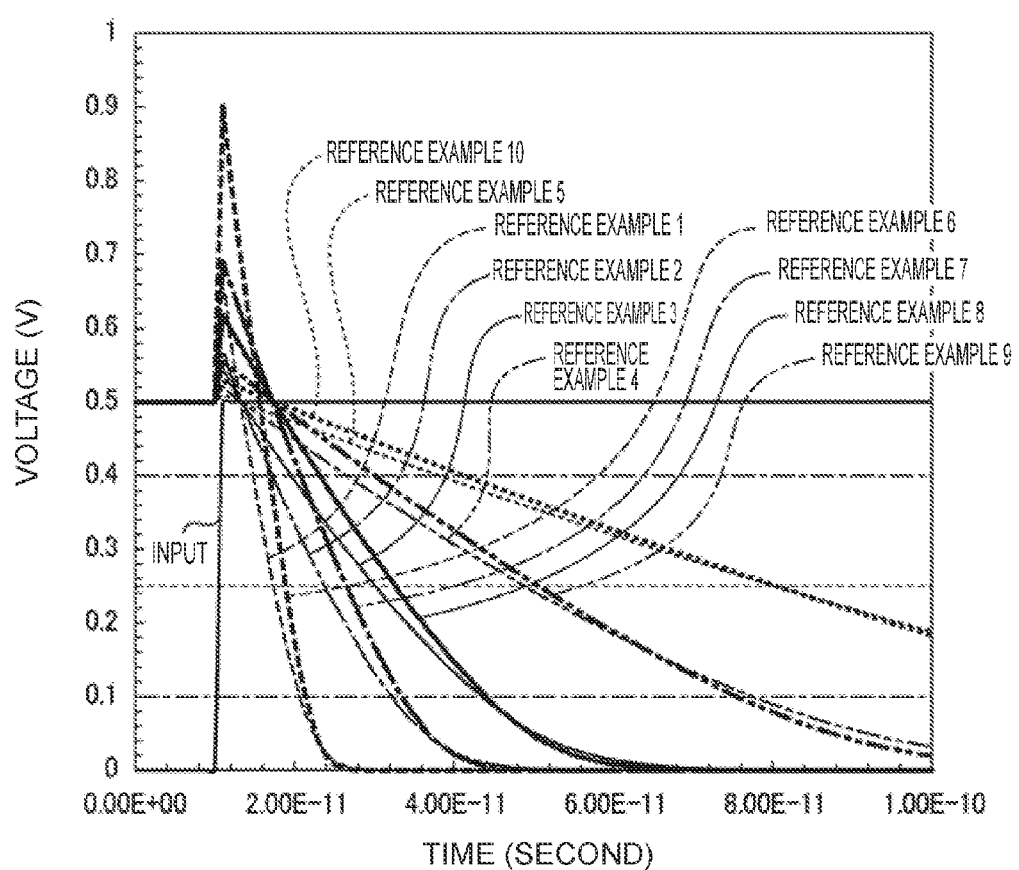

FIG. 10A is a view illustrating a circuit used for a simulation (part 1). FIG. 10B is a graphic chart illustrating a result of the simulation (part 1). A horizontal axis in FIG. 10B represents an elapsed time, and a vertical axis in FIG. 10B represents a voltage of the measuring terminal (Monitor).

As illustrated in FIG. 10A, in the simulation (part 1), one inverter 1a is provided, a load capacitance (variable capacitance) Cload is connected at an output side of the inverter 1a, and an output waveform of the inverter 1a is found.

In each of reference examples 1 to 5, the CMOS inverter 1a is formed by the MOS transistor which is not the DTMOS transistor.

In each of reference examples 6 to 10, the CMOS inverter 1a is formed by the DTMOS transistor.

In each of the reference example 1 and the reference example 6, the load capacitance Cload is set to be "0" (zero) fF. In each of the reference example 2 and the reference example 7, the load capacitance Cload is set to be 1 fF. In each of the reference example 3 and the reference example 8, the load capacitance Cload is set to be 2 fF. In each of the reference example 4 and the reference example 9, the load capacitance Cload is set to be 5 fF. In each of the reference example 5 and the reference example 10, the load capacitance Cload is set to be 10 fF.

As it can be seen from FIG. 10B, the output waveform is steeper in each of the reference examples 6 to 10 in which the CMOS inverter 1a is formed by the DTMOS transistor than in each of the reference examples 1 to 5 in which the CMOS inverter 1a is formed by the MOS transistor which is not the DTMOS transistor. A reason why the output waveforms of the reference examples 6 to 10 are steeper than the reference examples 1 to 5 is because the DTMOS transistor has higher driveability than the MOS transistor which is not the DTMOS transistor.

Besides, as it can be seen by comparing each of the reference examples 1 to 4 and the reference examples 6 to 9, the delay time of each of the reference examples 1 to 4 is shorter than the reference examples 6 to 9. Namely, when the load capacitance Cload is relatively small, the delay time is shorter when the CMOS inverter 1a is formed by the MOS transistor which is not the DTMOS transistor than the case when the CMOS inverter 1a is formed by the DTMOS transistor.

On the other hand, as it can be seen by comparing the reference example 5 and the reference example 10, the delay time of the reference example 10 is shorter than the reference example 5. Namely, when the load capacitance Cload is relatively large, the delay time is shorter when the CMOS inverter 1a is formed by the DTMOS transistor than the case when the CMOS inverter 1a is formed by the MOS transistor which is not the DTMOS transistor.

Figure 11A:
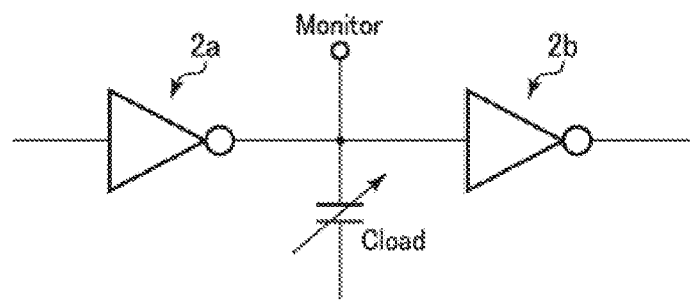
FIGS. 11A and 11B each are a view illustrating a simulation (part 2)
Figure 11B:
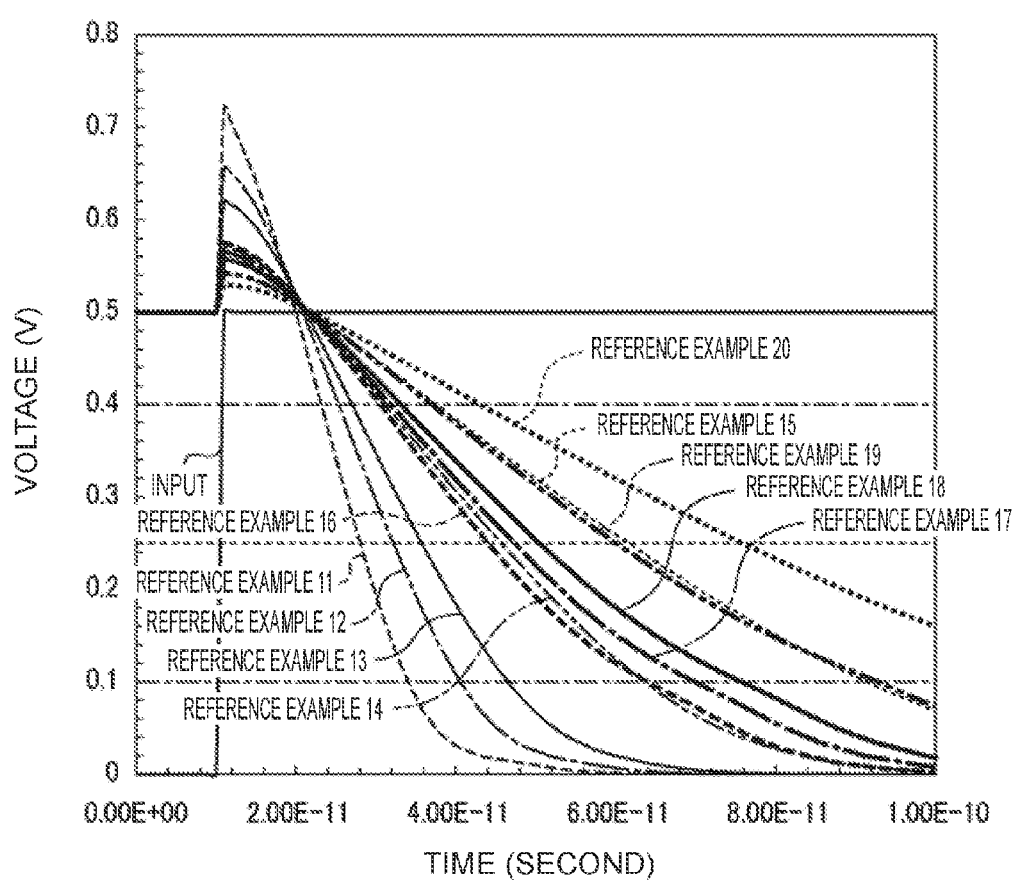

FIG. 11A is a view illustrating a circuit used for a simulation (part 2). FIG. 11B is a graphic chart illustrating a result of the simulation (part 2). A horizontal axis in FIG. 11B represents an elapsed time, and a vertical axis in FIG. 11B represents a voltage of the measuring terminal (Monitor).

As illustrated in FIG. 11A, in the simulation (part 2), two inverters 2a, 2b are connected in series, a load capacitance (variable capacitance) Cload is connected to a wiring between the inverter 2a and the inverter 2b, and an output waveform of the inverter 2a is found.

In all of reference examples 11 to 20, the inverter 2a is formed by the DTMOS transistor.

Besides, in each of the reference examples 11 to 15, the CMOS inverter 2b is formed by the MOS transistor which is not the DTMOS transistor. When the CMOS inverter 2b is formed by the MOS transistor which is not the DTMOS transistor, the input capacitance of the CMOS inverter 2b is set to be 0.89 fF.

Besides, in each of the reference examples 16 to 20, the CMOS inverter 2b is formed by the DTMOS transistor. When the CMOS inverter 2b is formed by the DTMOS transistor, the input capacitance of the CMOS inverter 2b is set to be 1.77 fF.

In each of the reference example 11 and the reference example 16, the load capacitance Cload is set to be "0" (zero) fF. In each of the reference example 12 and the reference example 17, the load capacitance Cload is set to be 1 fF. In each of the reference example 13 and the reference example 18, the load capacitance Cload is set to be 2 fF. In each of the reference example 14 and the reference example 19, the load capacitance Cload is set to be 5 fF. In each of the reference example 15 and the reference example 20, the load capacitance Cload is set to be 10 fF.

As it can be seen by comparing each of the reference examples 11 to 15 and the reference examples 16 to 20, the delay time of each of the reference examples 16 to 20 is longer than the reference examples 11 to 15 regardless of a value of the variable capacitance Cload. Namely, the delay time is longer when the CMOS inverter 2b is formed by the DTMOS transistor than the case when the CMOS inverter 2b is formed by the MOS transistor which is not the DTMOS transistor. A reason why the delay time of each of the reference examples 16 to 20 is longer than the reference examples 11 to 15 is because the DTMOS transistor has the larger input capacitance than the MOS transistor which is not the DTMOS transistor.

Figure 12A:
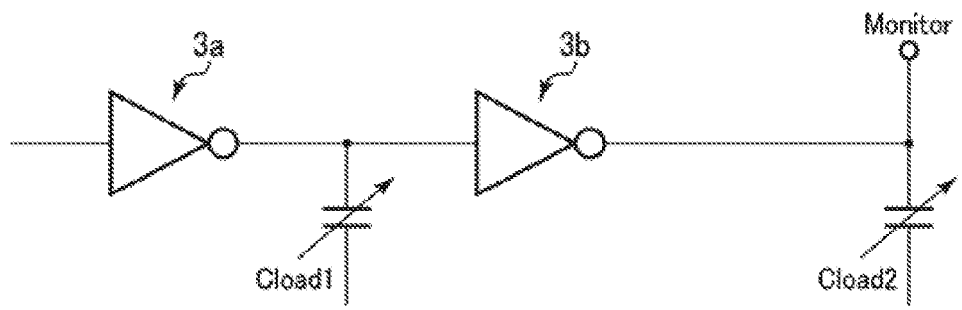
FIGS. 12A and 12B each are a view illustrating a simulation (part 3)
Figure 12B:
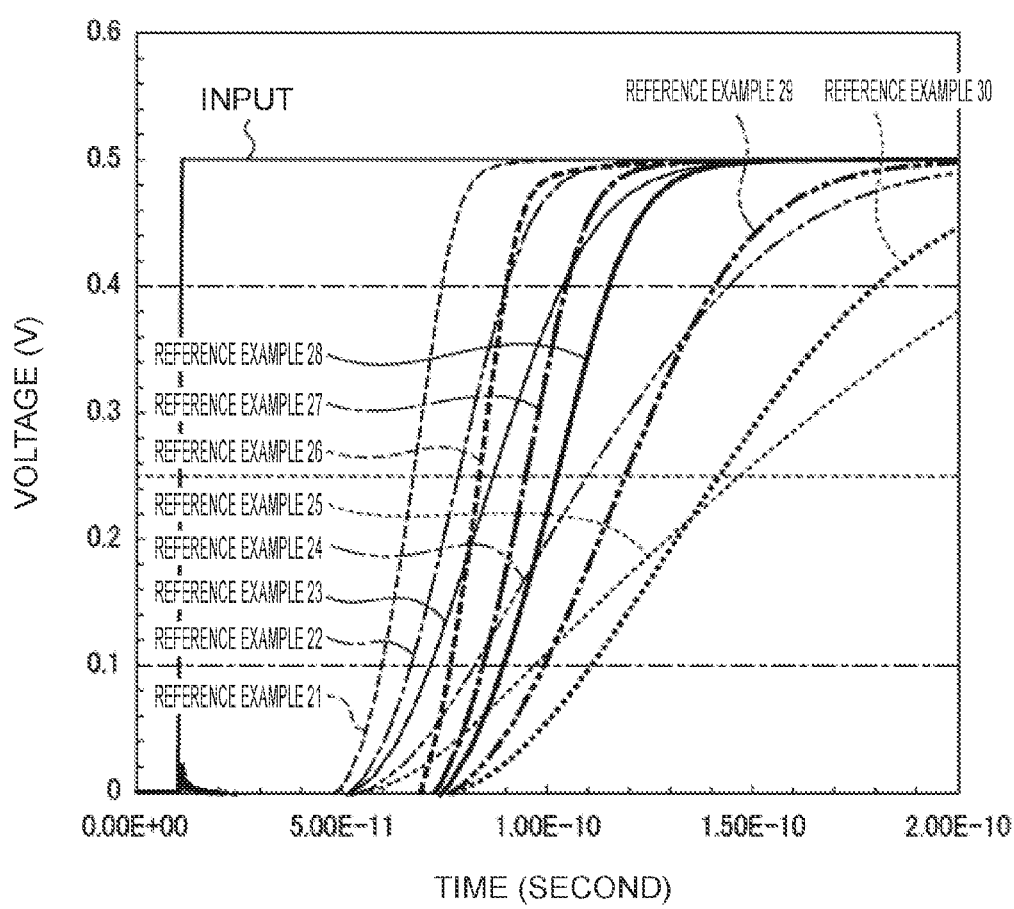

FIG. 12A is a view illustrating a circuit used for a simulation (part 3). FIG. 12B is a graphic chart illustrating a result of the simulation (part 3). A horizontal axis in FIG. 12B represents an elapsed time, and a vertical axis in FIG. 12B represents a voltage of the measuring terminal (Monitor).

In the simulation (part 3), two inverters 3a, 3b are connected in series, a load capacitance (fixed capacitance) Cload1 is connected to a wiring between the inverter 3a and the inverter 3b, a load capacitance (variable capacitance) Cload2 is connected to an output of the inverter 3b, and an output waveform of the inverter 3a is found.

In all of reference examples 21 to 30, the inverter 3a is formed by the DTMOS transistor.

Besides, in each of the reference examples 21 to 25, the CMOS inverter 3b is formed by the MOS transistor which is not the DTMOS transistor. When the CMOS inverter 3b is formed by the MOS transistor which is not the DTMOS transistor, the input capacitance of the CMOS inverter 3b is set to be 0.89 fF.

Besides, in each of the reference examples 26 to 30, the CMOS inverter 3b is formed by the DTMOS transistor. When the CMOS inverter 3b is formed by the DTMOS transistor, the input capacitance of the CMOS inverter 3b is set to be 1.77 fF.

The fixed capacitance Cload1 is set to be 5.0 fF.

In each of the reference example 21 and the reference example 26, the load capacitance Cload2 is set to be "0" (zero) fF. In each of the reference example 22 and the reference example 27, the load capacitance Cload2 is set to be 1 fF. In each of the reference example 23 and the reference example 28, the load capacitance Cload2 is set to be 2 fF. In each of the reference example 24 and the reference example 29, the load capacitance Cload2 is set to be 5 fF. In each of the reference example 25 and the reference example 30, the load capacitance Cload2 is set to be 10 fF.

In all of the reference examples 21 to 30, the delay time becomes large as a value of the variable capacitance Cload2 becomes large.

Besides, as it can be seen by comparing each of the reference examples 21 to 24 and the reference examples 26 to 29, the delay time of each of the reference examples 21 to 24 is shorter than the reference examples 26 to 29. Namely, the delay time is shorter when the CMOS inverter 3b is formed by the MOS transistor which is not the DTMOS transistor than the case when the CMOS inverter 3b is formed by the DTMOS transistor when the load capacitance Cload2 is relatively small. This is because the MOS transistor which is not the DTMOS transistor has the smaller input capacitance than the DTMOS transistor.

Besides, as it can be seen by comparing the reference example 25 and the reference example 30, the delay time of the reference example 30 is shorter than the reference example 25. Namely, when the load capacitance Cload2 is relatively large, the delay time is shorter when the CMOS inverter 3b is formed by the DTMOS transistor than the case when the CMOS inverter 3b is formed by the MOS transistor which is not the DTMOS transistor. This is because the driveability of the DTMOS transistor is higher than the MOS transistor which is not the DTMOS transistor.

As stated above, when the value of the load capacitance Cload2 is relatively small, it is advantageous from a point of view of the delay time when the CMOS inverter 3b is formed by the MOS transistor which is not the DTMOS transistor.

On the other hand, when the value of the load capacitance Cload2 is relatively large, it is advantageous from the point of view of the delay time when the CMOS inverter 3b is formed by the DTMOS transistor.

Here, a circuit in which one inverter 3b is connected to one inverter 3a is described as an example, but it is possible in which plural inverters 3b are connected in parallel to an output of the inverter 3a. Namely, there is a case when the number of Fanout is two or more. As the number of Fanout becomes larger, an effect of the input capacitance of the inverter 3b on a signal delay becomes larger. Accordingly, when the number of Fanout is large, it is conceivable that it is advantageous from the point of view of the delay time to form the CMOS inverter 3b by the MOS transistor which is not the DTMOS transistor.

Figure 13A:
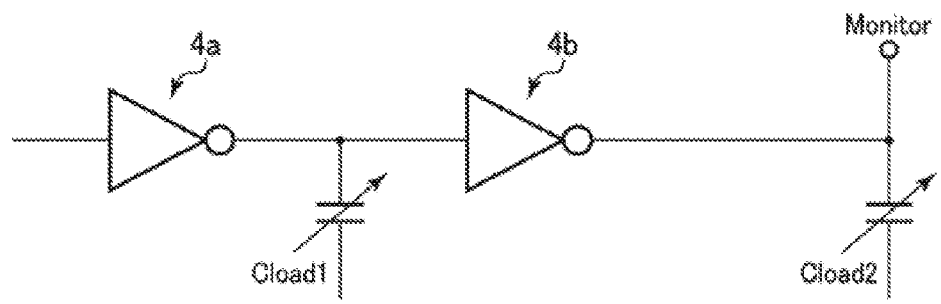
FIGS. 13A and 13B each are a view illustrating a simulation (part 4)
Figure 13B:
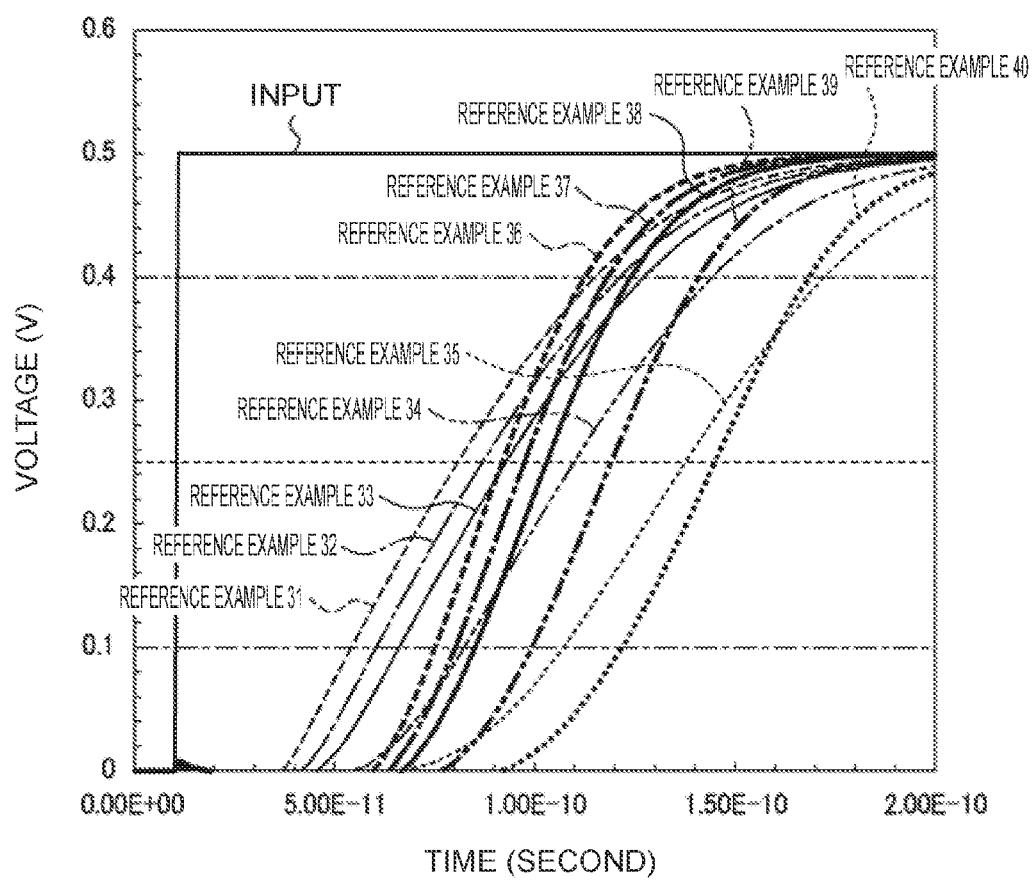

FIG. 13A is a view illustrating a circuit used for a simulation (part 4). FIG. 13B is a graphic chart illustrating a result of the simulation (part 4). A horizontal axis in FIG. 13B represents an elapsed time, and a vertical axis in FIG. 13B represents a voltage of the measuring terminal (Monitor).

In the simulation (part 4), two inverters 4a, 4b are connected in series, a load capacitance (variable capacitance) Cload1 is connected to a wiring between the inverter 4a and the inverter 4b, a load capacitance (fixed capacitance) Cload2 is connected to an output of the inverter 4b, and an output waveform of the inverter 4a is found.

In all of reference examples 31 to 40, the inverter 4a is formed by the DTMOS transistor.

Besides, in each of the reference examples 31 to 35, the CMOS inverter 4b is formed by the MOS transistor which is not the DTMOS transistor. When the CMOS inverter 4b is formed by the MOS transistor which is not the DTMOS transistor, the input capacitance of the CMOS inverter 4b is set to be 0.89 fF.

Besides, in each of the reference examples 36 to 40, the CMOS inverter 4b is formed by the DTMOS transistor. When the CMOS inverter 4b is formed by the DTMOS transistor, the input capacitance of the CMOS inverter 4b is set to be 1.77 fF.

The fixed capacitance Cload1 is set to be 5.0 fF.

In each of the reference example 31 and the reference example 36, the load capacitance Cload1 is set to be "0" (zero) fF. In each of the reference example 32 and the reference example 37, the load capacitance Cload1 is set to be 1 fF. In each of the reference example 33 and the reference example 38, the load capacitance Cload1 is set to be 2 fF. In each of the reference example 34 and the reference example 39, the load capacitance Cload1 is set to be 5 fF. In each of the reference example 35 and the reference example 40, the load capacitance Cload1 is set to be 10 fF.

As it can be seen by comparing each of the reference examples 31 to 35 and the reference examples 36 to 40, the delay time of each of the reference examples 31 to 35 is shorter than the reference examples 36 to 40. Namely, the delay time is shorter when the CMOS inverter 4b is formed by the MOS transistor which is not the DTMOS transistor than the case when the CMOS inverter 4b is formed by the DTMOS transistor. The smaller a value of the load capacitance Cload2 is, the more remarkable this trend is.

Figure 14A:
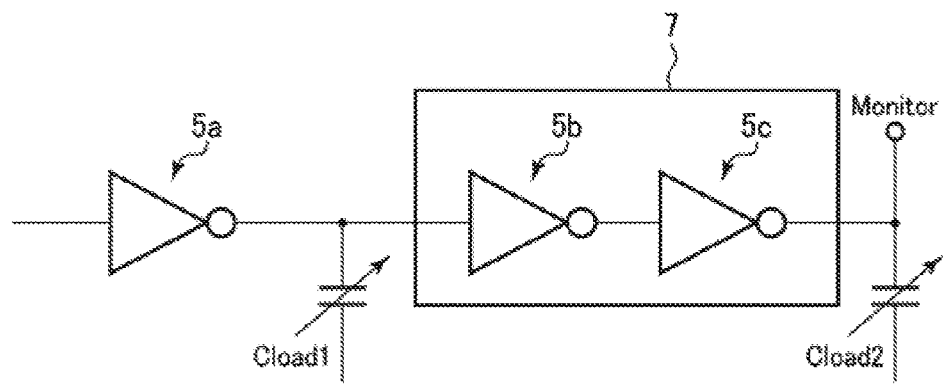
FIGS. 14A and 14B each are a view illustrating a simulation (part 5)
Figure 14B:
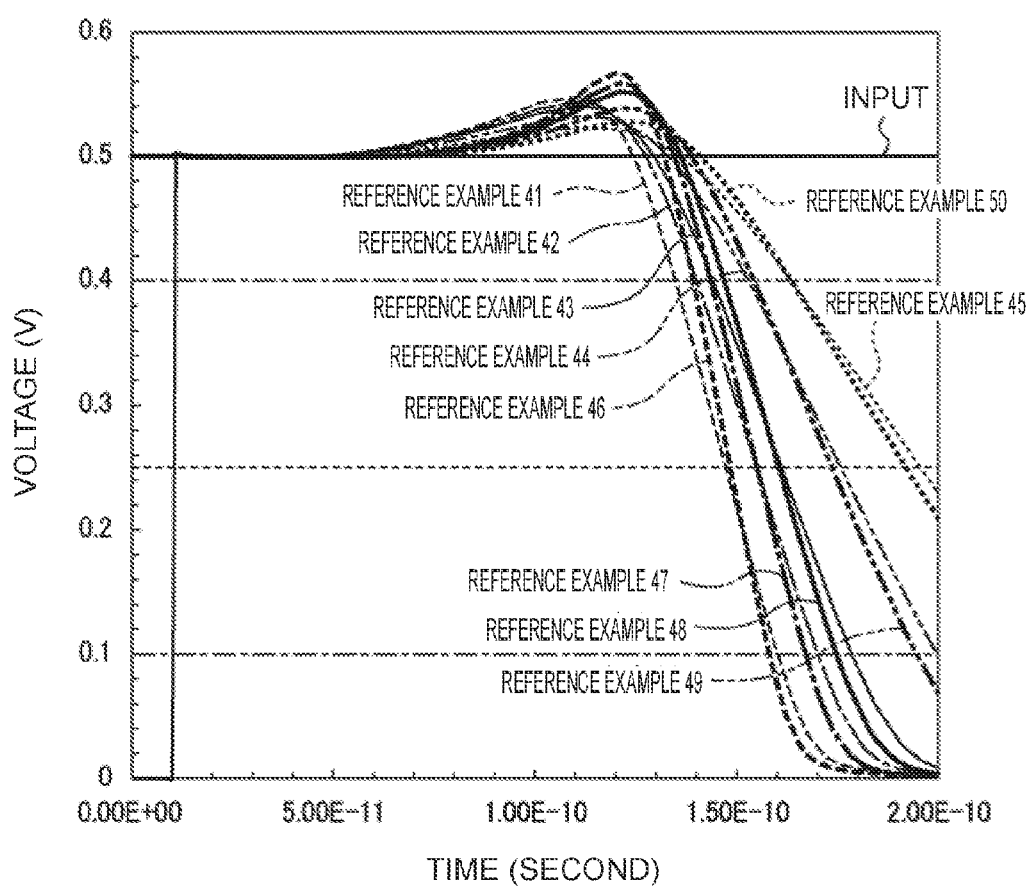

FIG. 14A is a view illustrating a circuit used for a simulation (part 5). FIG. 14B is a graphic chart illustrating a result of the simulation (part 5). A horizontal axis in FIG. 14B represents an elapsed time, and a vertical axis in FIG. 14B represents a voltage of the measuring terminal (Monitor).

In the simulation (part 5), three inverters 5a, 5b, 5c are connected in series, a load capacitance (fixed capacitance) Cload1 is connected to a wiring between the inverter 5a and the inverter 5b, a load capacitance (variable capacitance) Cload2 is connected to an output of the inverter 5c. An output waveform of an output of a buffer 7 formed by the inverter 5b and the inverter 5c, namely, the output waveform of the inverter 5c is found.

In all of reference examples 41 to 50, the inverters 5a, 5c are formed by the DTMOS transistors.

Besides, in each of the reference examples 41 to 45, the CMOS inverter 5b is formed by the MOS transistor which is not the DTMOS transistor. When the CMOS inverter 5b is formed by the MOS transistor which is not the DTMOS transistor, the input capacitance of the CMOS inverter 5b is set to be 0.89 fF.

Besides, in each of the reference examples 46 to 50, the CMOS inverter 5b is formed by the DTMOS transistor. When the CMOS inverter 5b is formed by the DTMOS transistor, an input capacitance of the CMOS inverter 5b is set to be 1.77 fF.

The fixed capacitance Cload1 is set to be 5.0 fF.

In each of the reference example 41 and the reference example 46, the load capacitance Cload2 is set to be "0" (zero) fF. In each of the reference example 42 and the reference example 47, the load capacitance Cload2 is set to be 1 fF. In each of the reference example 43 and the reference example 48, the load capacitance Cload2 is set to be 2 fF. In each of the reference example 44 and the reference example 49, the load capacitance Cload2 is set to be 5 fF. In each of the reference example 45 and the reference example 50, the load capacitance Cload2 is set to be 10 fF.

As it can be seen by comparing the reference example 43 and the reference example 48, the delay times of the reference example 43 and the reference example 48 are equivalent.

As it can be seen by comparing each of the reference examples 41, 42 and the reference examples 46, 47, the delay times of the reference examples 41, 42 are shorter than the reference examples 46, 47. Namely, when the load capacitance Cload2 is relatively small, the delay time is shorter when the CMOS inverter 5b is formed by the MOS transistor which is not the DTMOS transistor than the case when the CMOS inverter 5b is formed by the DTMOS transistor.

On the other hand, as it can be seen by comparing each of the reference examples 44, 45 and the reference examples 49, 50, the delay times of the reference examples 49, 50 are shorter than the reference examples 44, 45. Namely, when the load capacitance Cload2 is relatively large, the delay time is shorter when the CMOS inverter 5b is formed by the DTMOS transistor than the case when the CMOS inverter 5b is formed by the MOS transistor which is not the DTMOS transistor.

Figure 15A:
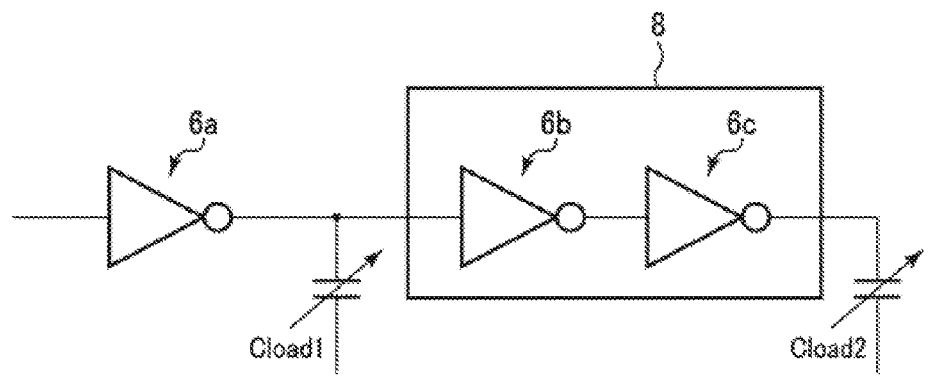
FIGS. 15A and 15B each are a view illustrating a simulation (part 6)
Figure 15B:
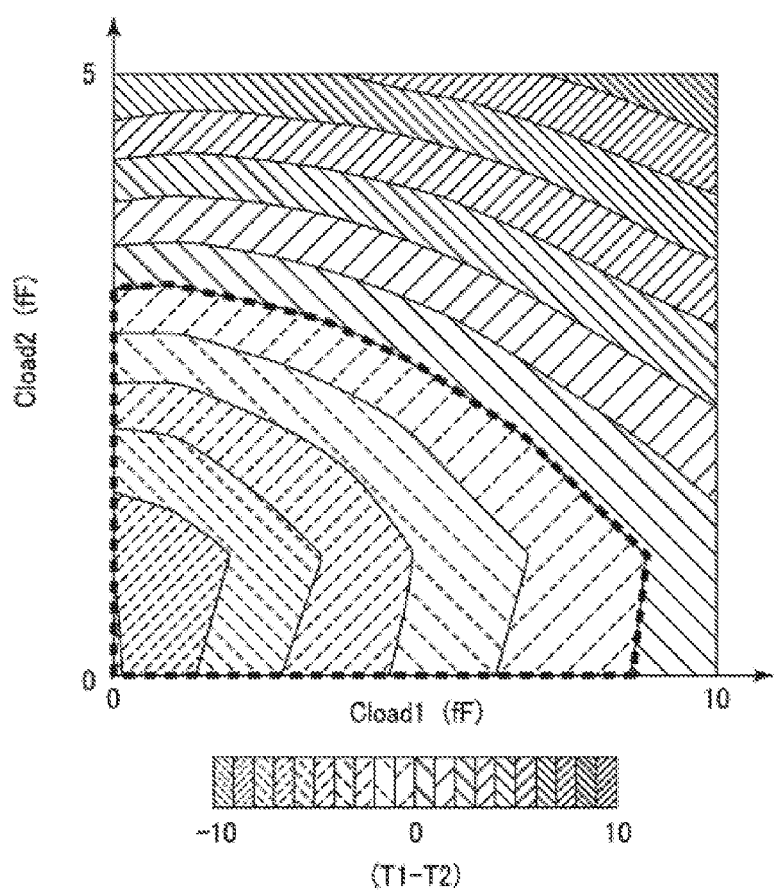

FIG. 15A is a view illustrating a circuit used for a simulation (part 6). FIG. 15B is a graphic chart illustrating a result of the simulation (part 6). A horizontal axis in FIG. 15B represents a value of a load capacitance Cload1 at an input side of a buffer, and a vertical axis in FIG. 15B represents a value of a load capacitance Cload2 at an output side of the buffer.

In the simulation (part 6), three inverters 6a, 6b, 6c are connected in series, the load capacitance (variable capacitance) Cload1 is connected to a wiring between the inverter 6a and the inverter 6b, the load capacitance (variable capacitance) Cload2 is connected to an output of the inverter 6c. A delay time at an output of a buffer 8 formed by the inverter 6b and the inverter 6c, namely, at an output of the inverter 6c is found.

A value (T1-T2) in which a delay time T2 when the inverter 6b is formed by the DTMOS transistor is subtracted from a delay time T1 when the inverter 6b is formed by the MOS transistor which is not the DTMOS transistor is illustrated in FIG. 15B.

At a part surrounded by a dotted line in FIG. 15B, it is advantageous from a point of view of the delay time when the inverter 6b is formed by the MOS transistor which is not the DTMOS transistor compared to the case when the inverter 6b is formed by the DTMOS transistor. Namely, when the load capacitance Cload1 at an input side of the buffer 8 and the load capacitance Cload2 at an output side of the buffer 8 are relatively small, it is advantageous from the point of view of the delay time when the inverter 6b is formed by the MOS transistor which is not the DTMOS transistor.

On the other hand, at a part other than the part surrounded by the dotted line in FIG. 15B, it is advantageous when the inverter 6b is formed by the DTMOS transistor compared to the case when the inverter 6b is formed by the MOS transistor which is not the DTMOS transistor. Namely, when the load capacitance Cload1 at the input side of the buffer 8 and the load capacitance Cload2 at the output side of the buffer 8 are relatively large, it is advantageous from the point of view of the delay time when the inverter 6b is formed by the DTMOS transistor.

Parts of the inverters 5a, 5b and the load capacitance (fixed capacitance) Cload1 in the circuit illustrated in FIG. 14A are equivalent to parts of the inverters 3a, 3b and the load capacitance (fixed capacitance) Cload1 in FIG. 12A. As it is described by using FIG. 12, when the load capacitance Cload2 of the inverter 3b is relatively small, it is advantageous from the point of view of the delay time when the inverter 3b is formed by the MOS transistor which is not the DTMOS transistor. In the circuit illustrated in FIG. 14A, the capacitance between the inverter 5b and the inverter 5c is set to be "0" (zero) fF. Accordingly, it is conceivable that it is advantageous from the point of view of the delay time when the inverter 5b is formed by the MOS transistor which is not the DTMOS transistor compared to the case when the inverter 5b is formed by the DTMOS transistor also in the circuit illustrated in FIG. 14A.

Besides, parts of the inverters 6a, 6b and the load capacitance (variable capacitance) Cload1 in FIG. 15A are equivalent to parts of the inverters 4a, 4b and the load capacitance (variable capacitance) Cload1 in FIG. 13A. As it is described by using FIG. 13, a shortening effect of the delay time when the inverter 4b is formed by the MOS transistor which is not the DTMOS transistor is more remarkable as the load capacitance Cload1 is smaller. This falls in with the simulation result illustrated in FIG. 15B.

Besides, when the plural inverters 5b are connected in parallel to the output of the inverter 5a illustrated in FIG. 14A, namely, when the number of Fanout is two or more, the effect of the input capacitance of the inverter 5b on the signal delay is large. Accordingly, when the number of Fanout is large, it is conceivable that the delay time can be shortened when the inverter 5b is formed by the MOS transistor which is not the DTMOS transistor.

As stated above, the MOS transistor which is not the DTMOS transistor is used for the first stage of the buffer circuit, the DTMOS transistor is used for the final stage of the buffer circuit, and thereby, it is possible to shorten the delay time compared to a case when all of the stages of the buffer circuit is formed by the DTMOS transistors. This trend becomes more remarkable when the number of buffer circuits connected in parallel is large, namely, when the number of Fanout is large.

Figure 16A:
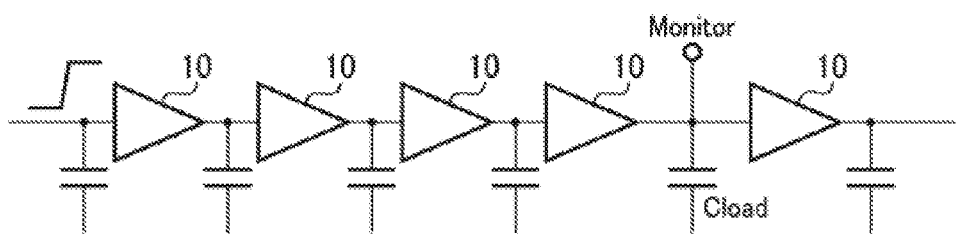
FIGS. 16A and 16B each are a view illustrating a simulation (part 7)
Figure 16B:
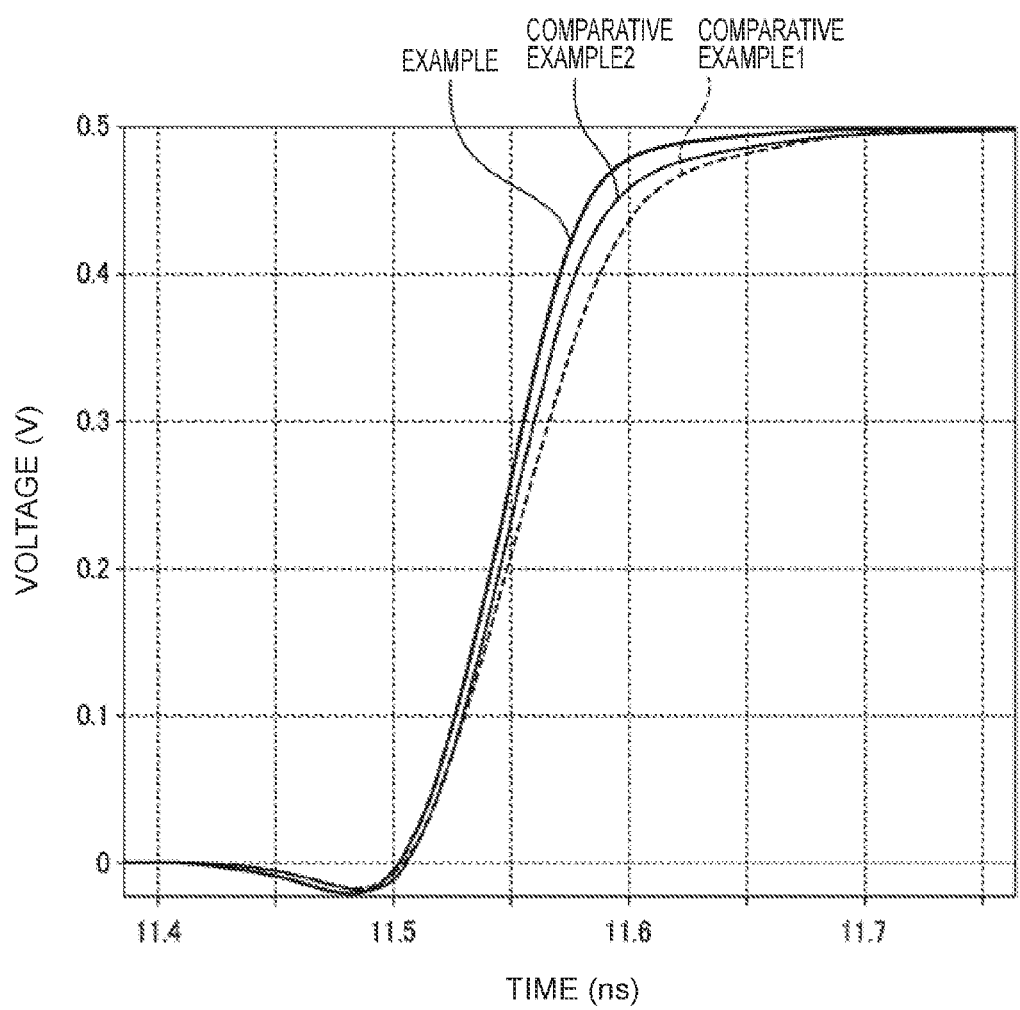

FIG. 16A is a view illustrating a circuit used for a simulation (part 7). FIG. 16B is a graphic chart illustrating a result of the simulation (part 7). FIG. 16B represents a rising waveform, a horizontal axis in FIG. 16B represents an elapsed time, a vertical axis in FIG. 16B represents a voltage of an output terminal of a buffer circuit.

As illustrated in FIG. 16A, the logic cells 10 are connected in five stages. As the logic cell 10, a buffer circuit is used.

In all of an example, a comparative example 1, and a comparative example 2, the buffer circuit 10a is formed by connecting CMOS inverters in two stages. Besides, in all of an example, a comparative example 1, and a comparative example 2, four buffer circuits 10a are connected in parallel at an output of one buffer circuit 10a. Namely, the number of Fanout is set to be four. However, in FIG. 16A, one buffer circuit 10a from among the plural buffer circuits 10a connected in parallel is each illustrated.

The example corresponds to the present embodiment, the MOS transistors 12, 14 which are not the DTMOS transistors are used for the complementary transistor pair 16 at the first stage, and the DTMOS transistors 24, 26 are used for the complementary transistor pair 28 at the second stage.

In the comparative example 1, the MOS transistors which are not the DTMOS transistors are used for the complementary transistor pair at the first stage and the complementary transistor pair at the second stage. Note that a threshold voltage of the MOS transistor used for the comparative example 1 is set to be higher than a threshold voltage of the MOS transistor used for the example to set a leak current in the comparative example 1 equivalent to a leak current in the example.

In the comparative example 2, the DTMOS transistors are used for the complementary transistor pair at the first stage and the complementary transistor pair at the second stage.

A load capacitance Cload is connected to an output of each logic cell 10 connected in plural stages, namely, to an output of each buffer circuit 10a. A size of each load capacitance Cload is set to be 10 fF. The power supply voltage VDD is set at 0.5 V. Besides, in all cases, a signal changing from L level to H level is input to an input terminal of the logic cell 10 at the first stage.

An output waveform of the logic cell 10 at the fourth stage is observed (Monitor).

In case of the comparative example 1, a rising time of the waveform is 57 psec.

Here, the waveform rising time is a time required for the voltage at the output terminal of the logic cell 10 to reach from 20% of the power supply voltage to 80% of the power supply voltage.

In the comparative example 1, a reason why the waveform rising time becomes relatively long is because the driveability of the MOS transistor becomes low in accordance with lowering of the power supply voltage.

In case of the comparative example 2, the waveform rising time is 47.5 psec.

A reason why the waveform rising time in the comparative example 2 is shorter than the waveform rising time in the comparative example 1 is because the driveability of the DTMOS transistor is higher than the driveability of the MOS transistor which is not the DTMOS transistor.

On the other hand, in case of the example, namely, in case of the present embodiment, the waveform rising time is 44.3 psec.

Besides, as stated above, the simulation (part 7) is a case when the four buffer circuits 10a are connected to the output terminal of the buffer circuit 10a in parallel, namely, the number of Fanout is four. As stated above, the MOS transistor which is not the DTMOS transistor is used for the first stage of the buffer circuit 10a, and thereby, it contributes to drastic shortening of the delay time. Accordingly, in the example, the waveform rising time of output is shorter compared to the comparative example 1 and the comparative example 2.

As stated above, in the example, a reason why the waveform rising time is short is because the input capacitance of the logic cell 10 is small, and the driveability of the logic cell 10 is high.

It can be seen from the above in which the excellent semiconductor device whose operating speed is fast can be obtained even when the power supply voltage is set low according to the present embodiment.

(Manufacturing Method of Semiconductor Device)

Next, a manufacturing method of a semiconductor device according to the present embodiment is described by using FIG. 17 to FIG. 52. FIG. 17 to FIG. 52 are process charts illustrating the manufacturing method of the semiconductor device according to the present embodiment. FIG. 17, FIG. 19, FIG. 21, FIG. 23, FIG. 25, FIG. 27, FIG. 29, FIG. 31, FIG. 33, FIG. 35, FIG. 37, FIG. 39, FIG. 41, FIG. 43, FIG. 45, FIG. 47, FIG. 49, and FIG. 51 are plan views. FIG. 18, FIG. 20, FIG. 22, FIG. 24, FIG. 26, FIG. 28, FIG. 30, FIG. 32, FIG. 34, FIG. 36, FIG. 38, FIG. 40, FIG. 42, FIG. 44, FIG. 46, FIG. 48, FIG. 50, and FIG. 52 are sectional views. FIGS. 18A to 18C, FIGS. 20A to 20C, FIGS. 22A to 22C, FIGS. 24A to 24C, FIGS. 26A to 26C, FIGS. 28A to 28C, FIGS. 30A to 30C, FIGS. 32A to 32C, and FIGS. 34A to 34C respectively correspond to a I-I' cross section, a II-II' cross section, and a III-III' cross section in FIG. 17, FIG. 19, FIG. 21, FIG. 23, FIG. 25, FIG. 27, FIG. 29, FIG. 31, and FIG. 33. FIGS. 36A to 36C, FIGS. 38A to 38C, FIGS. 40A to 40C, FIGS. 42A to 42C, FIGS. 44A to 44C, FIGS. 46A to 46C, FIGS. 48A to 48C, FIGS. 50A to 50C, and FIGS. 52A to 52C respectively correspond to a I-I' cross section, a II-II' cross section, and a III-III' cross section in FIG. 35, FIG. 37, FIG. 39, FIG. 41, FIG. 43, FIG. 45, FIG. 47, FIG. 49, and FIG. 51.

Figure 17:
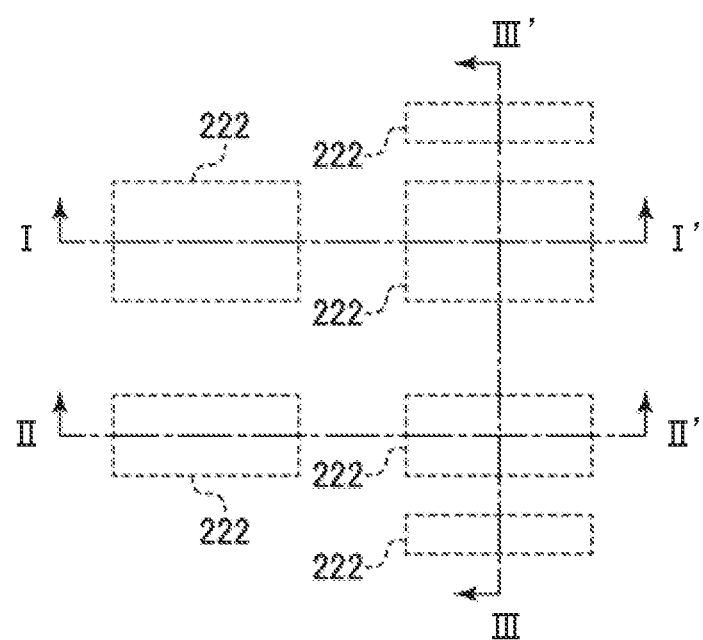
FIG. 17 is a process chart (part 1) illustrating a manufacturing method of the semiconductor device according to the first embodiment.
Figure 18A:
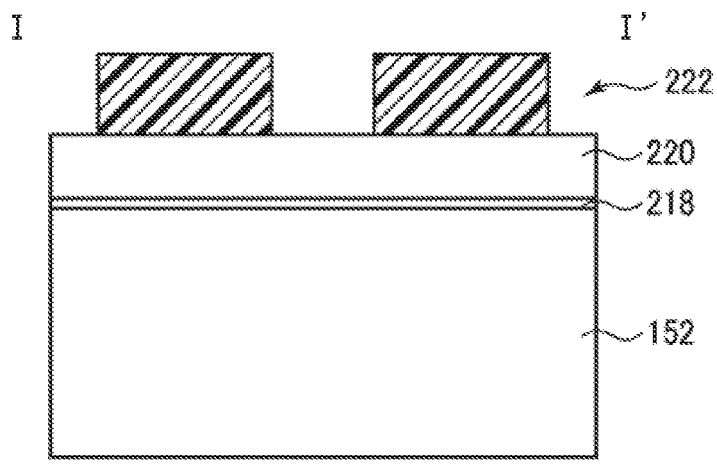
FIGS. 18A, 18B and 18C each are a process chart (part 2) illustrating the manufacturing method of the semiconductor device according to the first embodiment.
Figure 18B:
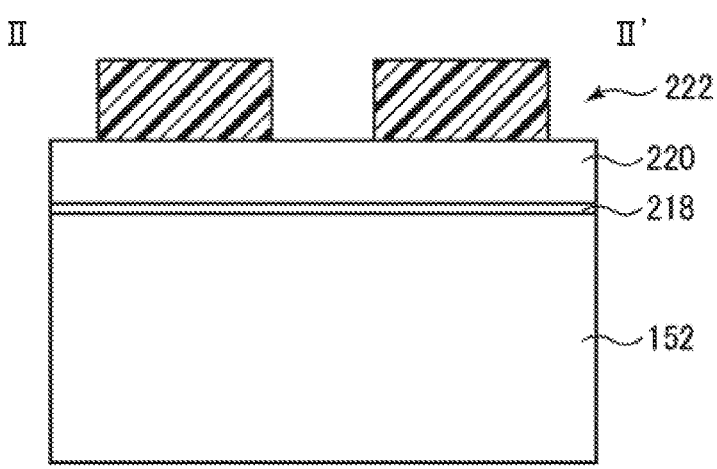
Figure 18C:
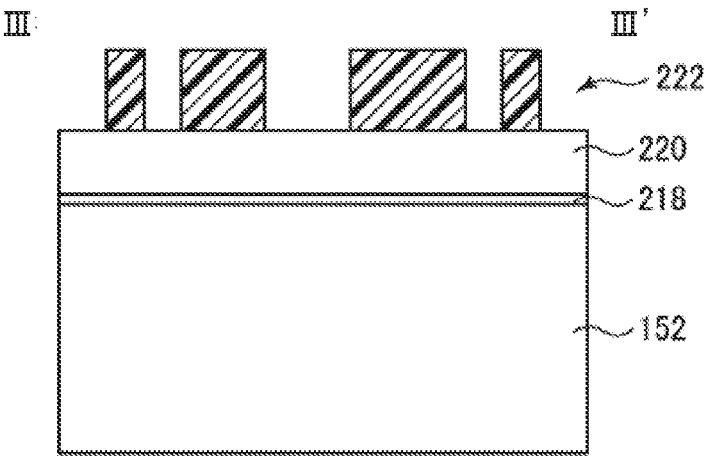

At first, as illustrated in FIG. 17 and FIG. 18, the semiconductor substrate 152 is prepared. As the semiconductor substrate 152, for example, a silicon substrate is used.

Next, a silicon oxide film 218 with a film thickness of, for example, approximately 5 nm to 15 nm is formed at a whole surface by, for example, the thermal oxidation method.

Next, a silicon nitride film 220 with a film thickness of, for example, approximately 60 nm to 100 nm is formed at the whole surface by, for example, the CVD (Chemical Vapor Deposition) method.

Next, a photoresist film 222 is formed at the whole surface by, for example, the spin coat method.

Next, the photoresist film 222 is patterned into a planar shape of each of the element regions (active regions) 230, 232, 234, 236 and the well tap regions 160, 164, 170, 176, 238, 240 by using the photolithography technique.

Next, the silicon nitride film 220 and the silicon oxide film 218 are etched by using the photoresist film 222 as a mask by, for example, the RIE (Reactive Ion Etching) method. For example, $CF_x$ based gas is used as etching gas.

Next, the photoresist film 222 is removed by, for example, the asking.

Next, a photoresist film 224 is formed at the whole surface by, for example, the spin coat method.

Figure 19:
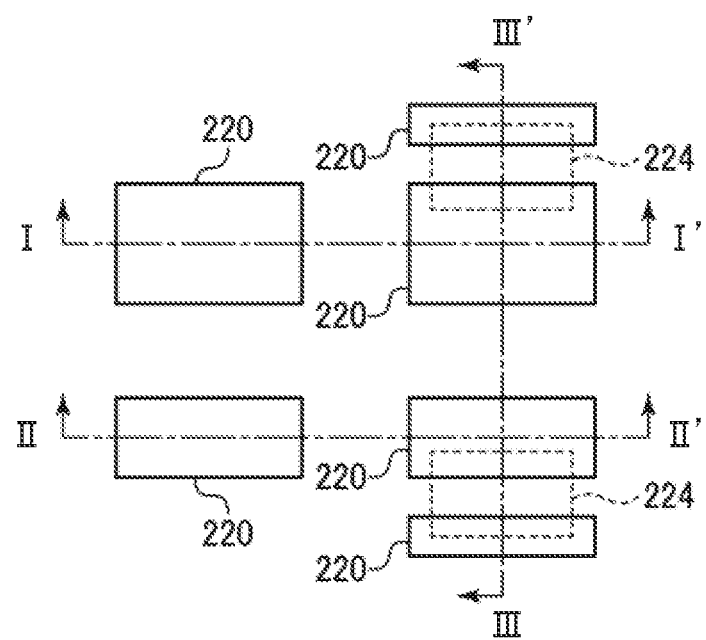
FIG. 19 is a process chart (part 3) illustrating the manufacturing method of the semiconductor device according to the first embodiment.
Figure 20A:
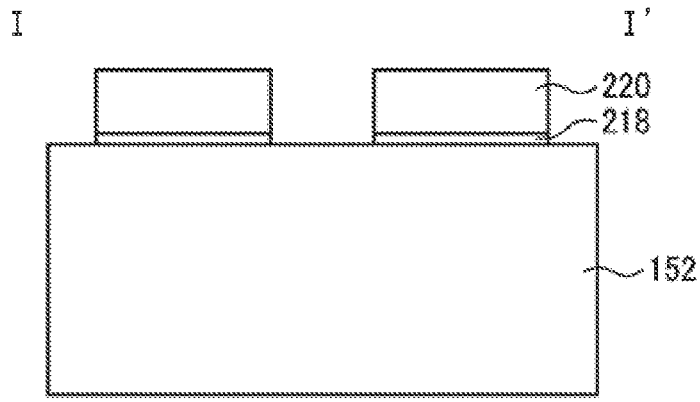
FIGS. 20A, 20B and 20C each are a process chart (part 4) illustrating the manufacturing method of the semiconductor device according to the first embodiment.
Figure 20B:
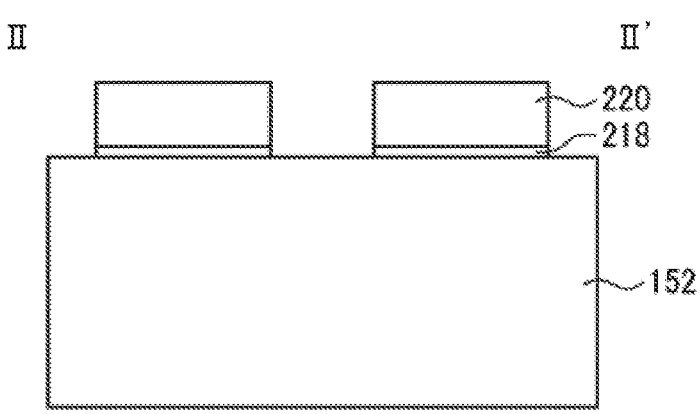
Figure 20C:
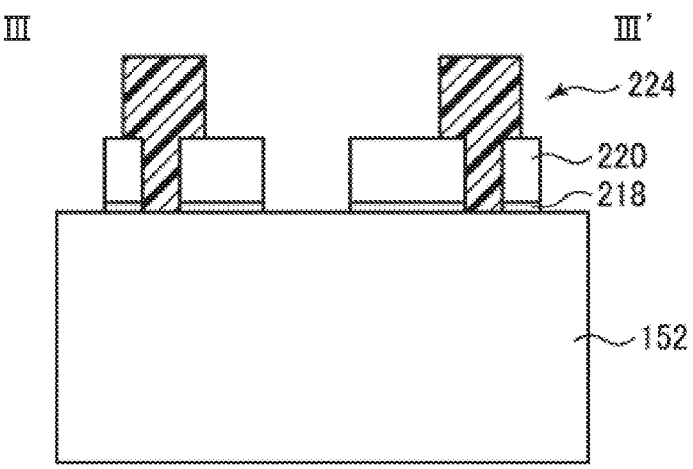

Next, the photoresist film 224 is patterned into a planar shape of the shallow element isolation region 156 (refer to FIG. 9) by using the photolithography technique (refer to FIG. 19 and FIG. 20).

Next, the semiconductor substrate 152 is etched by, for example, the RIE method to form grooves 226 while using the photoresist film 224 and the silicon nitride film 220 as the masks. An etching amount is, for example, approximately 100 nm to 340 nm. For example, Cl based gas is used as the etching gas.

Figure 21:
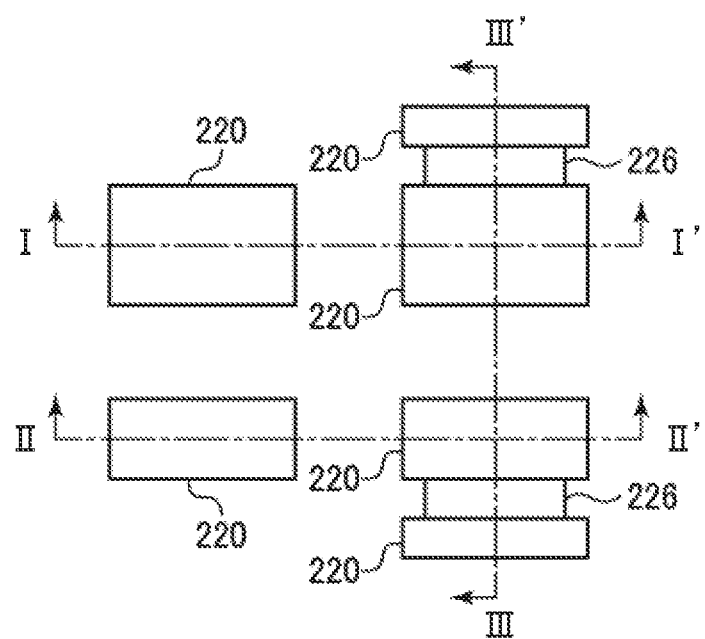
FIG. 21 is a process chart (part 5) illustrating the manufacturing method of the semiconductor device according to the first embodiment.
Figure 22A:
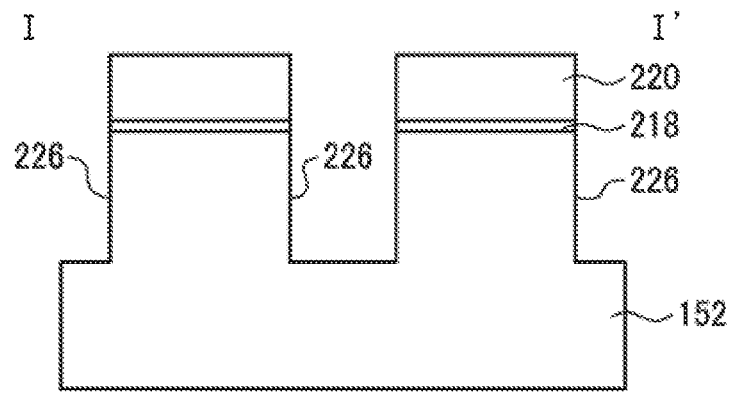
FIGS. 22A, 22B and 22C each are a process chart (part 6) illustrating the manufacturing method of the semiconductor device according to the first embodiment.
Figure 22B:
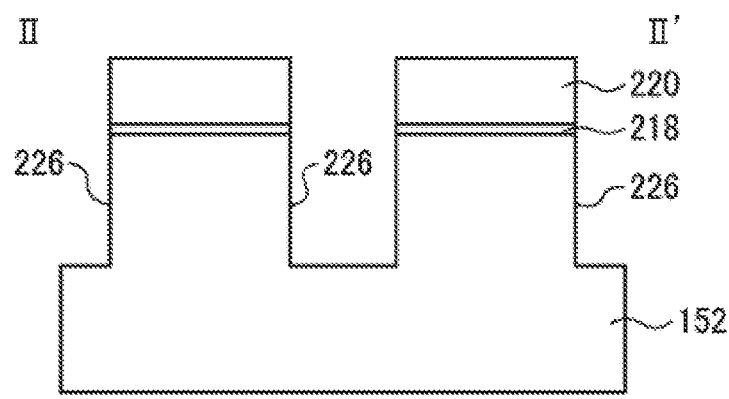
Figure 22C:
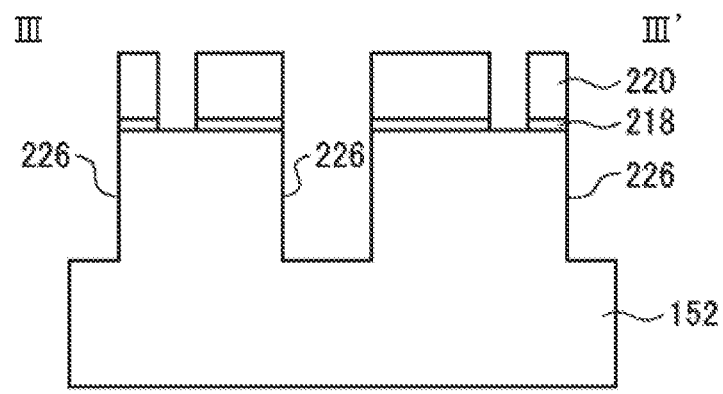

Next, the photoresist film 224 is removed by, for example, the asking (refer to FIG. 21 and FIG. 22).

Figure 23:
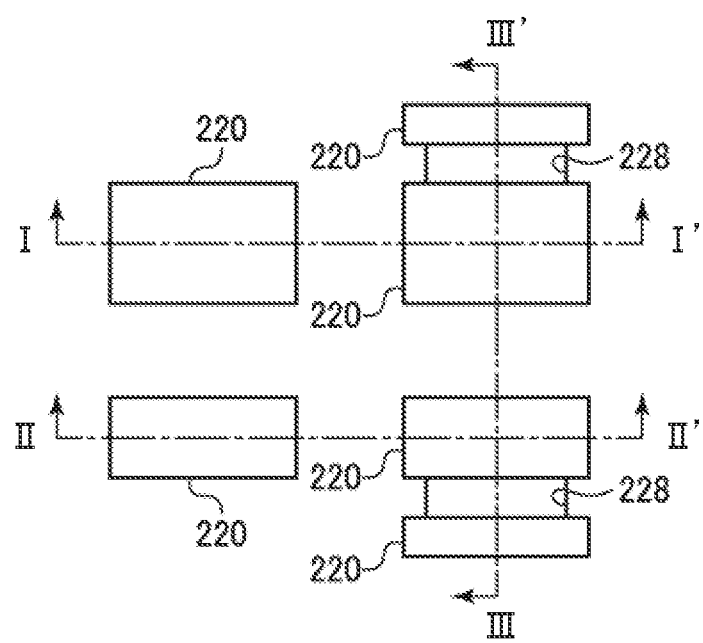
FIG. 23 is a process chart (part 7) illustrating the manufacturing method of the semiconductor device according to the first embodiment.
Figure 24A:
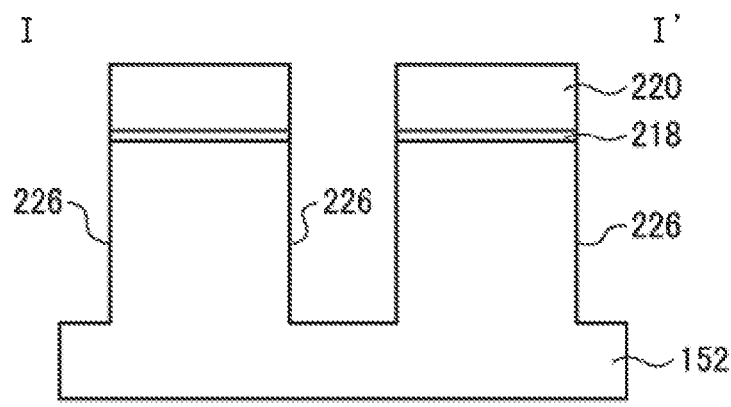
FIGS. 24A, 24B and 24C each are a process chart (part 8) illustrating the manufacturing method of the semiconductor device according to the first embodiment.
Figure 24B:
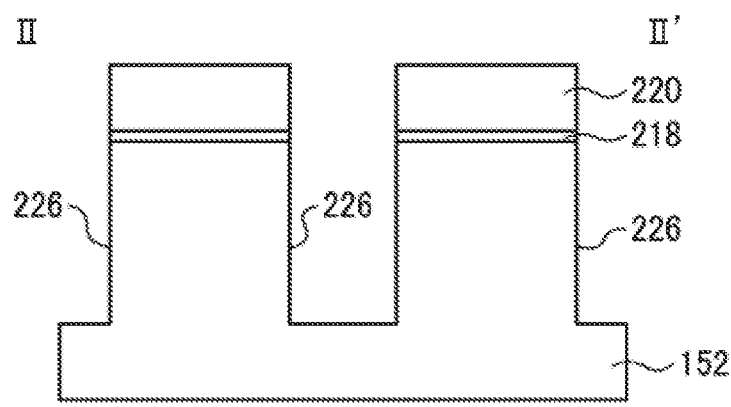
Figure 24C:
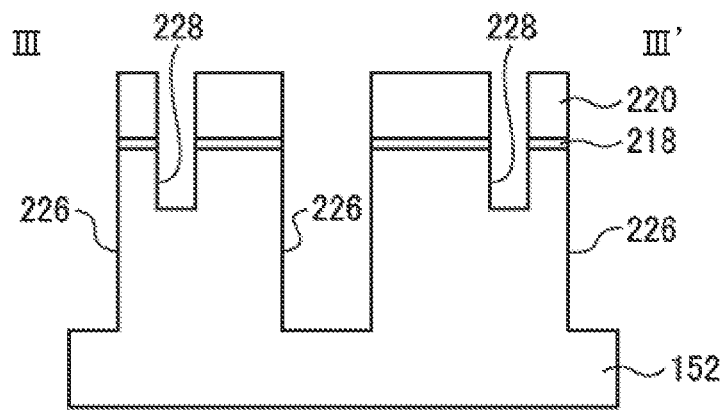

Next, the semiconductor substrate 152 is etched by, for example, the RIE method while using the silicon nitride film 220 as the mask (refer to FIG. 23 and FIG. 24). The etching amount is, for example, approximately 60 nm to 150 nm. A depth of each groove 226 thereby becomes deeper at each portion where the groove 226 is already formed. A depth of each shallow groove 228 is, for example, approximately 60 nm to 150 nm. The depth of each deep groove 226 is, for example, approximately 250 nm to 400 nm.

Next, a silicon oxide film is formed at the whole surface.

Next, the silicon oxide film is polished until a surface of the silicon nitride film 220 is exposed by, for example, the CMP (Chemical Mechanical Polishing) method.

After that, the silicon nitride film 220 and the silicon oxide film 218 are etched to be removed.

The element isolation regions 154, 156 are thereby formed in the grooves 226, 228. The element region (active region) 230 where the PMOS transistor 12 is formed is defined by the element isolation regions 154. Besides, the element region 232 where the P-channel type DTMOS transistor 24 is formed is defined by the element isolation region 154 and the element isolation region 156. Besides, the element region 234 where the NMOS transistor 14 is formed is defined by the element isolation regions 154. Besides, the element region 236 where the N-channel type DTMOS transistor 26 is formed is defined by the element isolation region 154 and the element isolation region 156. Besides, the well tap region 238 to form the contact layer 169 (refer to FIG. 9) is defined by the element isolation region 154 and the element isolation region 156. Besides, the well tap region 240 to form the contact layer 181 (refer to FIG. 9) is defined by the element isolation region 154 and the element isolation region 156. Besides, the well tap regions 160, 164, 172, 176 (refer to FIG. 9) to form the contact layers 161, 165, 173, 177 (refer to FIG. 9) are respectively defined by the element isolation regions 154 (refer to FIG. 25 and FIG. 26).

Next, a photoresist film 242 is formed at the whole surface by, for example, the spin coat method.

Next, the photoresist film 242 is patterned by using the photolithography technique. Opening parts 244 exposing regions where the N-type wells 158, 174 are formed are thereby formed at the photoresist film 242.

Next, an N-type dopant impurity is introduced into the semiconductor substrate 152 by, for example, the ion implanting method while using the photoresist film 242 as the mask. As the N-type dopant impurity, for example, phosphorus (P) is used. An acceleration energy is, for example, 300 keV to 400 keV. A dose amount is, for example, approximately $1.0 \times 10^{13}$ cm$^{-2}$ to $5.0 \times 10^{13}$ cm$^{-2}$. The N-type wells 158, 174 are thereby formed (refer to FIG. 27 and FIG. 28).

Next, the photoresist film 242 is removed by, for example, the ashing.

Next, a photoresist film 246 is formed at the whole surface by, for example, the spin coat method.

Next, the photoresist film 246 is patterned by using the photolithography technique. Opening parts 248 exposing regions where the P-type wells 162, 170 are formed are thereby formed at the photoresist film 246.

Next, a P-type dopant impurity is introduced into the semiconductor substrate 152 by, for example, the ion implanting method while using the photoresist film 246 as the mask. As the P-type dopant impurity, for example, boron (B) is used. The acceleration energy is, for example, 100 keV to 200 keV. The dose amount is, for example, approximately $1.0 \times 10^{13}$ cm$^{-2}$ to $5.0 \times 10^{13}$ cm$^{-2}$. The P-type wells 162, 170 are thereby formed (refer to FIG. 29 and FIG. 30).

Next, the photoresist film 246 is removed by, for example, the ashing.

Next, a photoresist film 250 is formed at the whole surface by, for example, the spin coat method.

Next, the photoresist film 250 is patterned by using the photolithography technique. An opening part 252 exposing a region where the P-type well 178 is formed is thereby formed at the photoresist film 250.

Next, a P-type dopant impurity is introduced into the semiconductor substrate 152 by, for example, the ion implanting method while using the photoresist film 250 as the mask. As the P-type dopant impurity, for example, B is used. The acceleration energy is, for example, 30 keV to 65 keV. The dose amount is, for example, approximately $5.0 \times 10^{12}$ cm$^{-2}$ to $5.0 \times 10^{13}$ cm$^{-2}$. The P-type well (body region) 178 is thereby formed (refer to FIG. 31 and FIG. 32).

Next, the photoresist film 250 is removed by, for example, the ashing.

Next, a photoresist film 254 is formed at the whole surface by, for example, the spin coat method.

Next, the photoresist film 254 is patterned by using the photolithography technique. An opening part 256 exposing a region where the N-type well 166 is formed is thereby formed at the photoresist film 254.

Next, an N-type dopant impurity is introduced into the semiconductor substrate 152 by, for example, the ion implanting method while using the photoresist film 254 as the mask. As the N-type dopant impurity, for example, P is used. The acceleration energy is, for example, 100 keV to 160 keV. The dose amount is, for example, approximately $5.0 \times 10^{12}$ cm$^{-2}$ to $5.0 \times 10^{13}$ cm$^{-2}$. The N-type well (body region) 166 is thereby formed (refer to FIG. 33 and FIG. 34).

Next, the photoresist film 254 is removed by, for example, the ashing.

Next, a photoresist film 258 is formed at the whole surface by, for example, the spin coat method.

Next, the photoresist film 258 is patterned by using the photolithography technique. An opening part 260 exposing the element region 234 where the NMOS transistor 14 is formed, and the opening part 260 exposing the element region 236 where the N-channel type DTMOS transistor 26 is formed are thereby formed at the photoresist film 258.

Next, a P-type dopant impurity is introduced into the semiconductor substrate 152 by, for example, the ion implanting method while using the photoresist film 258 as the mask. As the P-type dopant impurity, for example, indium (In) is used. The acceleration energy is, for example, 50 keV to 100 keV. The dose amount is, for example, approximately $5.0 \times 10^{13}$ cm$^{-2}$ or less. A P-type channel dope layer (channel impurity layer) 262 is thereby formed at the element region 234 where the NMOS transistor 14 is formed. Besides, a P-type channel dope layer 264 is formed at the element region 236 where the N-channel type DTMOS transistor 26 is formed (refer to FIG. 35 and FIG. 36).

Next, the photoresist film 258 is removed by, for example, the ashing.

Next, a photoresist film 266 is formed at the whole surface by, for example, the spin coat method.

Next, the photoresist film 266 is patterned by using the photolithography technique. An opening part 268 exposing the element region 230 where the PMOS transistor 12 is formed and the opening part 268 exposing the element region 232 where the P-channel type DTMOS transistor 24 is formed are thereby formed at the photoresist film 266.

Next, an N-type dopant impurity is introduced into the semiconductor substrate 152 by, for example, the ion implanting method while using the photoresist film 266 as the mask. As the N-type dopant impurity, for example, As is used. The acceleration energy is, for example, 50 keV to 100 keV. The dose amount is, for example, approximately "0"

(zero) cm$^{-2}$ to 1.0×10$^{13}$ cm$^{-2}$ or less. An N-type channel dope layer 270 is thereby formed at the element region 230 where the PMOS transistor 12 is formed. Besides, an N-type channel dope layer 272 is formed at the element region 232 where the P-channel type DTMOS transistor 24 is formed (refer to FIG. 37 and FIG. 38).

Next, the photoresist film 266 is removed by, for example, the asking.

Next, the heat treatment (annealing) to activate the dopant impurities at the channel dope layers 262, 264, 270, 272 is performed. A heat treatment temperature is, for example, at approximately 900° C. to 1000° C. A heat treatment time is, for example, 10 seconds or less. An atmosphere when the heat treatment is performed is, for example, the nitrogen (N$_2$) atmosphere.

The heat treatment may be the spike annealing.

Next, the gate insulating film 182 of a silicon oxide film with a film thickness of, for example, approximately 1 nm to 5 nm is formed at the whole surface by, for example, the thermal oxidation method.

Next, a polysilicon film with a film thickness of, for example, approximately 70 nm to 150 nm is formed at the whole surface by, for example, the CVD method.

Next, the polysilicon film is patterned by using the photolithography technique. The polysilicon gate wiring 274 including the gate electrode 184 and the gate electrode 186 is thereby formed. Besides, the polysilicon gate wiring 276 including the gate electrode 202 and the gate electrode 204 is formed (refer to FIG. 39 and FIG. 40).

Next, a photoresist film 278 is formed at the whole surface by, for example, the spin coat method.

Next, the photoresist film 278 is patterned by using the photolithography technique. An opening part 280 exposing the element region 234 where the NMOS transistor 14 is formed and the opening part 280 exposing the element region 236 where the N-channel type DTMOS transistor 26 is formed are thereby formed at the photoresist film 278.

Next, an N-type dopant impurity is introduced into the semiconductor substrate 152 at both sides of the gate electrodes 186, 204 by, for example, the ion implanting method while using the photoresist film 278 and the gate electrodes 186, 204 as the masks. As the N-type dopant impurity, for example, arsenic (As) is used. The acceleration energy is, for example, approximately 1 keV to 5 keV. The dose amount is, for example, approximately 1.0×10$^{14}$ cm$^{-2}$ to 1.5×10$^{15}$ cm$^{-2}$. The N-type extension regions (low-concentration impurity regions) 196, 212 each forming the shallow region in the extension source/drain structure are thereby formed (refer to FIG. 41 and FIG. 42).

Next, a pocket region (Halo region) (not-illustrated) is formed according to need. When the pocket region is formed, a P-type dopant impurity is obliquely implanted by, for example, the ion implantation method while using the photoresist film 278 and the gate electrodes 186, 204 as the masks.

After this, the photoresist film 278 is removed by, for example, the asking.

Next, a photoresist film 282 is formed at the whole surface by, for example, the spin coat method.

Next, the photoresist film 282 is patterned by using the photolithography technique. An opening part 284 exposing the element region 230 where the PMOS transistor 12 is formed and the opening part 284 exposing the element region 232 where the P-channel type DTMOS transistor 24 is formed are thereby formed at the photoresist film 282.

Next, a P-type dopant impurity is introduced into the semiconductor substrate 152 at both sides of the gate electrodes 184, 202 by, for example, the ion implanting method while using the photoresist film 282 and the gate electrodes 184, 202 as the masks. As the P-type dopant impurity, for example, B is used. The acceleration energy is, for example, approximately 0.2 keV to 1 keV. The dose amount is, for example, approximately 1.0×10$^{14}$ cm$^{-2}$ to 1.5×10$^{15}$ cm$^{-2}$. The p-type extension regions (low-concentration impurity regions) 188, 206 each forming the shallow region in the extension source/drain structure are thereby formed (refer to FIG. 43 and FIG. 44).

Next, a pocket region (not-illustrated) is formed according to need. When the pocket region is formed, an N-type dopant impurity is obliquely implanted by, for example, the ion implanting method while using the photoresist film 282 and the gate electrodes 184, 202 as the masks.

After this, the photoresist film 282 is removed by, for example, the asking.

Next, a silicon oxide film with a film thickness of, for example, approximately 50 nm to 150 nm is formed at the whole surface by, for example, the CVD method. As source gas, for example, TEOS (Tetra Ethyl Ortho Silicate) gas and O$_3$ gas are used. A film-forming temperature is, for example, at approximately 500° C. to 600° C.

Figure 45:
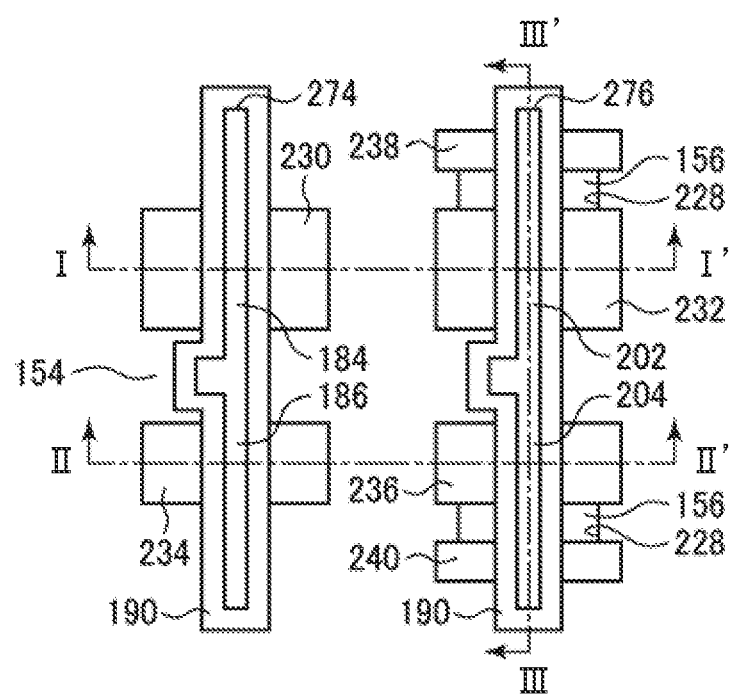
FIG. 45 is a process chart (part 29) illustrating the manufacturing method of the semiconductor device according to the first embodiment.
Figure 46A:
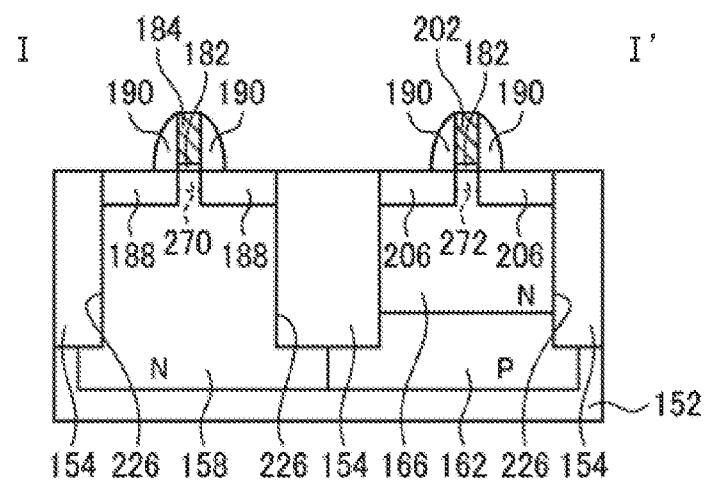
FIGS. 46A, 46B and 46C each are a process chart (part 30) illustrating the manufacturing method of the semiconductor device according to the first embodiment.
Figure 46B:
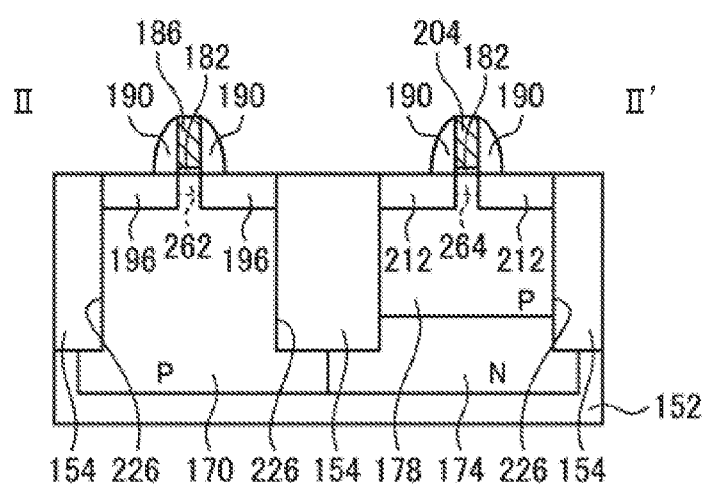
Figure 46C:
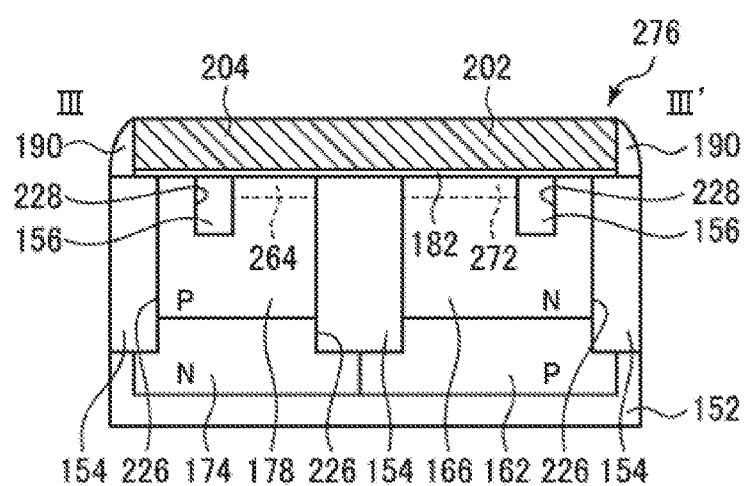
Figure 47:
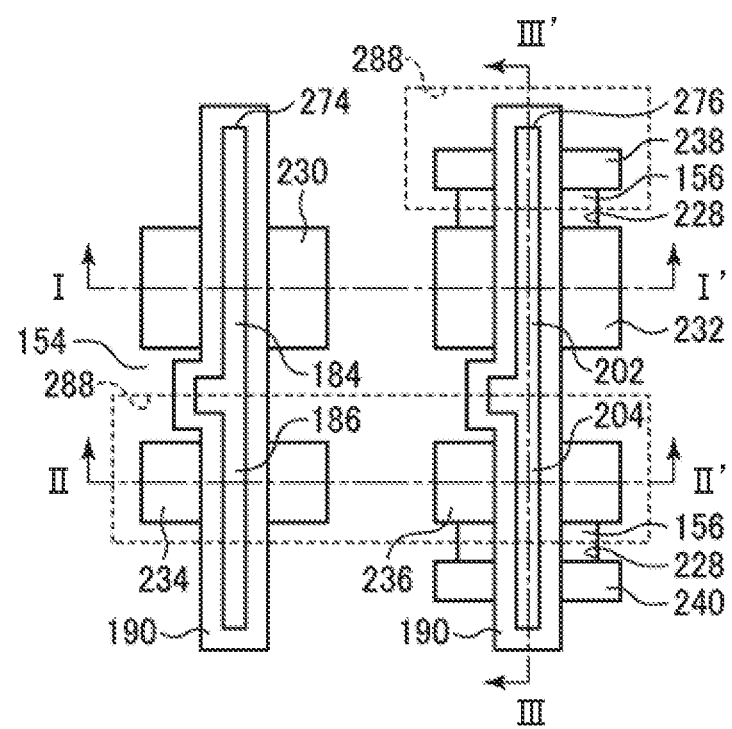
FIG. 47 is a process chart (part 31) illustrating the manufacturing method of the semiconductor device according to the first embodiment.
Figure 48A:
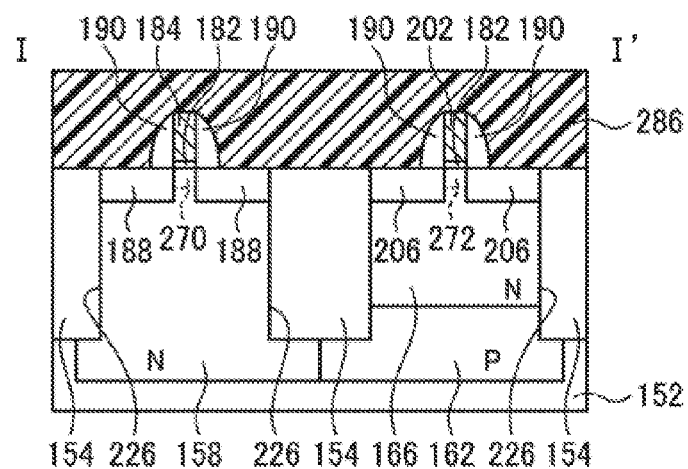
FIGS. 48A, 48B and 48C each are a process chart (part 32) illustrating the manufacturing method of the semiconductor device according to the first embodiment.
Figure 48B:
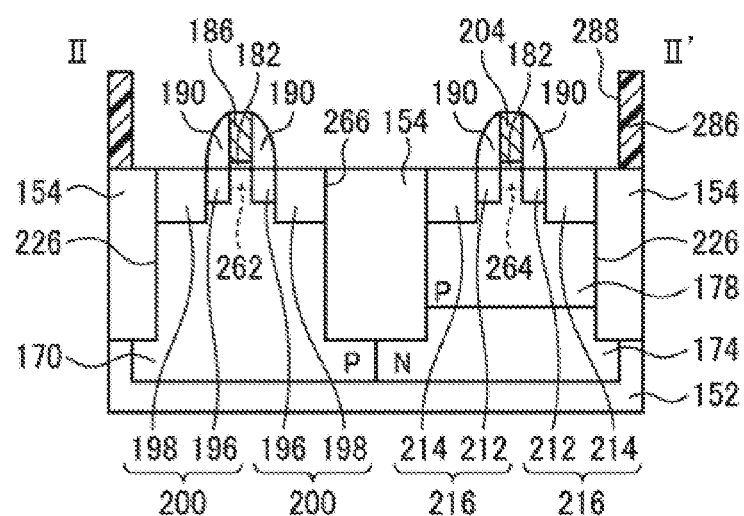
Figure 48C:
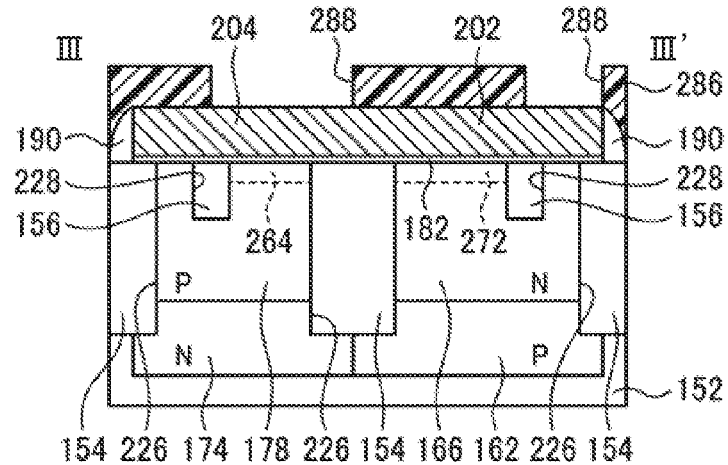
Figure 49:
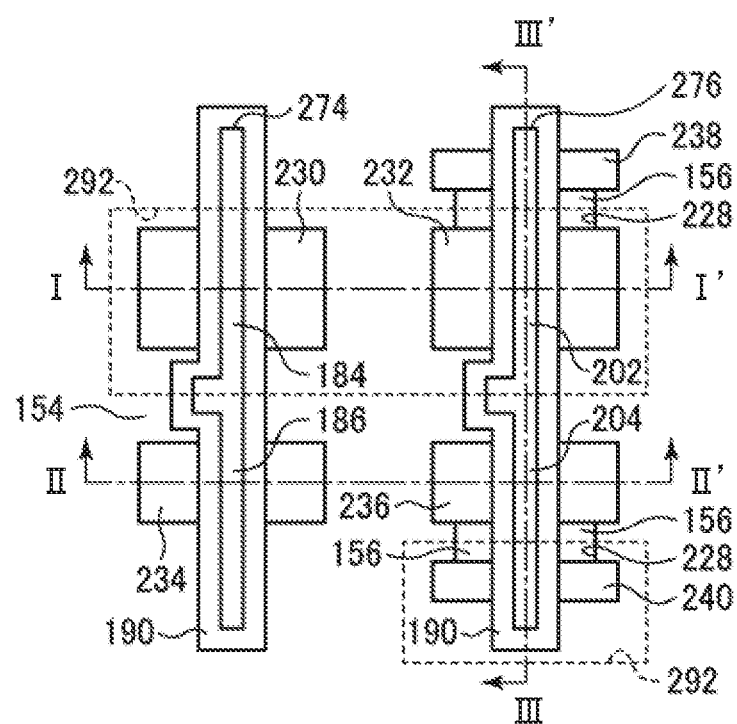
FIG. 49 is a process chart (part 33) illustrating the manufacturing method of the semiconductor device according to the first embodiment.
Figure 50A:
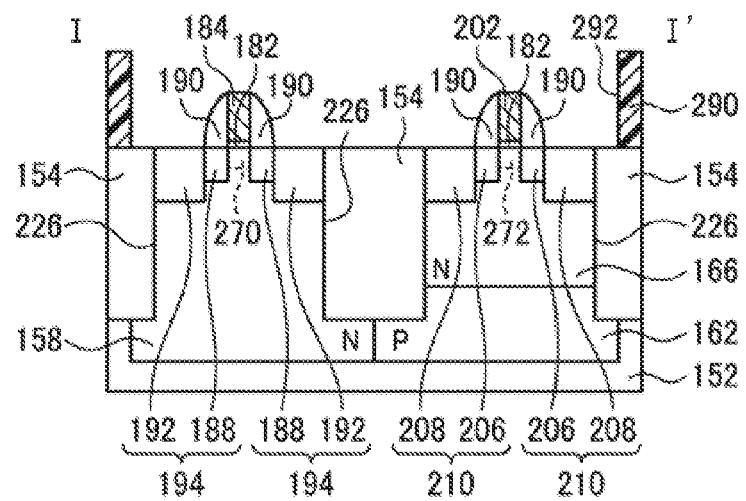
FIGS. 50A, 50B and 50C each are a process chart (part 34) illustrating the manufacturing method of the semiconductor device according to the first embodiment.
Figure 50B:
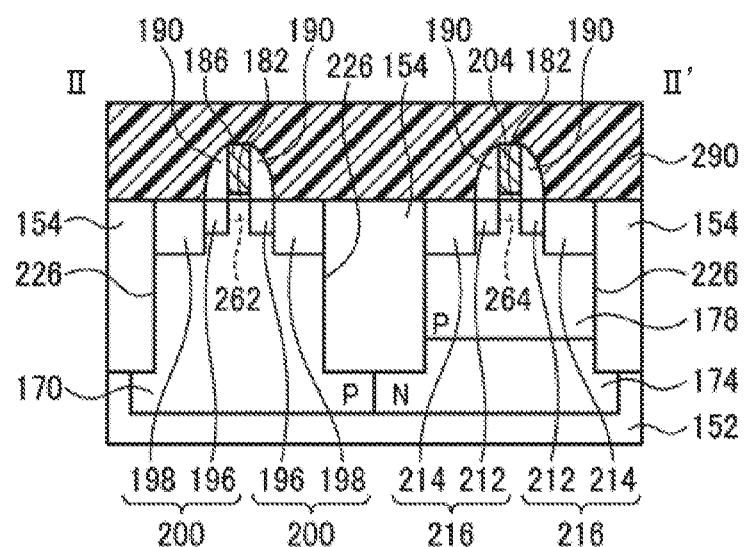
Figure 50C:
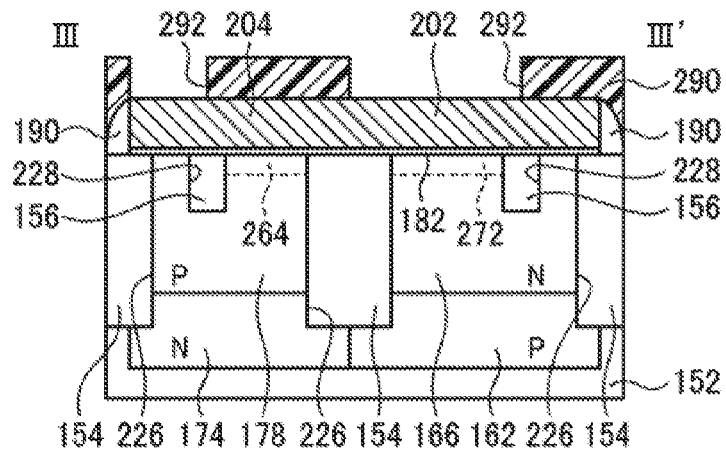

Next, the sidewall spacer 190 of a silicon oxide film is formed at each of the sidewall parts of the gate electrodes 184, 186, 202, 204 by performing anisotropic etching of the silicon oxide film (refer to FIG. 45 and FIG. 46). A thickness of the sidewall spacer 190 is approximately 40 nm to 100 nm.

Next, a photoresist film 286 is formed at the whole surface by, for example, the spin coat method.

Next, the photoresist film 286 is patterned by using the photolithography technique. An opening part 288 exposing the element region 234 where the NMOS transistor 14 is formed and the element region 236 where the N-channel type DTMOS transistor 26 is formed is thereby formed at the photoresist film 286. Besides, the opening part 288 exposing the well tap region 238 is formed at the photoresist film 286.

Next, an N-type dopant impurity is introduced into the semiconductor substrate 152 at both sides of the gate electrodes 186, 204 by, for example, the ion implanting method while using the gate electrodes 186, 204 where the sidewall spacers 190 are formed and the photoresist film 286 as the masks. As the N-type dopant impurity, for example, P is used. The acceleration energy is, for example, approximately 5 keV to 10 keV. The dose amount is, for example, approximately 3.0×10$^{15}$ cm$^{-2}$ to 1.5×$^{16}$ cm$^{-2}$. The N-type high-concentration impurity regions 198, 214 each forming the deep region in the extension source/drain structure are thereby formed. The source/drain regions 200 of the NMOS transistor 14 are each formed by the N-type low-concentration impurity region 196 and the N-type high-concentration impurity region 198. The source/drain regions 216 of the N-channel type DTMOS transistor 26 are each formed by the N-type low-concentration impurity region 212 and the N-type high-concentration impurity region 214. Besides, the N-type contact layer 169 is formed at the well tap region 238 (refer to FIG. 47 and FIG. 48).

After this, the photoresist film 286 is removed by, for example, the asking.

Next, a photoresist film 290 is formed by, for example, the spin coat method.

Next, the photoresist film 290 is patterned by using the photolithography technique. An opening part 292 exposing the element region 230 where the PMOS transistor 12 is formed and the element region 232 where the P-channel type DTMOS transistor 24 is formed is thereby formed at the photoresist film 290. Besides, the opening part 292 exposing the well tap region 240 is formed at the photoresist film 290.

Next, a P-type dopant impurity is introduced into the semiconductor substrate 152 at both sides of the gate electrodes 184, 202 by, for example, the ion implanting method while using the gate electrodes 184, 202 where the sidewall spacers 190 are each formed and the photoresist film 290 as the masks. As the P-type dopant impurity, for example, B is used. The acceleration energy is, for example, approximately 2 keV to 6 keV. The dose amount is, for example, approximately $3.0 \times 10^{15}$ cm$^{-2}$ to $1.5 \times 10^{16}$ cm$^{-2}$. The P-type high-concentration impurity regions 192, 208 each forming the deep region in the extension source/drain structure are thereby formed. The source/drain regions 194 of the PMOS transistor 12 are each formed by the P-type low-concentration impurity region 188 and the P-type high-concentration impurity region 192. The source/drain regions 210 of the P-channel type DTMOS transistor 24 are each formed by the P-type low-concentration impurity region 206 and the P-type high-concentration impurity region 208. Besides, the P-type contact layer 181 is formed at the well tap region 240 (refer to FIG. 49 and FIG. 50).

After this, the photoresist film 290 is removed by, for example, the asking.

Next, the heat treatment (annealing) to activate the dopant impurities is performed. The heat treatment temperature is, for example, at approximately 950° C. to 1050° C. The heat treatment method is, for example, the spike annealing. The atmosphere when the heat treatment is performed is the nitrogen atmosphere.

Next, an interlayer insulating film 294 of a silicon oxide film with a film thickness of, for example, approximately 200 nm to 400 nm is formed at the whole surface by, for example, the CVD method.

Next, opening parts (contact holes) 296a each reaching the source/drain regions 194, 200, 210 216 are formed at the interlayer insulating film 294. Besides, the opening parts 296b each reaching the gate wirings 274, 276 are formed at the interlayer insulating film 294. Besides, opening parts (not-illustrated) each reaching the well tap regions 160, 164, 172, 176 are formed at the interlayer insulating film 294. Besides, an opening part 296c integrally exposing the gate electrode 202 and the well tap region 238, namely, the opening part 296c for the shared contact is formed at the interlayer insulating film 294. Besides, the opening part 296c integrally exposing the gate electrode 204 and the well tap region 240, namely, the opening part 296c for shared contact is formed at the interlayer insulating film 294.

Next, a TiN barrier metal film with a film thickness of, for example, approximately 5 nm to 20 nm is formed at the whole surface by, for example, the sputtering method.

Next, a tungsten film with a film thickness of, for example, approximately 150 nm to 300 nm is formed at the whole surface by, for example, the CVD method.

Next, the tungsten film and the barrier metal film are polished until a surface of the interlayer insulating film 294 is exposed by, for example, the CMP method. Tungsten conductive plugs (electric conductors) 298a to 298c are thereby embedded in the opening parts 296a to 296c.

Next, an interlayer insulating film 300 of a silicon oxide film to which carbon is added with a film thickness of, for example, approximately 350 nm to 500 nm is formed at the whole surface by, for example, the CVD method.

Next, grooves 304 to embed wirings 302a to 302d are formed at the interlayer insulating film 300 by using the photolithography technique. Upper parts of the conductive plugs 296a to 296c are thereby exposed in the grooves 304.

Next, a Ta barrier metal film (not-illustrated) with a film thickness of, for example, approximately 2 nm to 5 nm is formed at the whole surface by, for example, the sputtering method.

Next, a copper (Cu) seed layer (not-illustrated) with a film thickness of, for example, approximately 3 nm to 7 nm is formed at the whole surface by, for example, the sputtering method.

Next, a Cu film with a film thickness of, for example, approximately 800 nm to 1 μm is formed at the whole surface by, for example, the electrolytic plating method.

Next, the Cu film and the barrier metal film are polished until a surface of the interlayer insulating film 300 is exposed by, for example, the CMP method. The Cu wiring (power supply line) 302a which is electrically connected to the power supply potential VDD is thereby embedded in the interlayer insulating film 300. Besides, the Cu wiring (power supply line) 302b which is electrically connected to the ground potential VSS is embedded in the interlayer insulating film 300. Besides, the Cu wiring (signal line) 302c is embedded in the interlayer insulating film 300. Besides, the Cu electric conductor 302d is formed also on the electric conductor 298c connecting between the gate electrode 202 and the well tap region 238. Besides, the Cu electric conductor 302d is formed also on the electric conductor 298c connecting between the gate electrode 204 and the well tap region 240 (refer to FIG. 51 and FIG. 52).

The semiconductor device according to the present embodiment is thereby manufactured.

[Second Embodiment]

A semiconductor device and a manufacturing method thereof according to a second embodiment are described by using FIG. 53 to FIG. 80. The same reference numerals and symbols are used to designate the same components as the semiconductor device and the manufacturing method thereof according to the first embodiment illustrated in FIG. 1 to FIG. 52, and the description thereof will not be given or will be simplified.

In the semiconductor device according to the present embodiment, the NMOS transistor 14 and the P-channel type DTMOS transistor 24 are adjacently disposed, and the PMOS transistor 12 and the N-channel type DTMOS transistor 26 are adjacently disposed.

Figure 53:
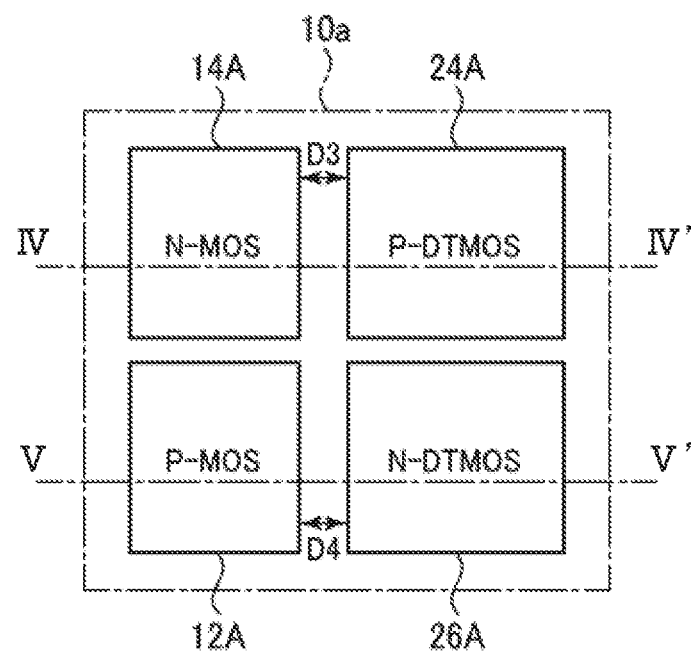
FIG. 53 is a plan view illustrating an example of a layout of a transistor in a logic cell of a semiconductor device according to a second embodiment.

FIG. 53 is a plan view illustrating a layout example of a transistor in a logic cell of the semiconductor device according to the present embodiment.

As illustrated in FIG. 53, the region 14A where the NMOS transistor is formed and the region 12A where the PMOS transistor is formed are adjacently disposed in a longitudinal direction of the drawing in FIG. 53.

The region 24A where the P-channel type DTMOS transistor is formed and the region 26A where the N-channel type DTMOS transistor is formed are adjacently disposed in the longitudinal direction of the drawing in FIG. 53.

The region 14A where the NMOS transistor is formed and the region 24A where the P-channel type DTMOS transistor is formed are adjacently disposed in a horizontal direction of the drawing in FIG. 53.

The region 12A where the PMOS transistor is formed and the region 26A where the N-channel type DTMOS transistor is formed are adjacently disposed in the horizontal direction of the drawing in FIG. 53.

Figure 54A:
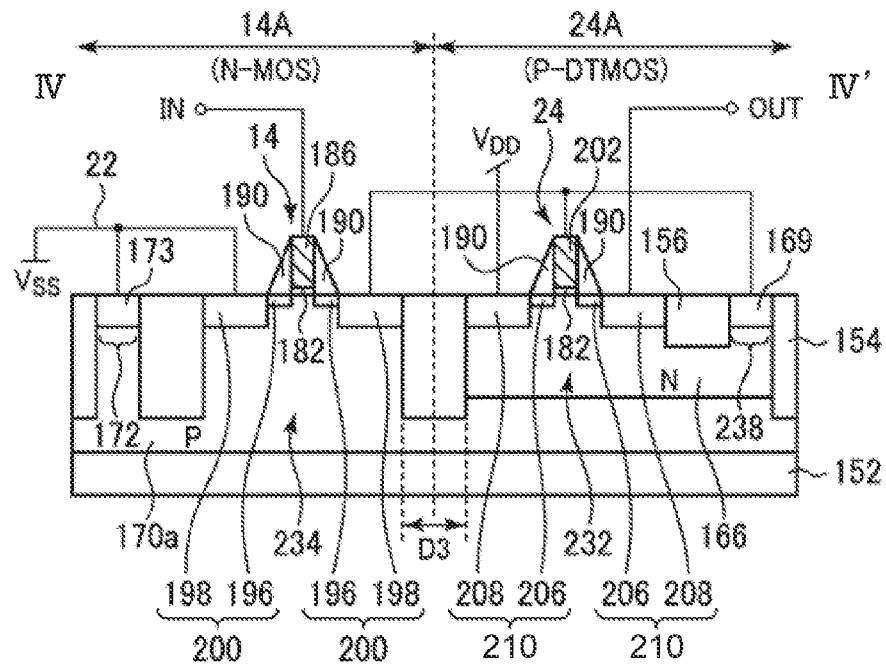
FIGS. 54A and 54B each are a sectional view illustrating a part of the semiconductor device according to the second embodiment.
Figure 54B:
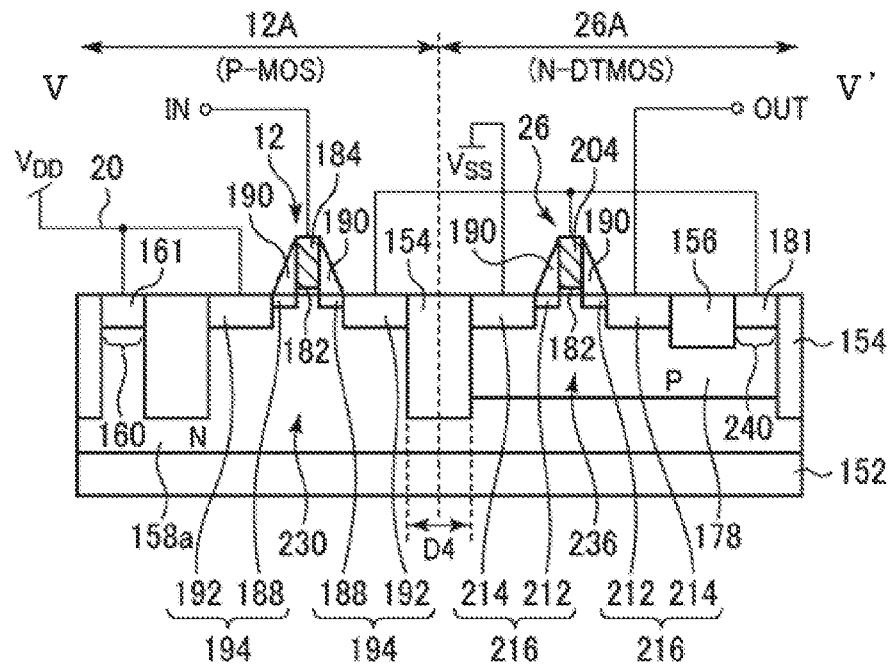
Figure 55:
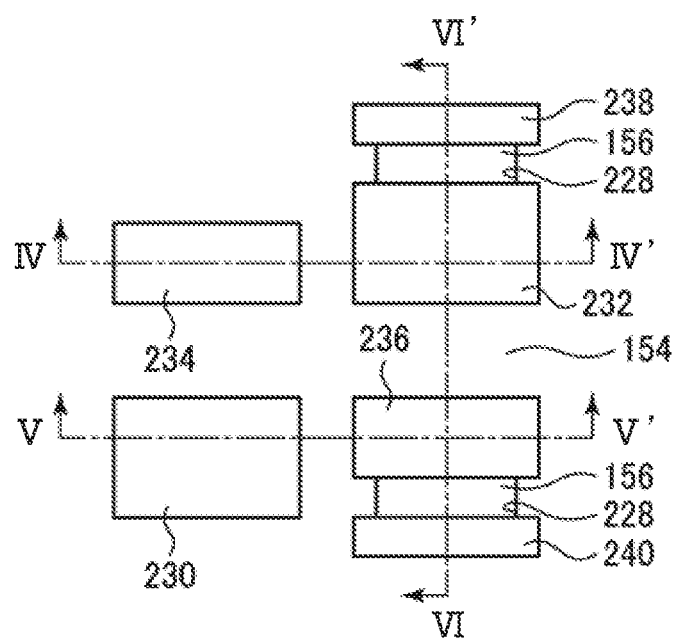
FIG. 55 is a process chart (part 1) illustrating a manufacturing method of the semiconductor device according to the second embodiment.
Figure 56A:
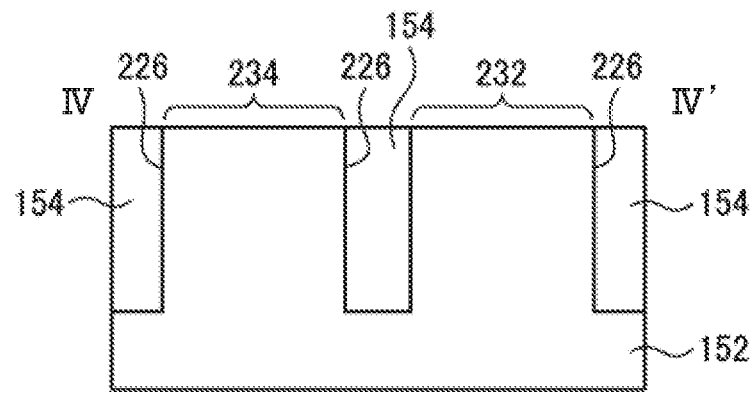
FIGS. 56A, 56B and 56C each are a process chart (part 2) illustrating the manufacturing method of the semiconductor device according to the second embodiment.
Figure 56B:
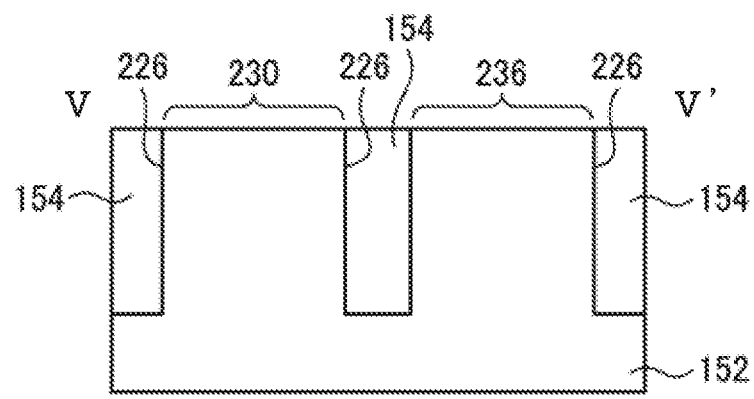
Figure 56C:
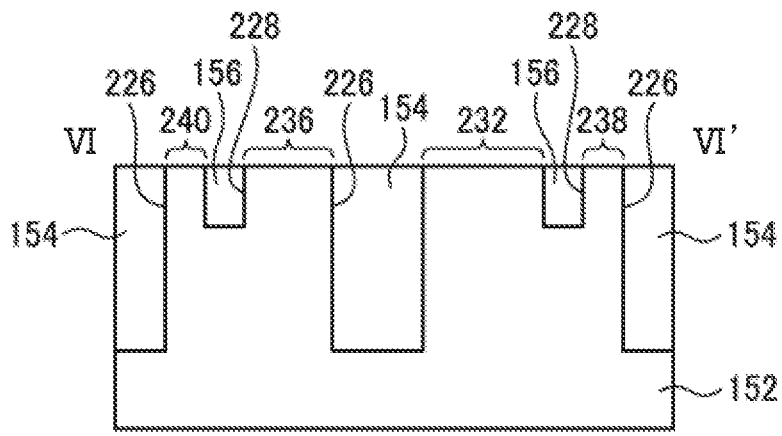
Figure 57:
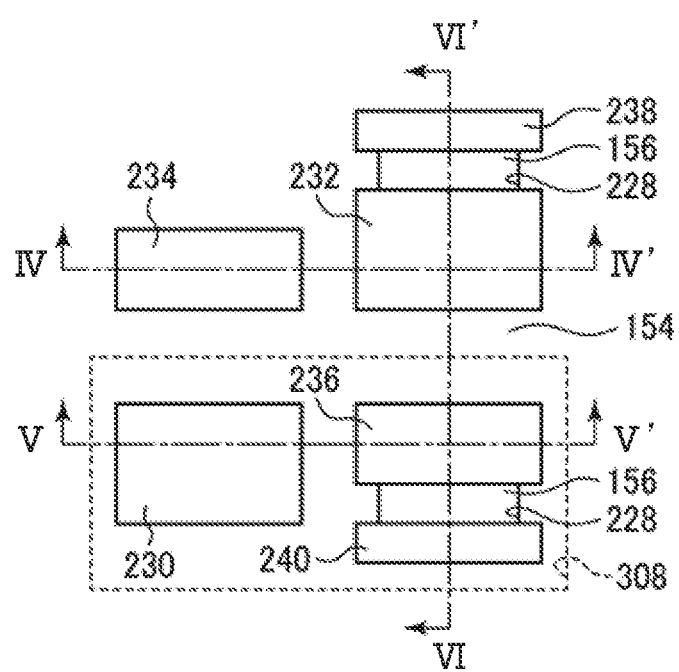
FIG. 57 is a process chart (part 3) illustrating the manufacturing method of the semiconductor device according to the second embodiment.
Figure 58A:
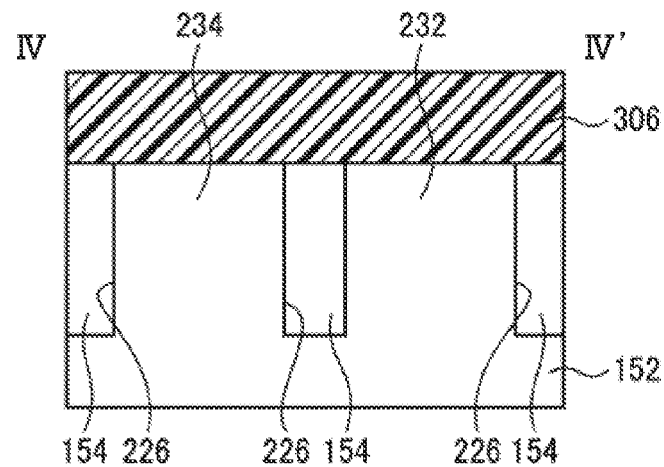
FIGS. 58A, 58B and 58C each are a process chart (part 4) illustrating the manufacturing method of the semiconductor device according to the second embodiment.
Figure 58B:
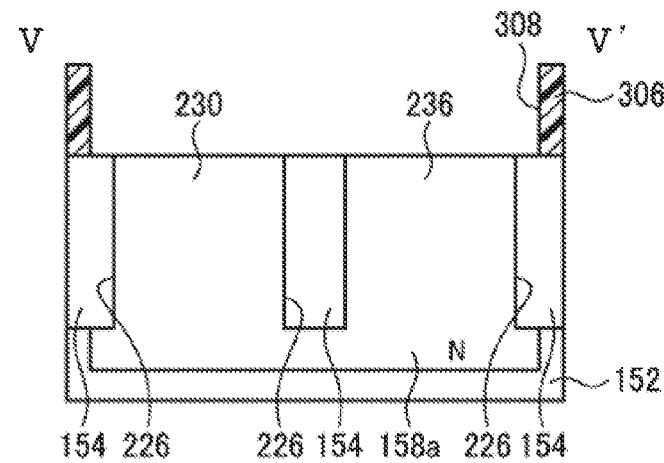
Figure 58C:
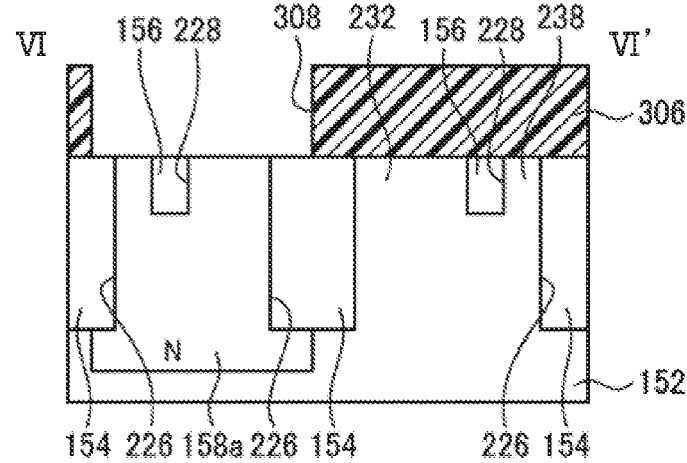
Figure 59:
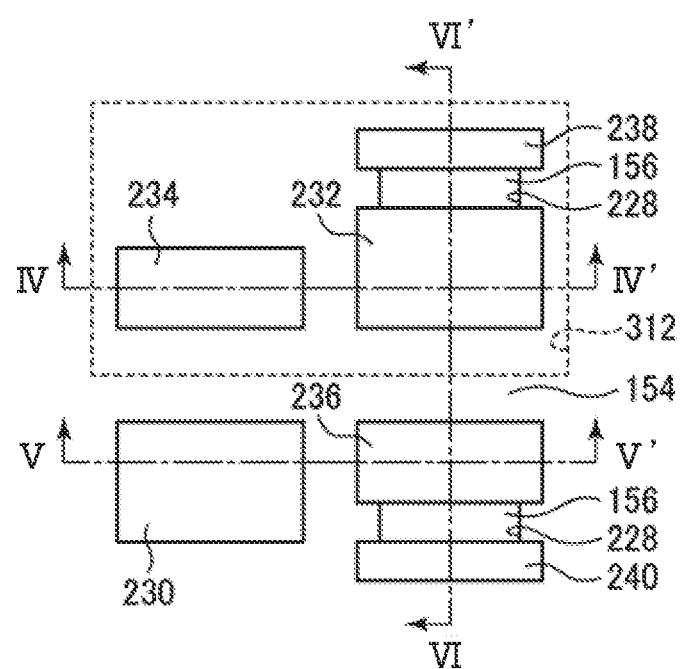
FIG. 59 is a process chart (part 5) illustrating the manufacturing method of the semiconductor device according to the second embodiment.
Figure 60A:
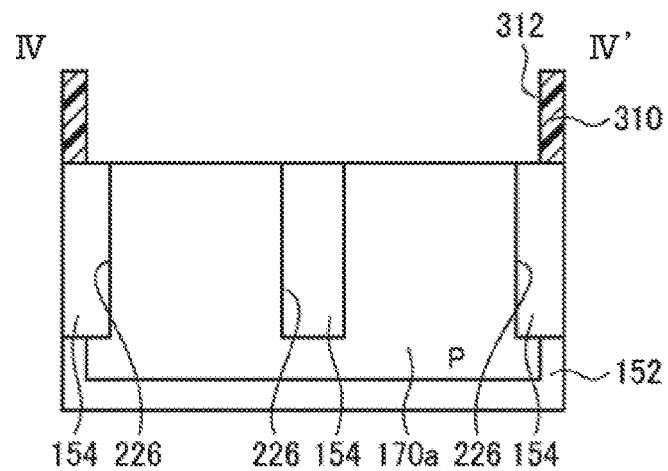
FIGS. 60A, 60B and 60C each are a process chart (part 6) illustrating the manufacturing method of the semiconductor device according to the second embodiment.
Figure 60B:
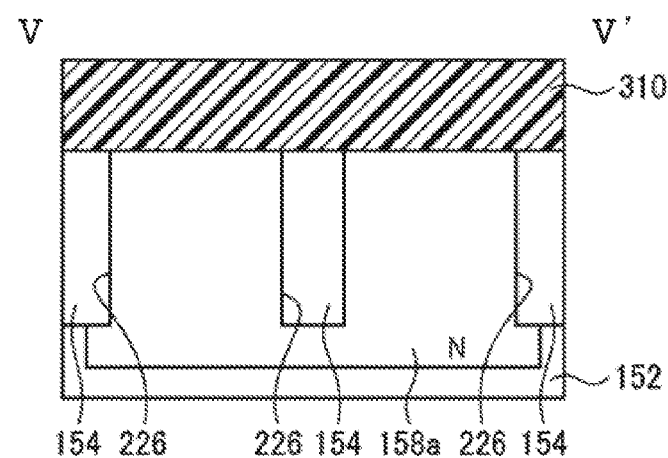
Figure 60C:
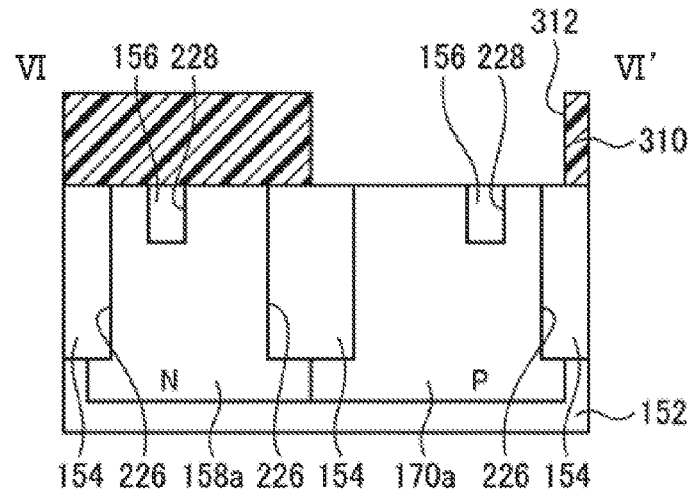
Figure 61:
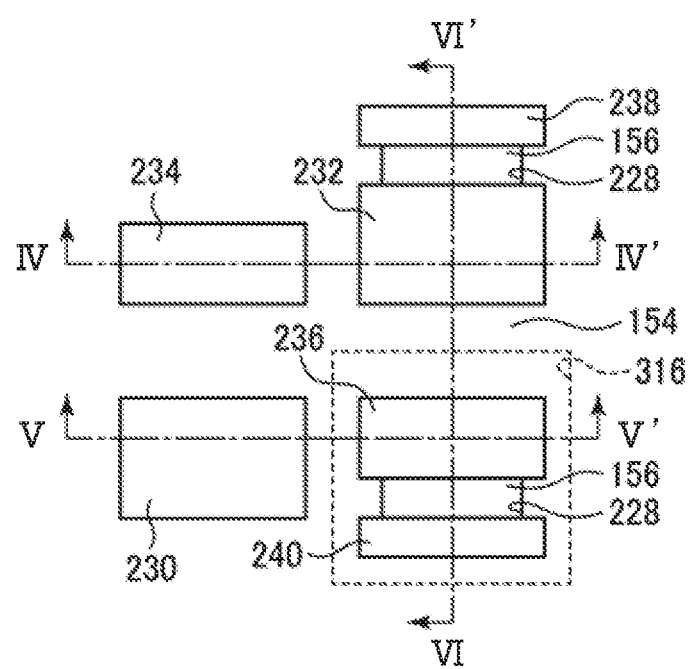
FIG. 61 is a process chart (part 7) illustrating the manufacturing method of the semiconductor device according to the second embodiment.
Figure 62A:
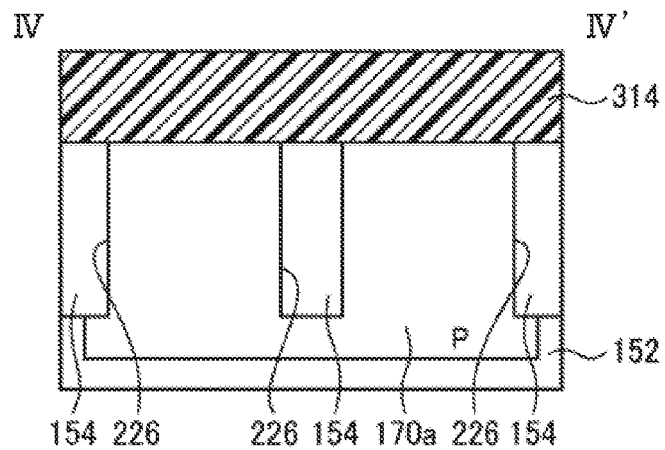
FIGS. 62A, 62B and 62C each are a process chart (part 8) illustrating the manufacturing method of the semiconductor device according to the second embodiment.
Figure 62B:
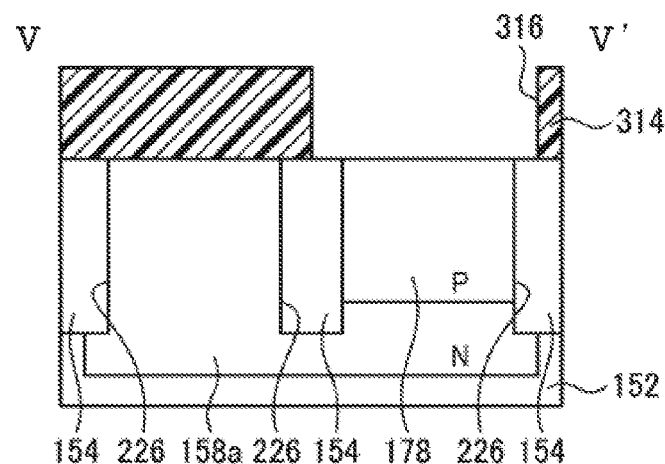
Figure 62C:
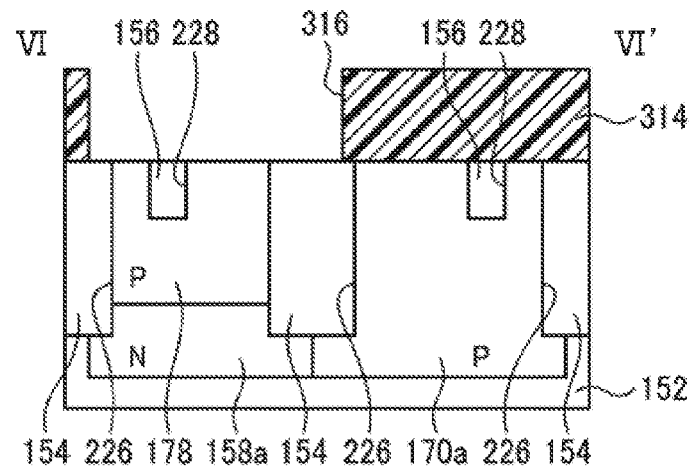
Figure 63:
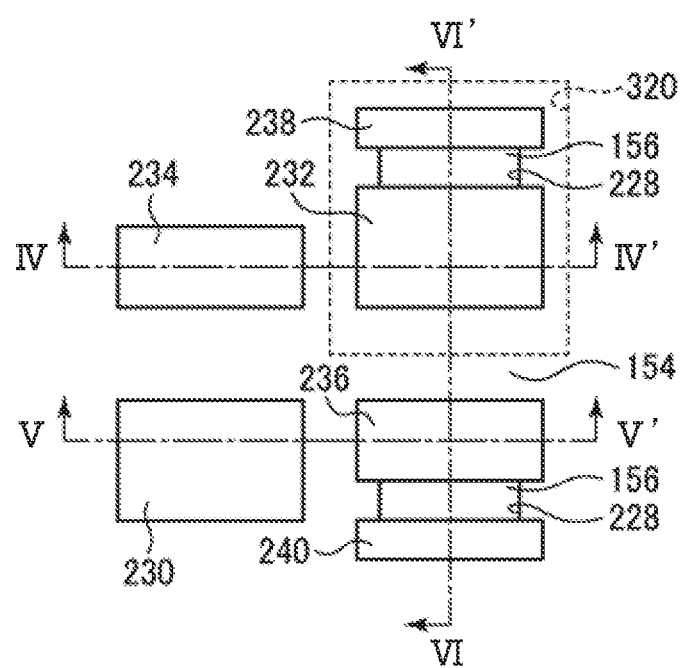
FIG. 63 is a process chart (part 9) illustrating the manufacturing method of the semiconductor device according to the second embodiment.
Figure 64A:
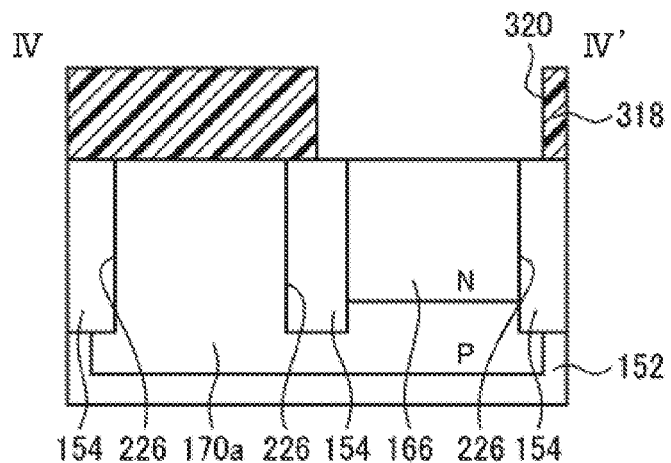
FIGS. 64A, 64B and 64C each are a process chart (part 10) illustrating the manufacturing method of the semiconductor device according to the second embodiment.
Figure 64B:
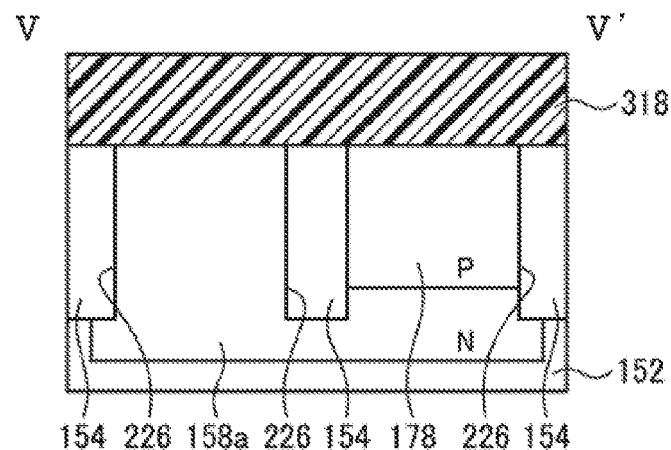
Figure 64C:
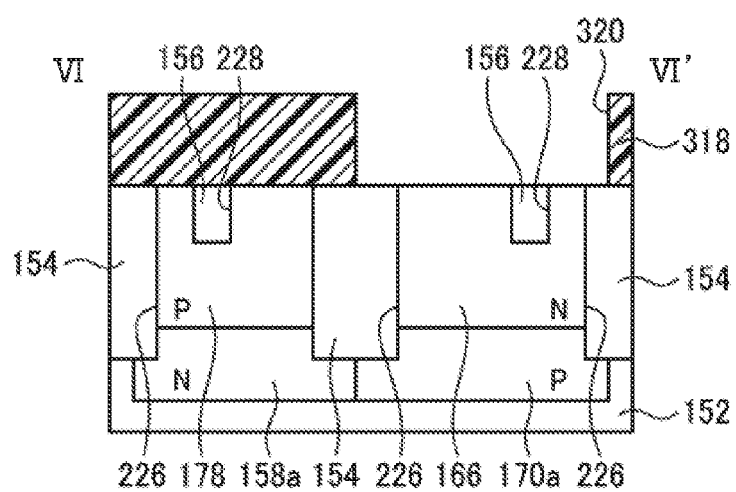
Figure 65:
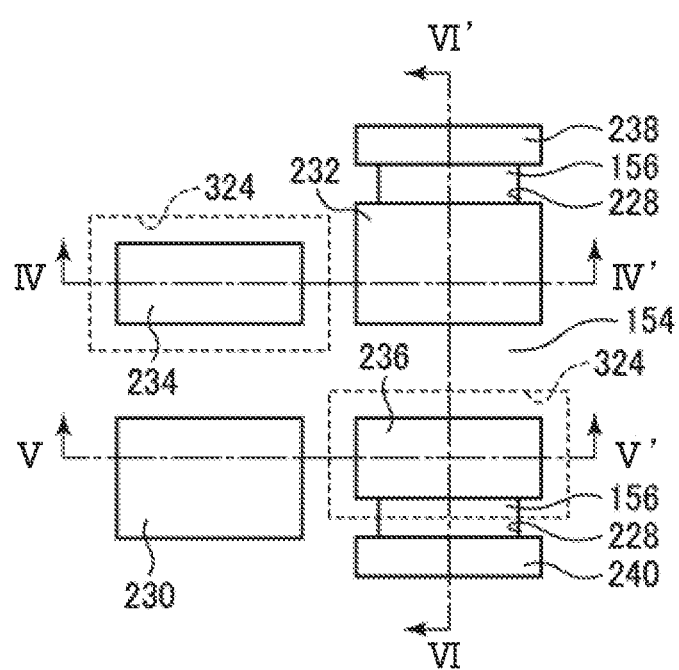
FIG. 65 is a process chart (part 11) illustrating the manufacturing method of the semiconductor device according to the second embodiment.
Figure 66A:
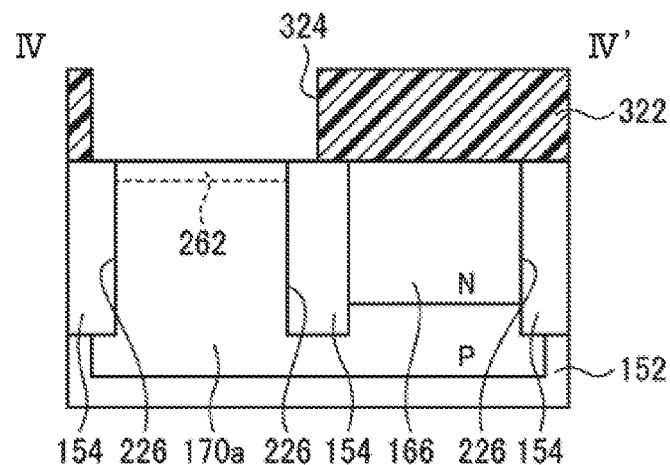
FIGS. 66A, 66B and 66C each are a process chart (part 12) illustrating the manufacturing method of the semiconductor device according to the second embodiment.
Figure 66B:
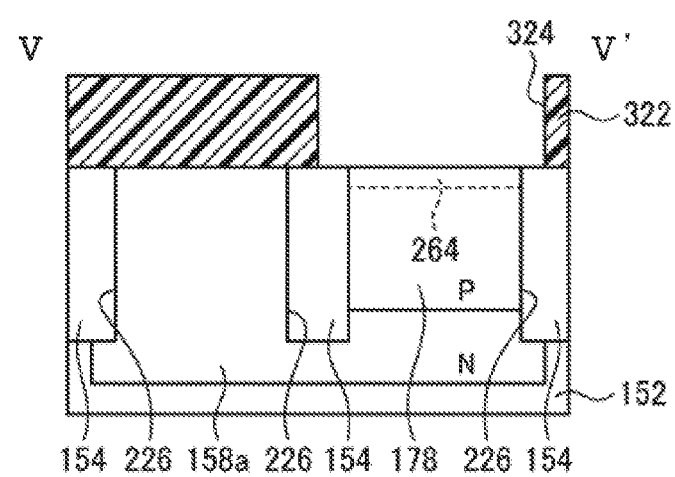
Figure 66C:
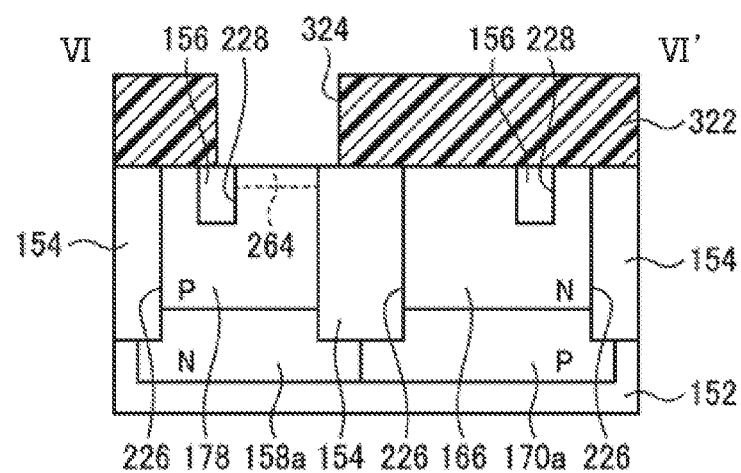
Figure 67:
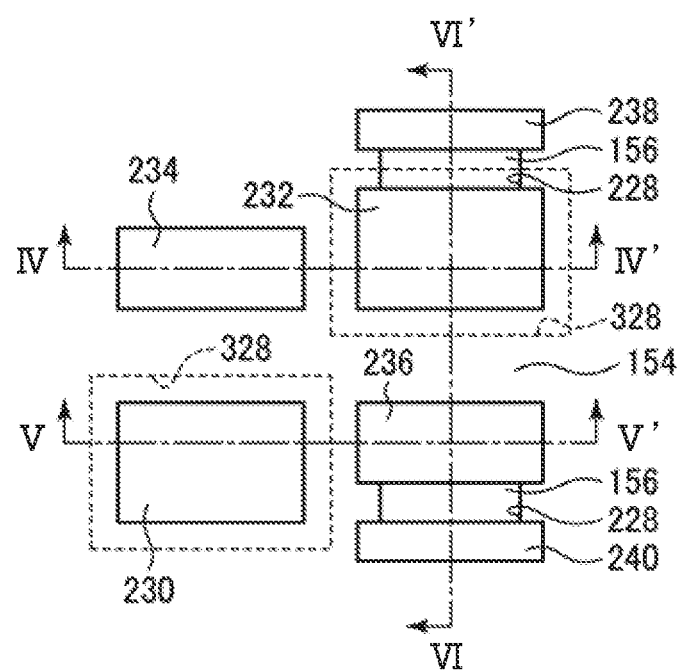
FIG. 67 is a process chart (part 13) illustrating the manufacturing method of the semiconductor device according to the second embodiment.
Figure 68A:
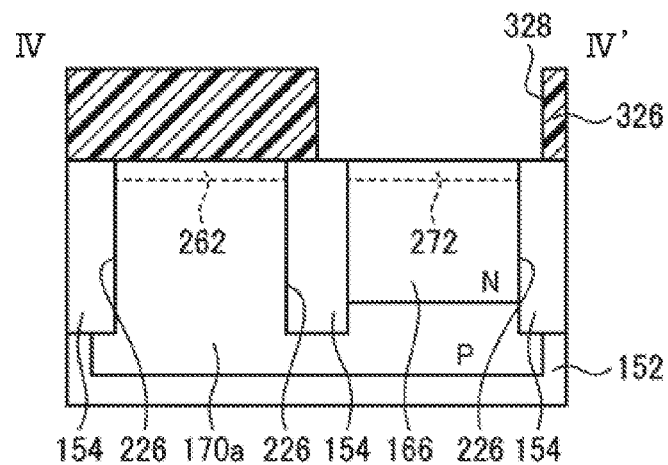
FIGS. 68A, 68B and 68C each are a process chart (part 14) illustrating the manufacturing method of the semiconductor device according to the second embodiment.
Figure 68B:
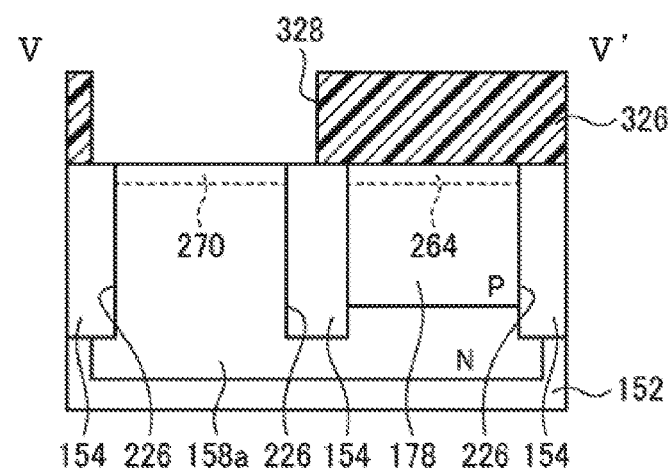
Figure 68C:
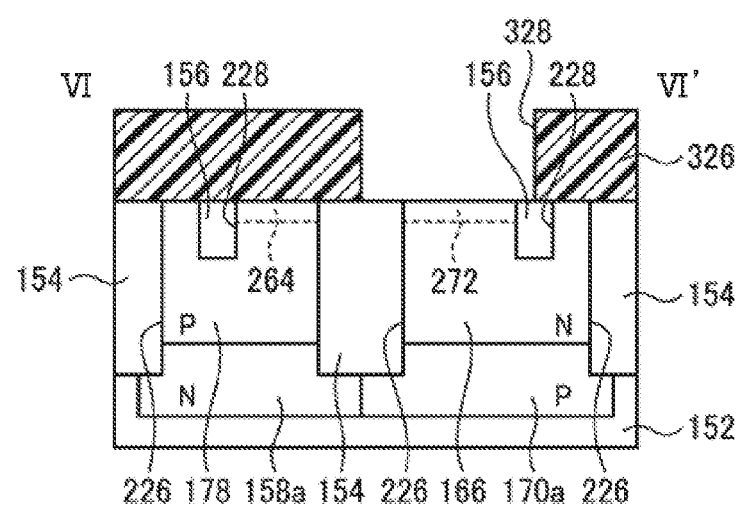
Figure 69:
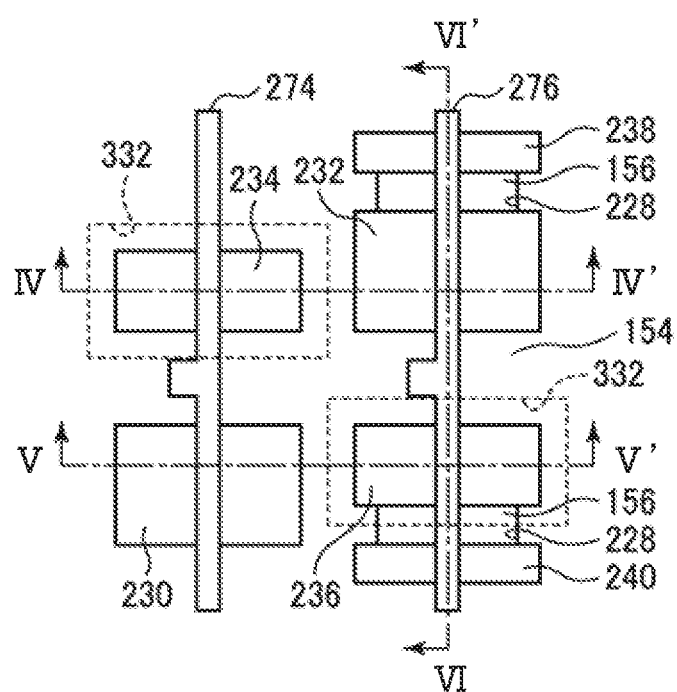
FIG. 69 is a process chart (part 15) illustrating the manufacturing method of the semiconductor device according to the second embodiment.
Figure 70A:
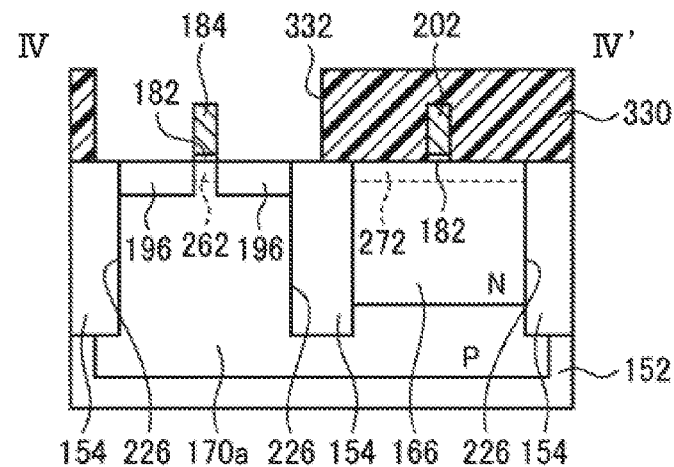
FIGS. 70A, 70B and 70C each are a process chart (part 16) illustrating the manufacturing method of the semiconductor device according to the second embodiment.
Figure 70B:
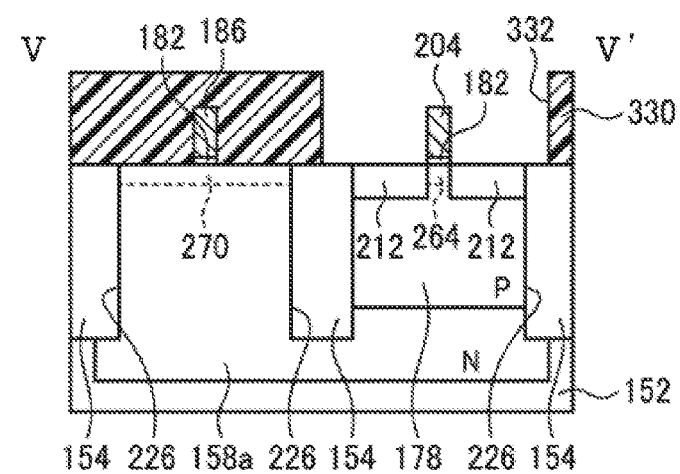
Figure 70C:
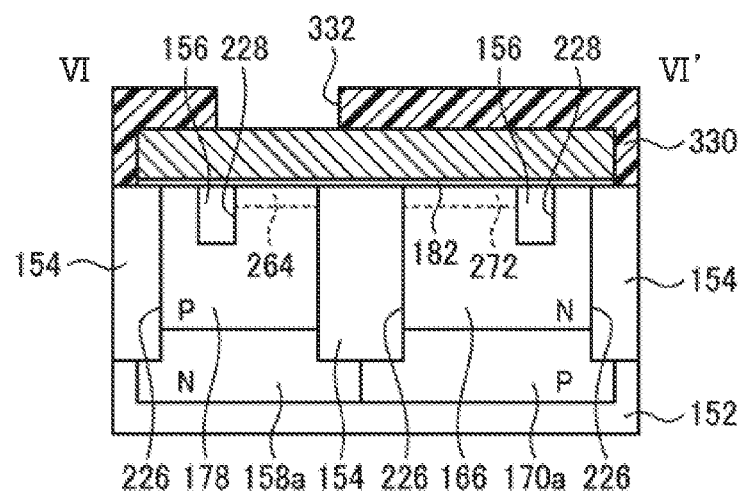
Figure 71:
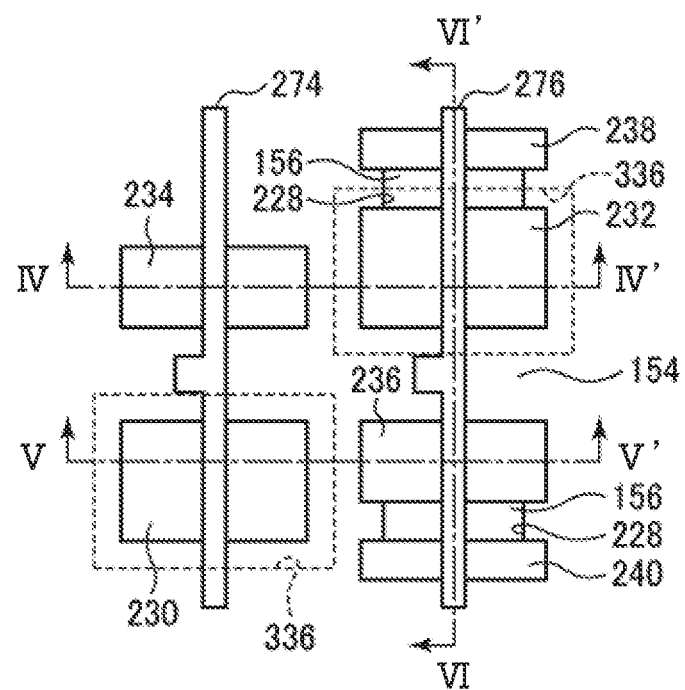
FIG. 71 is a process chart (part 17) illustrating the manufacturing method of the semiconductor device according to the second embodiment.
Figure 72A:
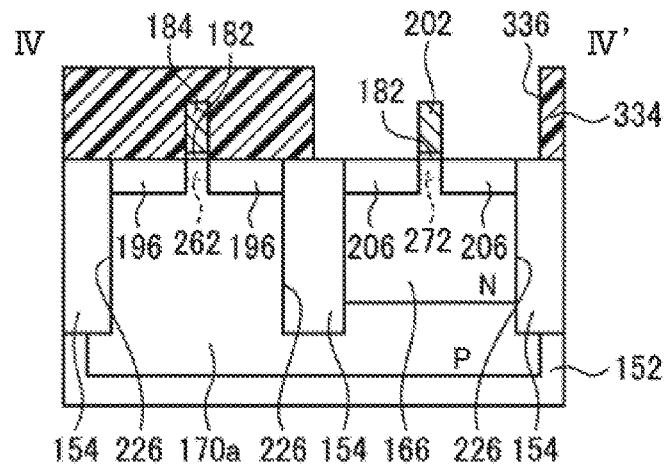
FIGS. 72A, 72B and 72C each are a process chart (part 18) illustrating the manufacturing method of the semiconductor device according to the second embodiment.
Figure 72B:
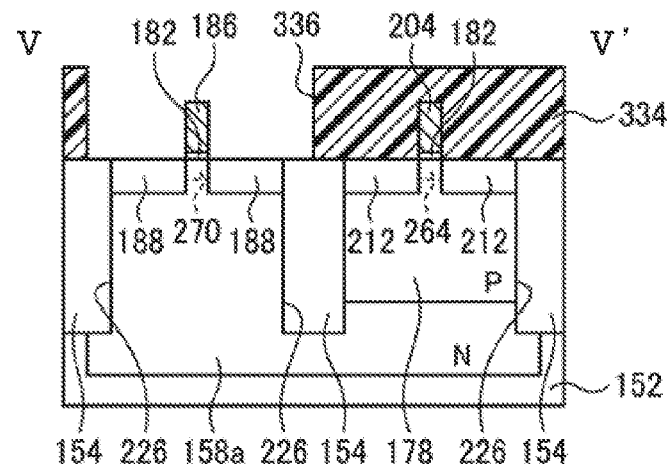
Figure 72C:
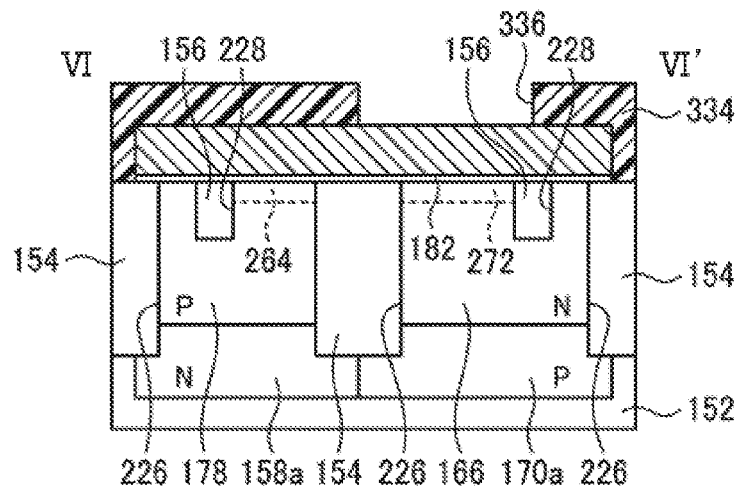
Figure 73:
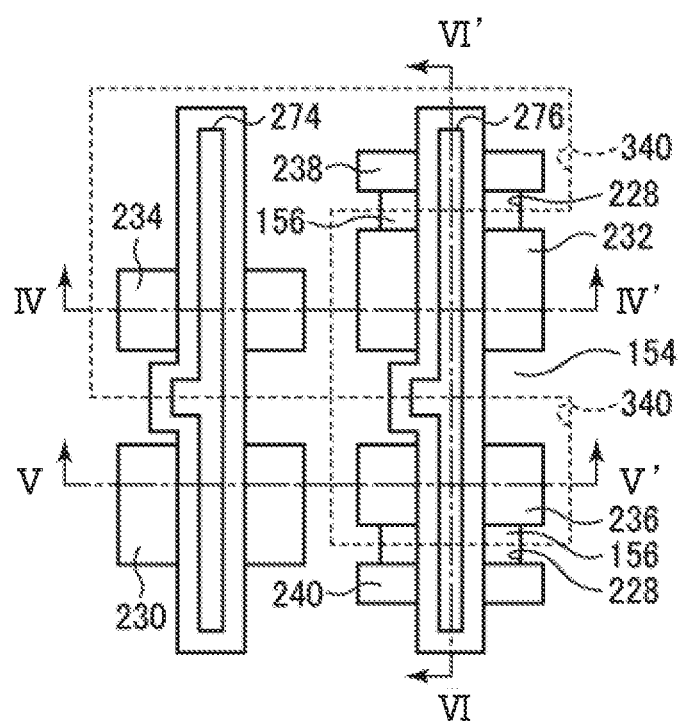
FIG. 73 is a process chart (part 19) illustrating the manufacturing method of the semiconductor device according to the second embodiment.
Figure 74A:
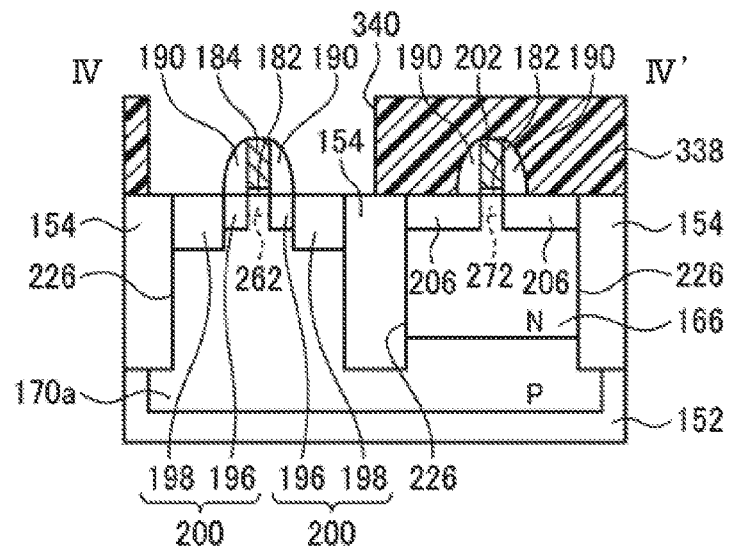
FIGS. 74A, 74B and 74C each are a process chart (part 20) illustrating the manufacturing method of the semiconductor device according to the second embodiment.
Figure 74B:
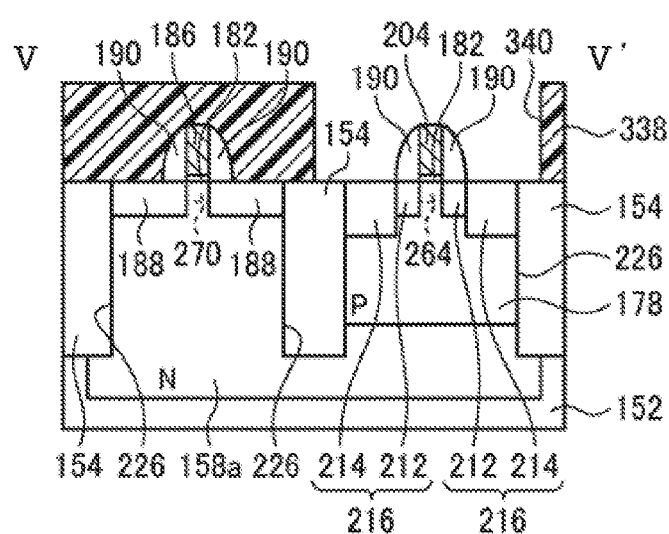
Figure 74C:
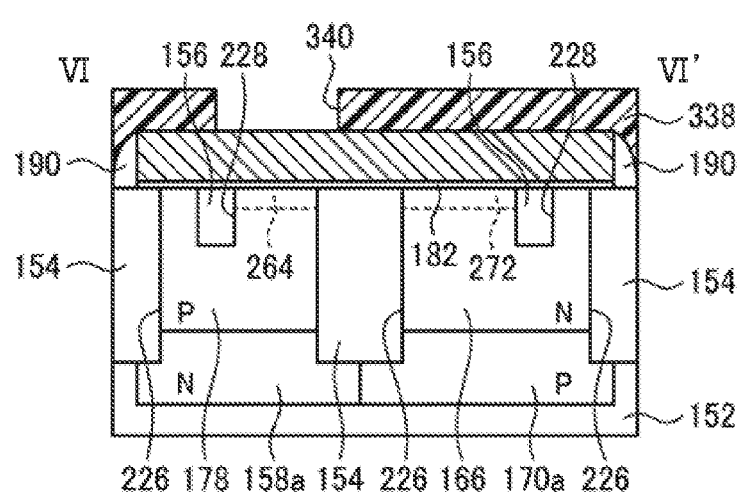
Figure 75:
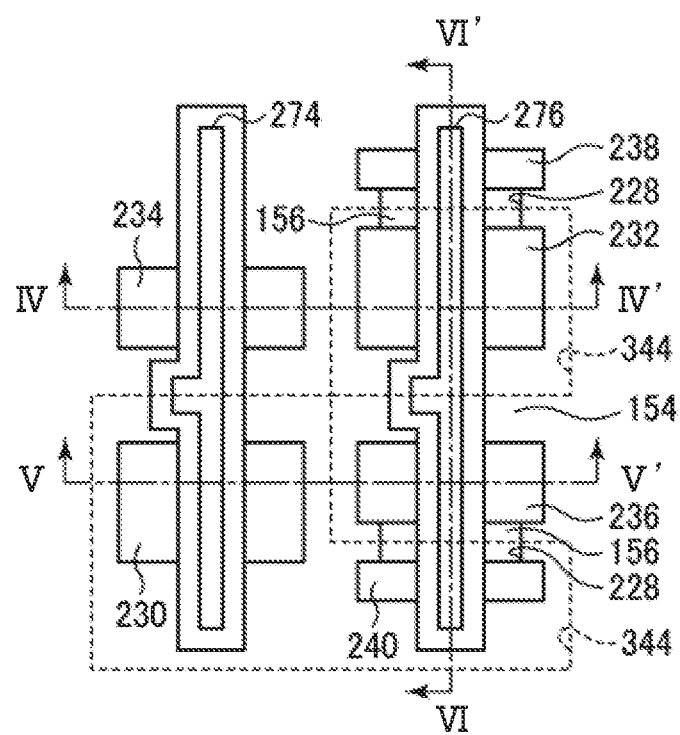
FIG. 75 is a process chart (part 21) illustrating the manufacturing method of the semiconductor device according to the second embodiment.
Figure 76A:
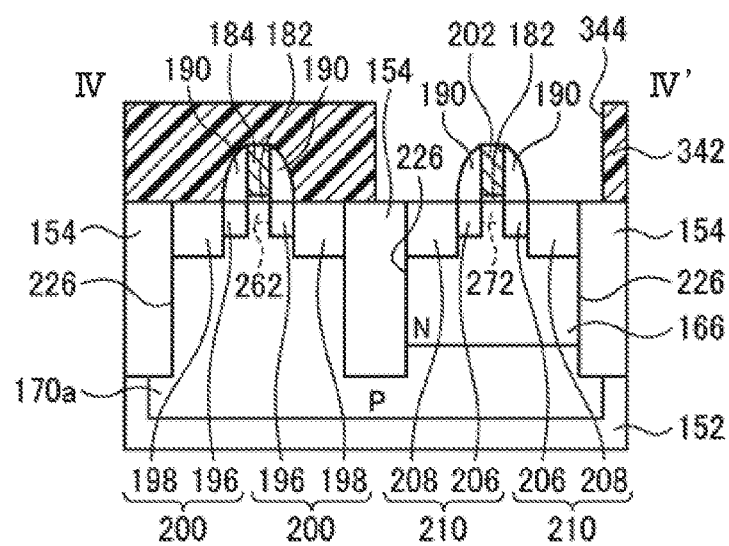
FIGS. 76A, 76B and 76C each are a process chart (part 22) illustrating the manufacturing method of the semiconductor device according to the second embodiment.
Figure 76B:
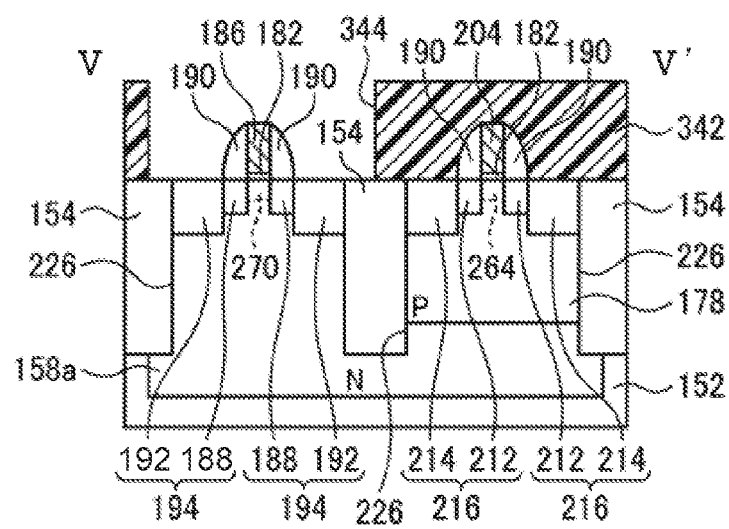
Figure 76C:
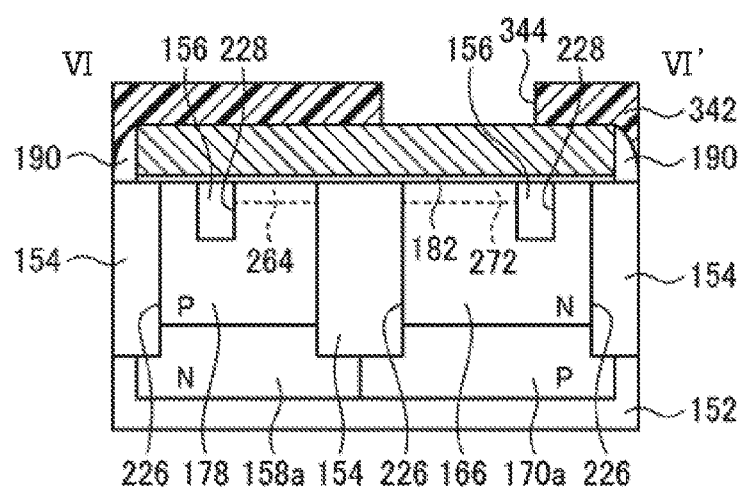
Figure 77:
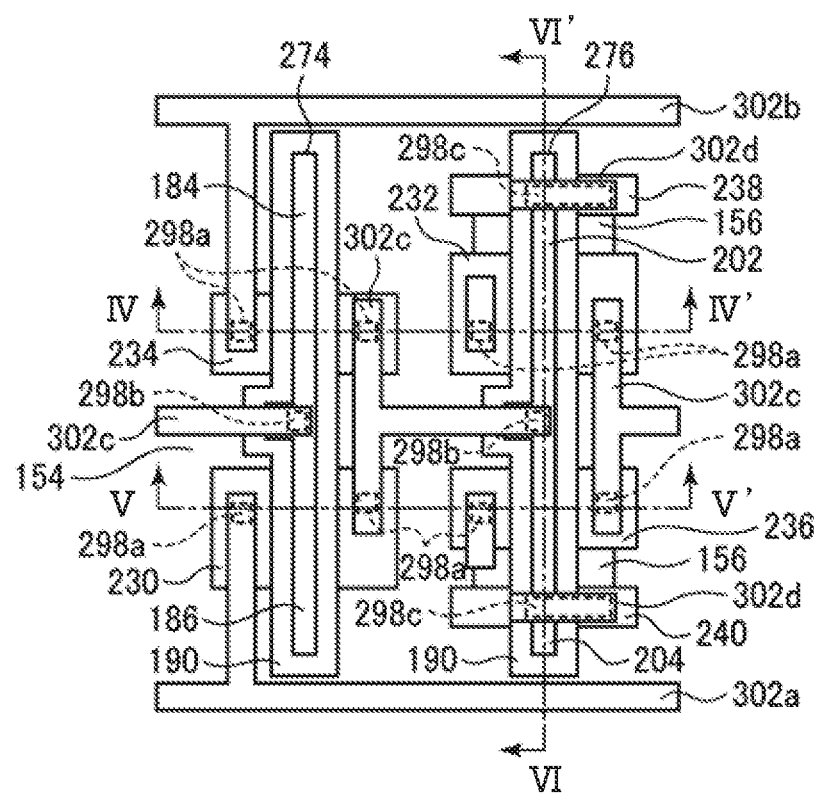
FIG. 77 is a process chart (part 23) illustrating the manufacturing method of the semiconductor device according to the second embodiment.
Figure 78A:
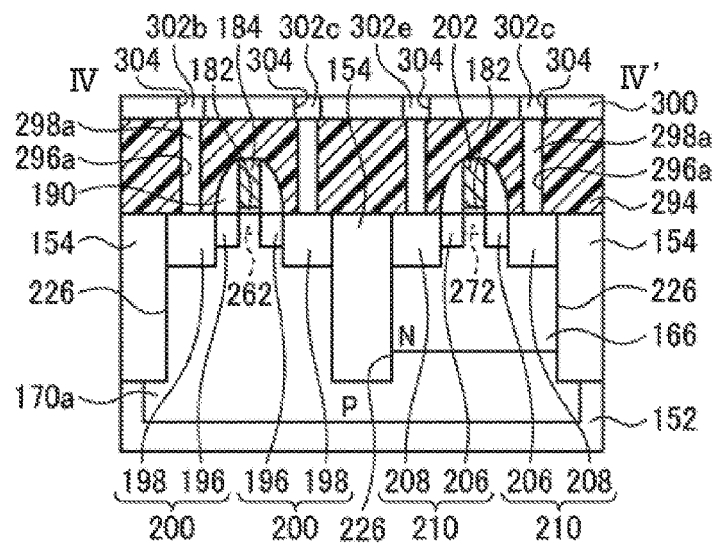
FIGS. 78A, 78B and 78C each are a process chart (part 24) illustrating the manufacturing method of the semiconductor device according to the second embodiment.
Figure 78B:
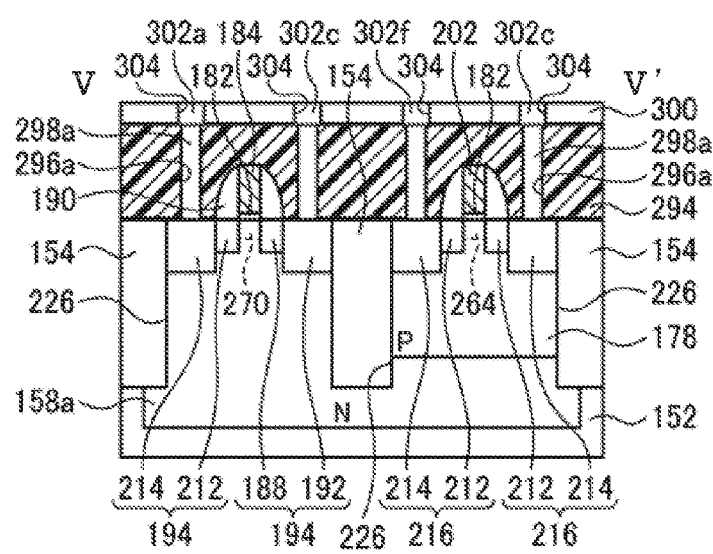
Figure 78C:
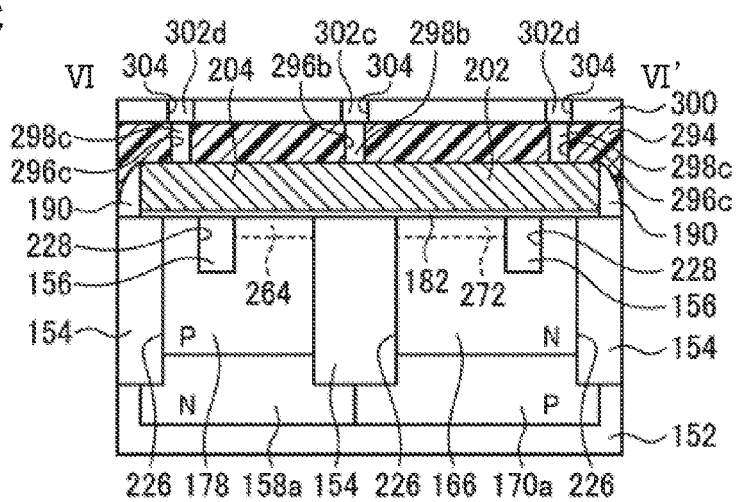
Figure 79:
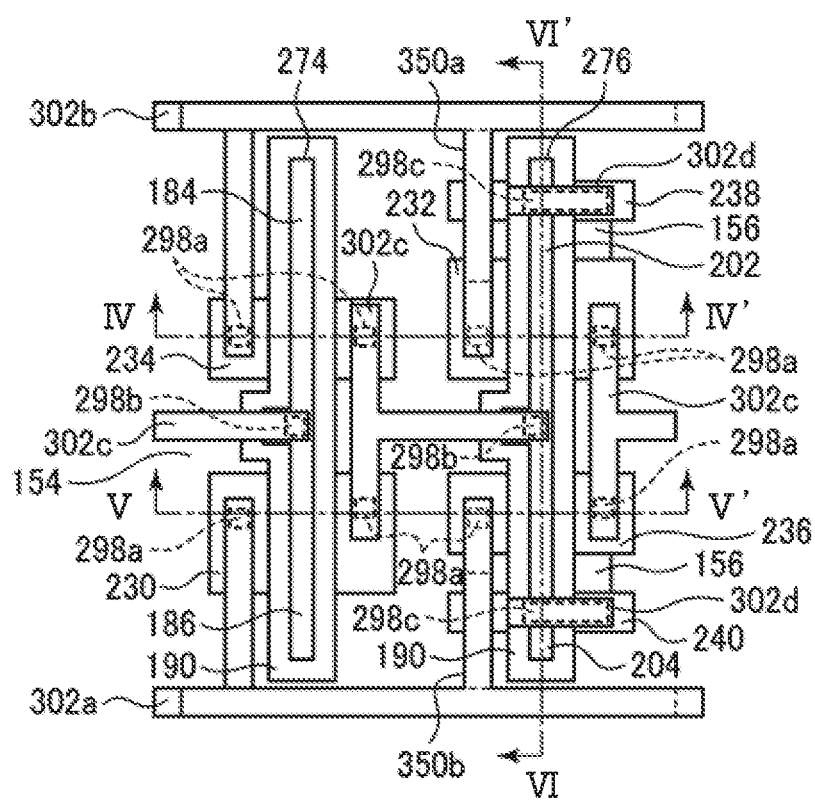
FIG. 79 is a process chart (part 25) illustrating the manufacturing method of the semiconductor device according to the second embodiment.
Figure 80A:
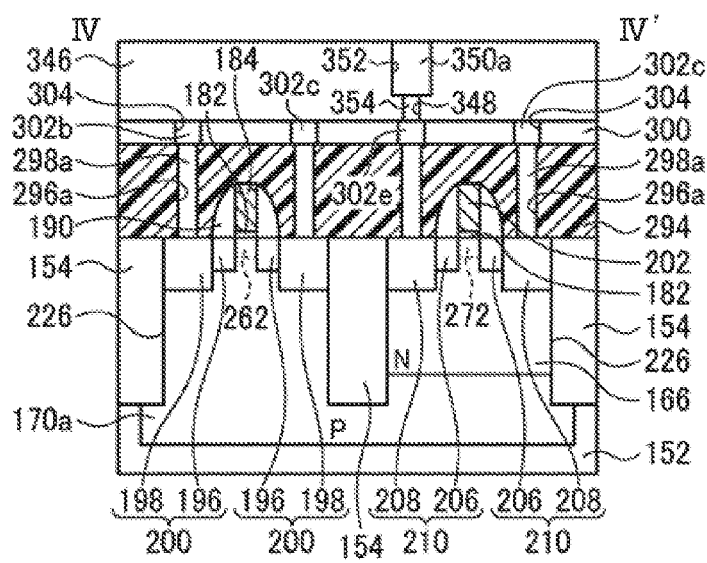
FIGS. 80A, 80B and 80C each are a process chart (part 26) illustrating the manufacturing method of the semiconductor device according to the second embodiment.
Figure 80B:
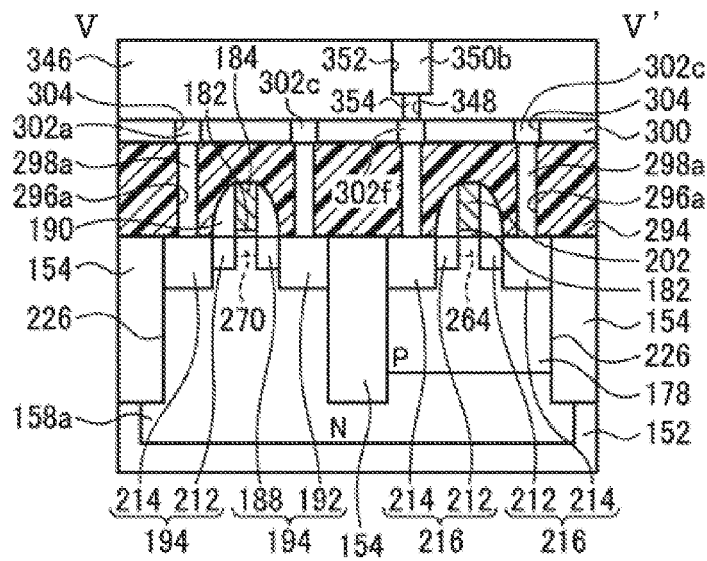
Figure 80C:
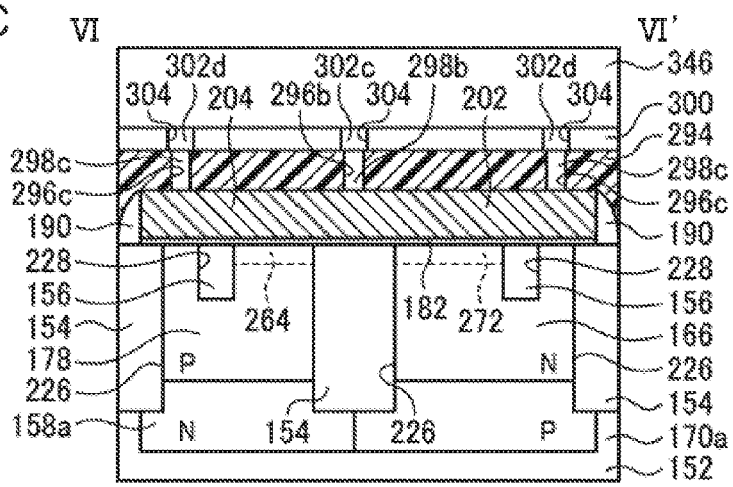

FIG. 54 are sectional views illustrating a part of the semiconductor device according to the present embodiment. FIG. 54A is a sectional view corresponding to a IV-IV' line in FIG. 53, and FIG. 54B is a sectional view corresponding to a V-V' line in FIG. 53.

As illustrated in FIG. 54, the element region 234 where the NMOS transistor 14 is formed and the element region 232 where the P-channel type DTMOS transistor 24 is formed are adjacently disposed. A P-type well 170a formed at a region including the element region 234 where the NMOS transistor 14 is formed and the P-type well 170a at downward of the element region 232 where the P-channel type DTMOS transistor 24 is formed are integrally formed. A distance D3 between the element region 234 where the NMOS transistor 14 is formed and the element region 232 where the P-channel type DTMOS transistor 24 is formed is set at, for example, approximately 0.12 μm.

Besides, the element region 230 where the PMOS transistor 12 is formed and the element region 236 where the N-channel type DTMOS transistor 26 is formed are adjacently disposed. An N-type well 158a formed at a region including the element region 230 where the PMOS transistor 12 is formed and the N-type well 158a at downward of the element region 236 where the N-channel type DTMOS transistor 26 is formed are integrally formed. A distance D4 between the element region 230 where the PMOS transistor 12 is formed and the element region 236 where the N-channel type DTMOS transistor 26 is formed is set at, for example, approximately 0.12 μm.

In case of the first embodiment, as illustrated in FIG. 8 and FIG. 9, the element region 230 where the PMOS transistor 12 is formed and the element region 232 where the P-channel type DTMOS transistor 24 is formed are adjacently disposed. The N-type well 158 is formed at the element region 230 where the PMOS transistor 12 is formed, and the P-type well 162 is formed at the element region 232 where the P-channel type DTMOS transistor 24 is formed. When the N-type dopant impurity introduced into the N-type well 158 is introduced into a part of the element region 232 where the P-channel type DTMOS transistor 24 is formed, a short circuit between the N-type well 158 and the N-type well 166 is incurred, and there is a possibility of malfunction. Besides, when the P-type dopant impurity introduced into the P-type well 162 is introduced into a part of the element region 230 where the PMOS transistor 12 is formed, the short circuit between the source/drain region 194 and the P-type well 162 is incurred, and there is a possibility of malfunction. Accordingly, a distance D1 between the element region 230 where the PMOS transistor 12 is formed and the element region 232 where the P-channel DTMOS transistor 24 is formed is set to be enough large. In case of the first embodiment, the distance D1 between the element region 230 where the PMOS transistor 12 is formed and the element region 232 where the P-channel type DTMOS transistor 24 is formed is set at, for example, approximately 0.27 μm.

Besides, in case of the first embodiment, as illustrated in FIG. 8 and FIG. 9, the element region 234 where the NMOS transistor 14 is formed and the element region 236 where the N-channel type DTMOS transistor 26 is formed are adjacently disposed. The P-type well 170 is formed at the element region 234 where the NMOS transistor 14 is formed, and the N-type well 174 is formed at the element region 236 where the N-channel type DTMOS transistor 26 is formed. When the P-type dopant impurity introduced into the P-type well 170 is introduced into a part of the element region 236 where the N-channel type DTMOS transistor 26 is formed, the short circuit between the P-type well 170 and the P-type well 178 is incurred, and there is a possibility of malfunction. Besides, when the N-type dopant impurity introduced into the N-type well 174 is introduced into a part of the element region 234 where the NMOS transistor 14 is formed, the short circuit between the source/drain region 200 and the N-type well 174 is incurred, and there is a possibility of malfunction. Accordingly, a distance D2 between the element region 234 where the NMOS transistor 14 is formed and the element region 236 where the N-channel DTMOS transistor 26 is formed is set to be enough large. In case of the first embodiment, the distance D2 between the element region 234 where the NMOS transistor 14 is formed and the element region 236 where the N-channel type DTMOS transistor 26 is formed is set at, for example, approximately 0.27 μm.

On the other hand, in the present embodiment, the element region 234 where the NMOS transistor 14 is formed and the element region 232 where the P-channel type DTMOS transistor 24 is formed are adjacently disposed. The P-type well 170a formed at the element region 234 where the NMOS transistor 14 is formed and the P-type well 170a formed at the element region 232 where the P-channel type DTMOS transistor 24 is formed are the same conductivity type. Besides, even when the N-type dopant impurity introduced into the N-type well 166 is introduced into a part of the element region 234 where the NMOS transistor 14 is formed, the conductivity type of the dopant impurity is the N-type, and therefore, there is no particular problem. Accordingly, in the present embodiment, a design standard when wells having the different conductivity types from one another are adjacently formed is not applied for a setting of the distance D3 between the element region 234 where the NMOS transistor 14 is formed and the element region 232 where the P-channel type DTMOS transistor 24 is formed. The design standard applied for the setting of the distance D3 is a design standard when the source/drain regions 200, 210 having the different conductivity types from one another are adjacently formed. Accordingly, the distance D3 between the element region 234 where the NMOS transistor 14 is formed and the element region 232 where the P-channel type DTMOS transistor 24 is formed can be set small such as, for example, approximately 0.12 μm.

Besides, in the present embodiment, the element region 230 where the PMOS transistor 12 is formed and the element region 236 where the N-channel type DTMOS transistor 26 is formed are adjacently disposed. The N-type well 158a formed at the element region 230 where the PMOS transistor 12 is formed and the N-type well 158a formed at the element region 236 where the N-channel type DTMOS transistor 26 is formed are the same conductivity type. Besides, even when the P-type dopant impurity introduced into the P-type well 178 is introduced into a part of the element region 230 where the PMOS transistor 12 is formed, the conductivity type of the dopant impurity is the P-type, and therefore, there is no particular problem. Accordingly, in the present embodiment, a design standard when wells in the different conductivity types from one another are adjacently formed is not applied for a setting of the distance D4 between the element region 230 where the PMOS transistor 12 is formed and the element region 236 where the N-channel type DTMOS transistor 26 is formed. The design standard applied for the setting of the distance D4 is a design standard when the source/drain regions 194, 216 having the different conductivity types from one another are adjacently formed. Accordingly, the distance D4 between the element region 230 where the PMOS transistor 12 is formed and the element region 236 where the N-channel type DTMOS transistor 26 is formed can be set small such as, for example, approximately 0.12 μm.

As stated above, according to the present embodiment, it is possible to make the distance D3 between the element region 234 where the NMOS transistor 14 is formed and the element region 232 where the P-channel type DTMOS transistor 24 is formed small. Besides, it is possible to make the distance D4 between the element region 230 where the PMOS transistor 12 is formed and the element region 236 where the N-channel type DTMOS transistor 26 is formed small. Therefore, according to the present embodiment, it is possible to make the size of the logic cell 10 small, and to contribute to small-sizing of the semiconductor device.

(Manufacturing Method of Semiconductor Device)

Next, a manufacturing method of a semiconductor device according to the present embodiment is described by using FIG. 55 to FIG. 80. FIG. 55 to FIG. 80 are process charts illustrating the manufacturing method of the semiconductor device according to the present embodiment. FIG. 55, FIG. 57, FIG. 59, FIG. 61, FIG. 63, FIG. 65, FIG. 67, FIG. 69, FIG. 71, FIG. 73, FIG. 75, FIG. 77, and FIG. 79 are plan views. FIG. 56, FIG. 58, FIG. 60, FIG. 62, FIG. 64, FIG. 66, FIG. 68, FIG. 70, FIG. 72, FIG. 74, FIG. 76, FIG. 78, and FIG. 80 are sectional views. FIGS. 56A to 56C, FIGS. 58A to 58C, FIGS. 60A to 60C, FIGS. 62A to 62C, FIGS. 64A to 64C, FIGS. 66A to 66C, FIGS. 68A to 68C, FIGS. 70A to 70C, FIGS. 72A to 72C respectively correspond to a IV-IV' cross section, a V-V' cross section, and a VI-VI' cross section in each of FIG. 55, FIG. 57, FIG. 59, FIG. 61, FIG. 63, FIG. 65, FIG. 67, FIG. 69, and FIG. 71. FIGS. 74A to 74C, FIGS. 76A to 76C, FIGS. 78A to 78C, and FIGS. 80A to 80C respectively correspond to a IV-IV' cross section, a V-V' cross section, and a VI-VI' cross section in each of FIG. 73, FIG. 75, FIG. 77, and FIG. 79.

At first, as same as the manufacturing method of the semiconductor device according to the first embodiment described by using FIG. 17 to FIG. 26, the element regions 230, 232, 234, 236 are defined by the element isolation regions 154, 156. Besides, the well tap regions 238, 240 to form the contact layers 169, 181 are defined by the element isolation regions 154, 156. Note that the element region 234 to form the NMOS transistor 14 and the element region 232 to form the P-channel type DTMOS transistor 24 are set to be adjacent in a horizontal direction of the drawing in FIG. 43 and FIG. 44. Besides, the element region 230 to form the PMOS transistor 12 and the element region 236 to form the N-channel type DTMOS transistor 26 are adjacently disposed in the horizontal direction of the drawing in FIG. 43 and FIG. 44 (refer to FIG. 55 and FIG. 56).

Next, a photoresist film 306 is formed at the whole surface by, for example, the spin coat method.

Next, the photoresist film 306 is patterned by using the photolithography technique. An opening part 308 exposing a region where the N-type well 158a is formed is formed at the photoresist film 306.

Next, an N-type dopant impurity is introduced into the semiconductor substrate 152 by, for example, the ion implanting method while using the photoresist film 306 as the mask. As the N-type dopant impurity, for example, P is used. The acceleration energy is, for example, 300 keV to 400 keV. The dose amount is, for example, approximately $1.0 \times 10^{13}$ cm$^{-2}$ to $5.0 \times 10^{13}$ cm$^{-2}$. The N-type wells 158a, 174 are thereby formed (refer to FIG. 57 and FIG. 58).

Next, the photoresist film 306 is removed by, for example, the ashing.

Next, a photoresist film 310 is formed at the whole surface by, for example, the spin coat method.

Next, the photoresist film 310 is patterned by using the photolithography technique. An opening part 312 exposing a region where the P-type well 170a is formed is formed at the photoresist film 310.

Next, a P-type dopant impurity is introduced into the semiconductor substrate 152 by, for example, the ion implanting method while using the photoresist film 310 as the mask. As the P-type dopant impurity, for example, B is used. The acceleration energy is, for example, 100 keV to 200 keV. The dose amount is, for example, approximately $1.0 \times 10^{13}$ cm$^{-2}$ to $5.0 \times 10^{13}$ cm$^{-2}$. The P-type well 170a is thereby formed (refer to FIG. 59 and FIG. 60).

Next, the photoresist film 310 is removed by, for example, the ashing.

Next, a photoresist film 314 is formed at the whole surface by, for example, the spin coat method.

Next, the photoresist film 314 is patterned by using the photolithography technique. An opening part 316 exposing a region where the P-type well 178 is formed is thereby formed at the photoresist film 314.

Next, a P-type dopant impurity is introduced into the semiconductor substrate 152 by, for example, the ion implanting method while using the photoresist film 314 as the mask. As the P-type dopant impurity, for example, B is used. The acceleration energy is, for example, 30 keV to 65 keV. The dose amount is, for example, approximately $5.0 \times 10^{12}$ cm$^{-2}$ to $5.0 \times 10^{13}$ cm$^{-2}$. The P-type well (body region) 178 is thereby formed (refer to FIG. 61 and FIG. 62).

Next, the photoresist film 314 is removed by, for example, the ashing.

Next, a photoresist film 318 is formed at the whole surface by, for example, the spin coat method.

Next, the photoresist film 318 is patterned by using the photolithography technique. An opening part 320 exposing a region where the N-type well 166 is formed is thereby formed at the photoresist film 318.

Next, an N-type dopant impurity is introduced into the semiconductor substrate 152 by, for example, the ion implanting method while using the photoresist film 318 as the mask. As the N-type dopant impurity, for example, P is used. The acceleration energy is, for example, 100 keV to 160 keV. The dose amount is, for example, approximately $5.0 \times 10^{12}$ cm$^{-2}$ to $5.0 \times 10^{13}$ cm$^{-2}$. The N-type well (body region) 166 is thereby formed (refer to FIG. 63 and FIG. 64).

Next, the photoresist film 318 is removed by, for example, the ashing.

Next, a photoresist film 322 is formed at the whole surface by, for example, the spin coat method.

Next, the photoresist film 322 is patterned by using the photolithography technique. An opening part 324 exposing the element region 234 where the NMOS transistor 14 is formed and the opening part 324 exposing the element region 236 where the N-channel type DTMOS transistor 26 is formed are thereby formed at the photoresist film 322.

Next, a P-type dopant impurity is introduced into the semiconductor substrate 152 by, for example, the ion implanting method while using the photoresist film 322 as the mask. As the P-type dopant impurity, for example, In is used. The acceleration energy is, for example, 50 keV to 100 keV. The dose amount is, for example, $1.5 \times 10^{13}$ cm$^{-2}$ or less. The P-type channel dope layer (channel impurity layer) 262 is thereby formed at the element region 234 where the NMOS transistor 14 is formed. Besides, the P-type channel dope layer 264 is formed at the element region 236 where the N-channel type DTMOS transistor 26 is formed (refer to FIG. 65 and FIG. 66).

Next, the photoresist film 322 is removed by, for example, the ashing.

Next, a photoresist film 326 is formed at the whole surface by, for example, the spin coat method.

Next, the photoresist film 326 is patterned by using the photolithography technique. An opening part 328 exposing the element region 230 where the PMOS transistor 12 is formed and the opening part 328 exposing the element region 232 where the P-channel type DTMOS transistor 24 is formed are thereby formed at the photoresist film 326.

Next, an N-type dopant impurity is introduced into the semiconductor substrate 152 by, for example, the ion implanting method while using the photoresist film 326 as the mask. As the N-type dopant impurity, for example, As is used. The acceleration energy is, for example, 50 keV to 100 keV. The dose amount is, for example, $1.0 \times 10^{13}$ cm$^{-2}$ or less. The N-type channel dope layer 270 is thereby formed at the element region 230 where the PMOS transistor 12 is formed. Besides, the N-type channel dope layer 272 is formed at the element region 232 where the P-channel type DTMOS transistor 24 is formed (refer to FIG. 67 and FIG. 68).

Next, the photoresist film 326 is removed by, for example, the asking.

Next, the heat treatment to activate the dopant impurities at the channel dope layers 262, 264, 270, 272 is performed. The heat treatment temperature is, for example, at approximately 900° C. to 1000° C. The heat treatment time is, for example, 10 seconds or less. The atmosphere when the heat treatment is performed is, for example, the nitrogen (N$_2$) atmosphere.

The heat treatment may be the spike annealing.

Figure 39:
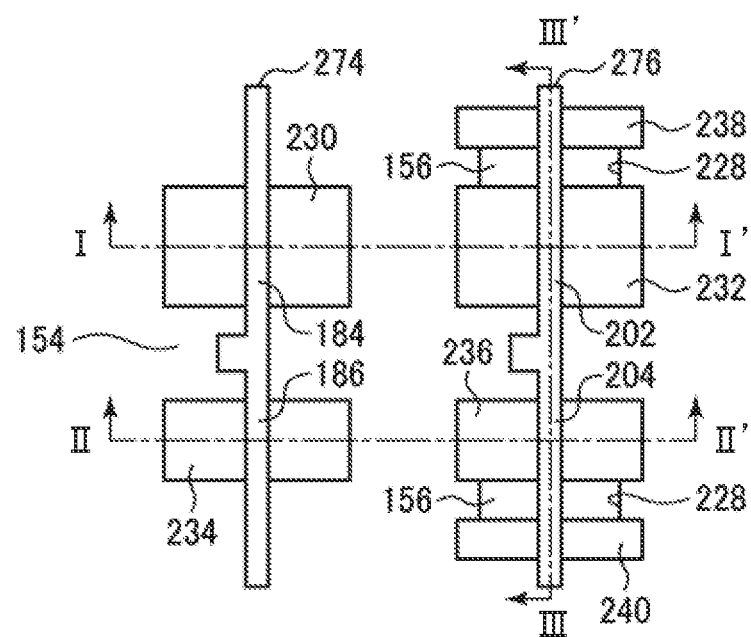
FIG. 39 is a process chart (part 23) illustrating the manufacturing method of the semiconductor device according to the first embodiment.
Figure 40A:
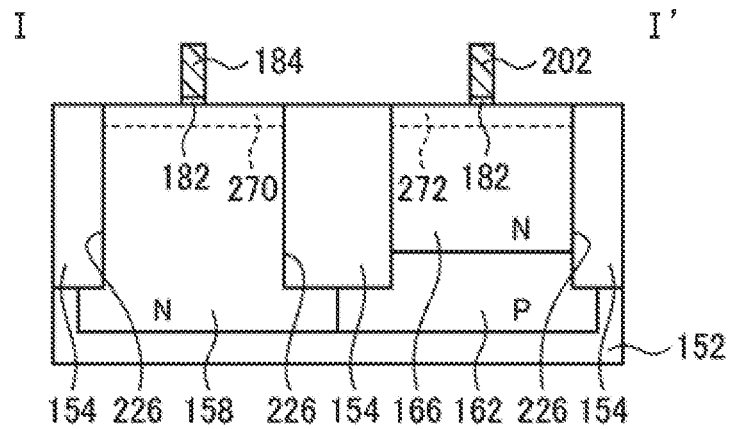
FIGS. 40A, 40B and 40C each are a process chart (part 24) illustrating the manufacturing method of the semiconductor device according to the first embodiment.
Figure 40B:
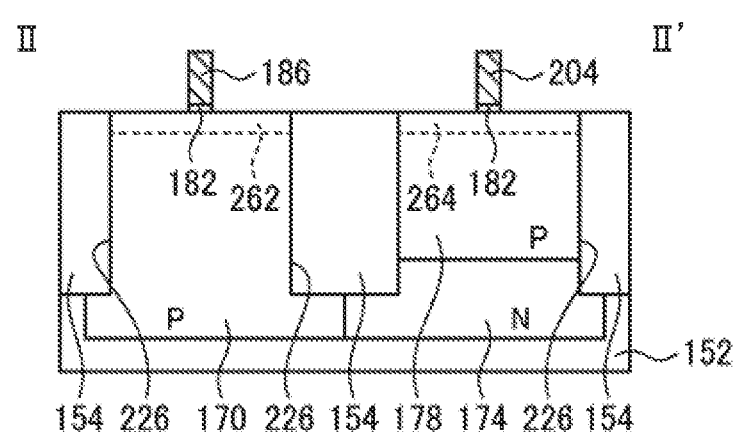
Figure 40C:
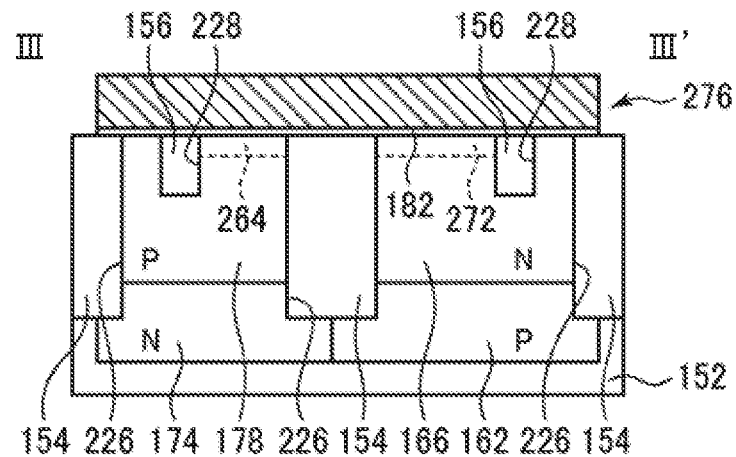
Figure 41:
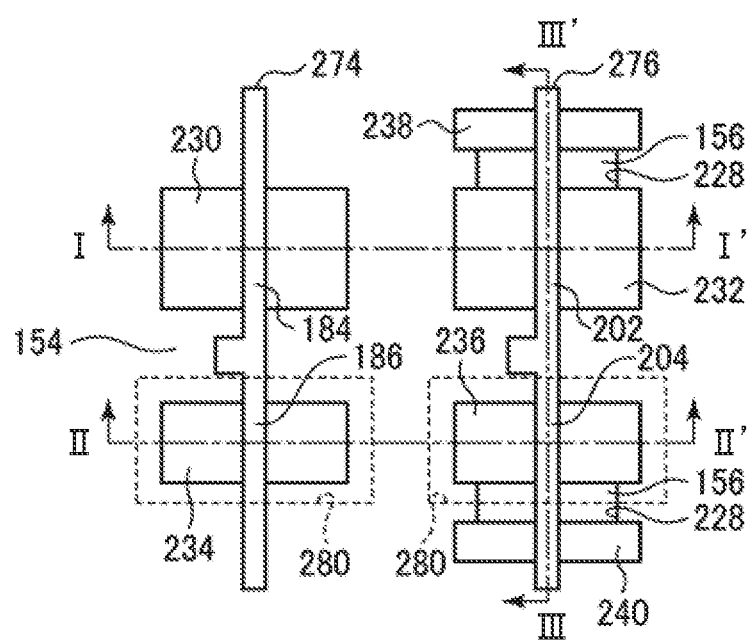
FIG. 41 is a process chart (part 25) illustrating the manufacturing method of the semiconductor device according to the first embodiment.
Figure 42A:
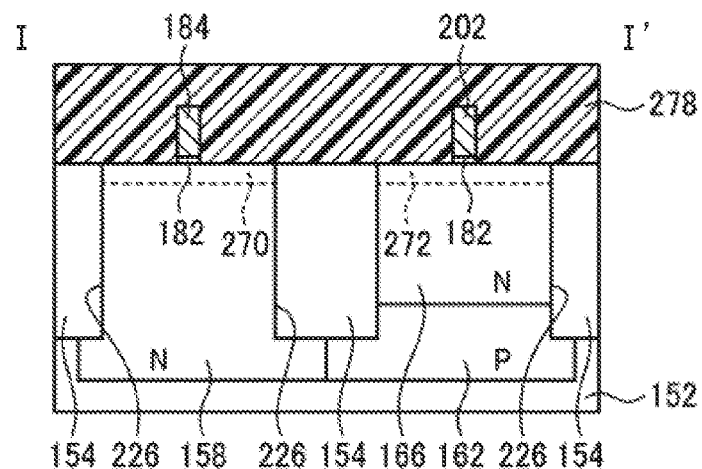
FIGS. 42A, 42B and 42C each are a process chart (part 26) illustrating the manufacturing method of the semiconductor device according to the first embodiment.
Figure 42B:
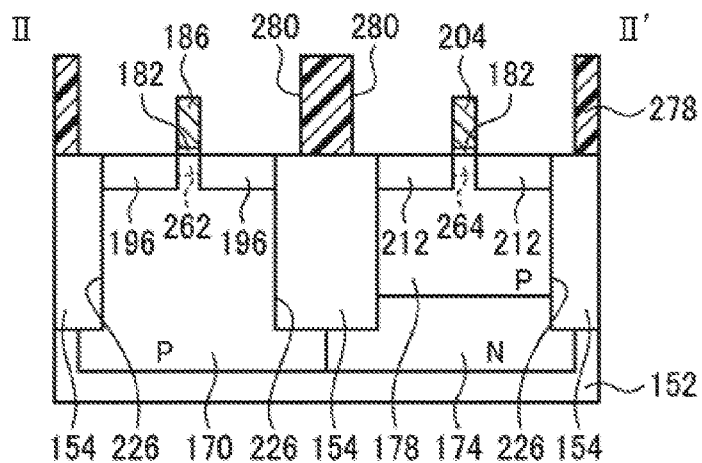
Figure 42C:
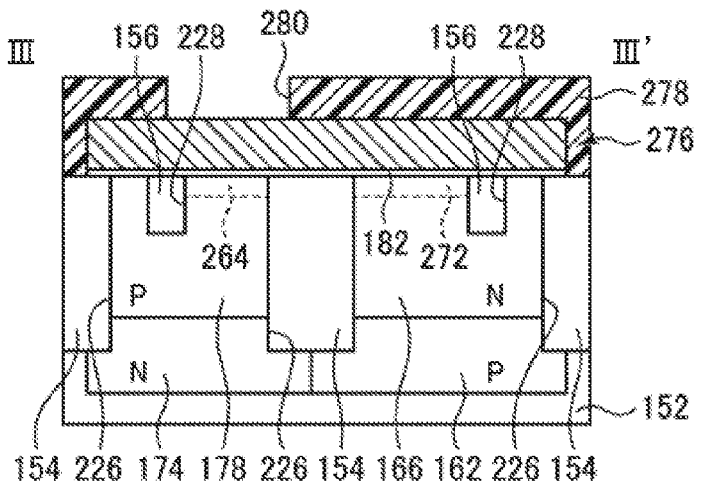
Figure 43:
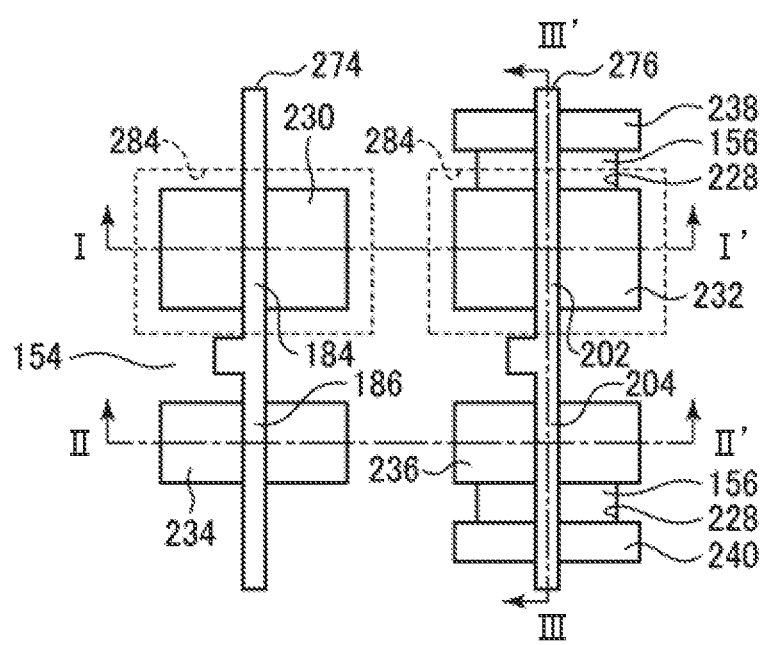
FIG. 43 is a process chart (part 27) illustrating the manufacturing method of the semiconductor device according to the first embodiment.
Figure 44A:
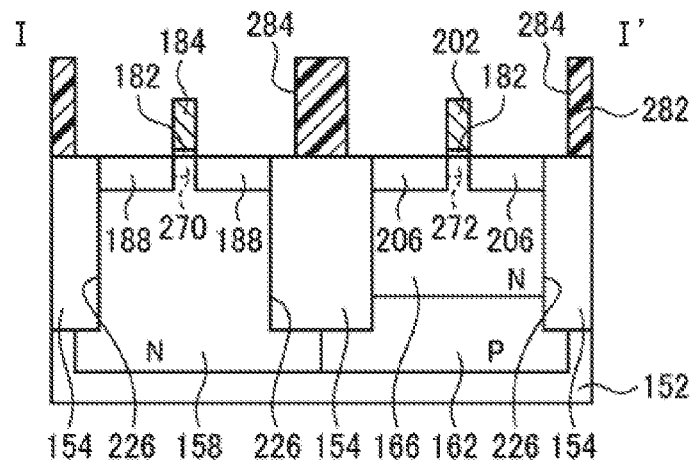
FIGS. 44A, 44B and 44C each are a process chart (part 28) illustrating the manufacturing method of the semiconductor device according to the first embodiment.
Figure 44B:
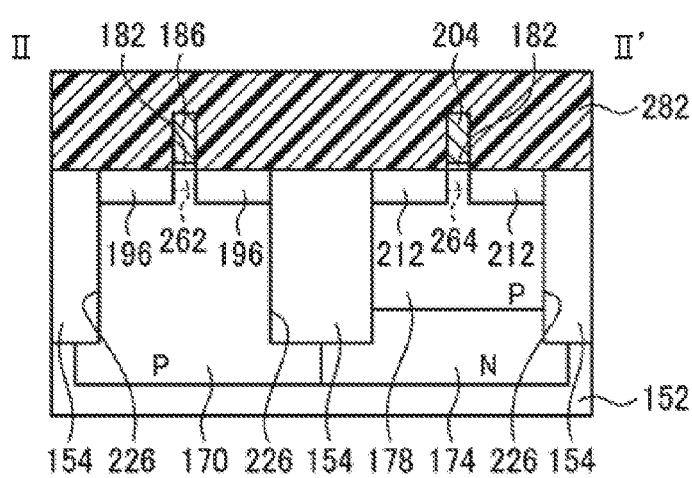
Figure 44C:
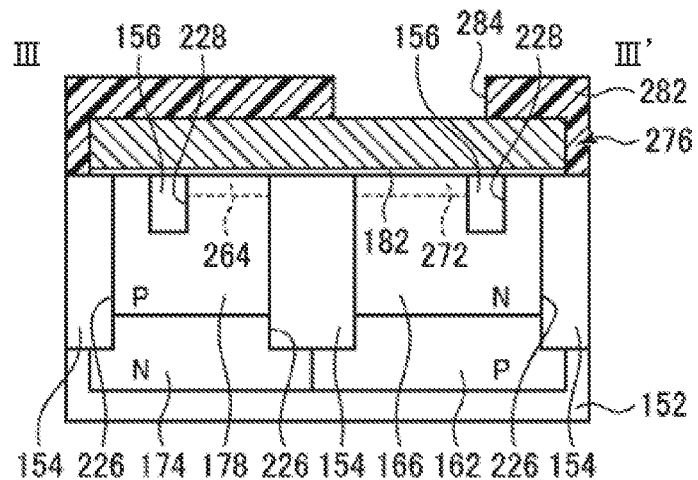

From the process forming the gate insulating film 182 to the process forming the gate wiring 276 after this are the same as the manufacturing method of the semiconductor device according to the first embodiment described by using FIG. 39 and FIG. 40, and therefore, it is not described.

Next, a photoresist film 330 is formed at the whole surface by, for example, the spin coat method.

Next, the photoresist film 330 is patterned by using the photolithography technique. An opening part 332 exposing the element region 234 where the NMOS transistor 14 is formed and the opening part 332 exposing the element region 236 where the N-channel type DTMOS transistor 26 is formed are thereby formed at the photoresist film 330.

Next, an N-type dopant impurity is introduced into the semiconductor substrate 152 at both sides of the gate electrodes 186, 204 by, for example, the ion implanting method while using the photoresist film 330 and the gate electrodes 186, 204 as the masks. As the N-type dopant impurity, for example, arsenic (As) is used. The acceleration energy is, for example, approximately 1 keV to 5 keV. The dose amount is, for example, approximately $1.0 \times 10^{14}$ cm$^{-2}$ to $1.5 \times 10^{15}$ cm$^{-2}$. The N-type extension regions (low-concentration impurity regions) 196, 212 each forming the shallow region in the extension source/drain structure are thereby formed (refer to FIG. 69 and FIG. 70).

Next, a pocket region (Halo region) (not-illustrated) is formed according to need. When the pocket region is formed, a P-type dopant impurity is obliquely implanted by, for example, the ion implantation method while using the photoresist film 330 and the gate electrodes 186, 204 as the masks.

After this, the photoresist film 330 is removed by, for example, the asking.

Next, a photoresist film 334 is formed at the whole surface by, for example, the spin coat method.

Next, the photoresist film 334 is patterned by using the photolithography technique. An opening part 336 exposing the element region 230 where the PMOS transistor 12 is formed and the opening part 336 exposing the element region 232 where the P-channel type DTMOS transistor 24 is formed are thereby formed at the photoresist film 334.

Next, a P-type dopant impurity is introduced into the semiconductor substrate 152 at both sides of the gate electrodes 184, 202 by, for example, the ion implanting method while using the photoresist film 334 and the gate electrodes 184, 202 as the masks. As the P-type dopant impurity, for example, B is used. The acceleration energy is, for example, approximately 0.2 keV to 1 keV. The dose amount is, for example, approximately $1.0 \times 10^{14}$ cm$^{-2}$ to $1.5 \times 10^{15}$ cm$^{-2}$. The P-type extension regions (low-concentration impurity region) 188, 206 each forming the shallow region in the extension source/drain structure are thereby formed (refer to FIG. 71 and FIG. 72).

Next, a pocket region (not-illustrated) is formed according to need. When the pocket region is formed, an N-type dopant impurity is obliquely implanted by, for example, the ion implanting method while using the photoresist film 334 and the gate electrodes 184, 202 as the masks.

After this, the photoresist film 334 is removed by, for example, the asking.

The process forming the sidewall spacer 190 after this is the same as the manufacturing method of the semiconductor device according to the first embodiment described by using FIG. 45 and FIG. 46, and therefore, it is not described.

Next, a photoresist film 338 is formed at the whole surface by, for example, the spin coat method.

Next, the photoresist film 338 is patterned by using the photolithography technique. An opening part 340 exposing the element region 234 where the NMOS transistor 14 is formed and the well tap region 238 is thereby formed at the photoresist film 338. Besides, the opening part 340 exposing the element region 236 where the N-channel type DTMOS transistor 26 is formed is formed at the photoresist film 338.

Next, an N-type dopant impurity is introduced into the semiconductor substrate 152 at both sides of the gate electrodes 186, 204 by, for example, the ion implanting method while using the gate electrodes 186, 204 where the sidewall spacers 190 are each formed and the photoresist film 338 as the masks. As the N-type dopant impurity, for example, P is used. The acceleration energy is, for example, approximately 5 keV to 10 keV. The dose amount is, for example, approximately $3.0 \times 10^{15}$ cm$^{-2}$ to $1.5 \times 10^{16}$ cm$^{-2}$. The N-type high-concentration impurity regions 198, 214 each forming the deep region in the extension source/drain structure are thereby formed. The source/drain regions 200 of the NMOS transistor 14 are each formed by the N-type low-concentration impurity region 196 and the N-type high-concentration impurity region 198. The source/drain regions 216 of the N-channel type DTMOS transistor 26 are each formed by the N-type low-concentration impurity region 212 and the N-type high-concentration impurity region 214. Besides, the N-type contact layer 169 is formed at the well tap region 238 (refer to FIG. 73 and FIG. 74).

After that, the photoresist film 338 is removed by, for example, the asking.

Next, a photoresist film 342 is formed at the whole surface by, for example, the spin coat method.

Next, the photoresist film 342 is patterned by using the photolithography technique. An opening part 344 exposing the element region 230 where the PMOS transistor 12 is formed and the well tap region 240 is thereby formed at the photoresist film 342. Besides, the opening part 344 exposing the element region 232 where the P-channel type DTMOS transistor 24 is formed is formed at the photoresist film 342.

Next, a P-type dopant impurity is introduced into the semiconductor substrate 152 at both sides of the gate electrodes 184, 202 by, for example, the ion implanting method while using the gate electrodes 184, 202 where the sidewall spacers 190 are each formed and the photoresist film 342 as the masks. As the P-type dopant impurity, for example, B is used. The acceleration energy is, for example, approximately 2 keV to 6 keV. The dose amount is, for example, approximately $3.0\times10^{15}$ cm$^{-2}$ to $1.5\times10^{15}$ cm$^{-2}$. The P-type high-concentration impurity regions 192, 208 each forming the deep region in the extension source/drain structure are thereby formed. The source/drain regions 194 of the PMOS transistor 12 are each formed by the P-type low-concentration impurity region 188 and the P-type high-concentration region 192. The source/drain regions 210 of the P-channel type DTMOS transistor 24 are each formed by the P-type low-concentration impurity region 206 and the P-type high-concentration impurity region 208. Besides, the P-type contact layer 181 is formed at the well tap region 240 (refer to FIG. 75 and FIG. 76).

After this, the photoresist film 342 is removed by, for example, the asking.

Next, the heat treatment (annealing) to activate the dopant impurities is performed. The heat treatment temperature is, for example, at approximately 950° C. to 1050° C. The heat treatment method is, for example, the spike annealing. The atmosphere when the heat treatment is performed is the nitrogen atmosphere.

Figure 51:
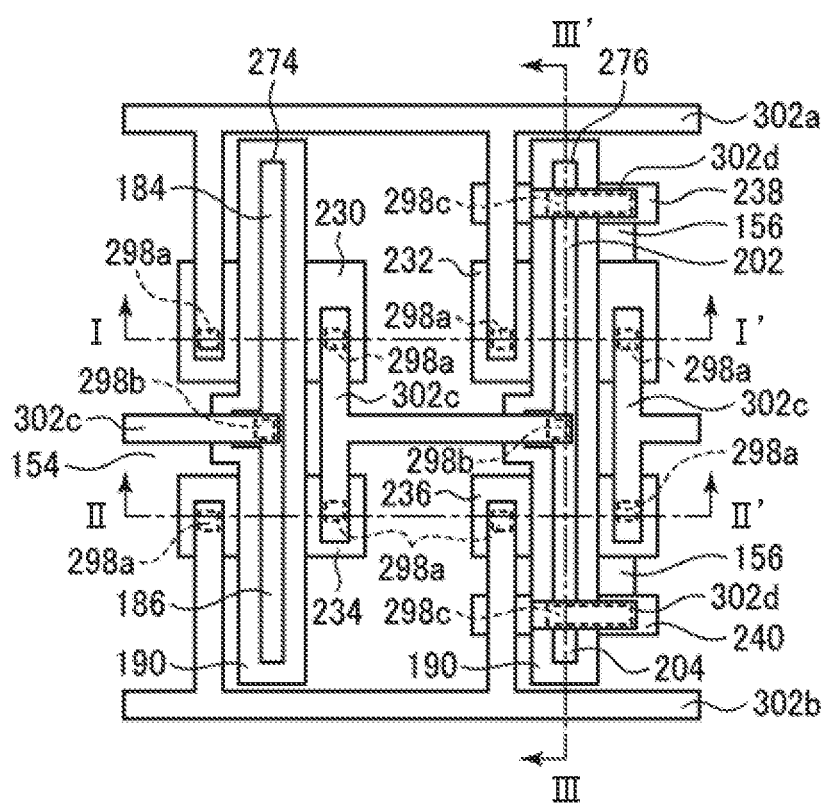
FIG. 51 is a process chart (part 35) illustrating the manufacturing method of the semiconductor device according to the first embodiment.

From the process forming the interlayer insulating film 294 to the process forming the interlayer insulating film 300 after this are the same as the manufacturing method of the semiconductor device according to the first embodiment described by using FIG. 51 and FIG. 52, and therefore, it is not described.

Next, the grooves 304 to embed the wirings 302a to 302f are formed at the interlayer insulating film 300 by using the photolithography technique. The upper parts of the conductive plugs 296a to 296c are thereby exposed in the grooves 304.

Next, a Ta barrier metal film (not-illustrated) with a film thickness of, for example, approximately 2 nm to 5 nm is formed at the whole surface by, for example the sputtering method.

Next, a Cu seed layer (not-illustrated) with a film thickness of, for example, approximately 3 nm to 7 nm is formed at the whole surface by, for example, the sputtering method.

Next, a Cu film with a film thickness of, for example, approximately 800 nm to 1 μm is formed at the whole surface by, for example, the electrolytic plating method.

Next, the Cu film and the barrier metal film are polished until a surface of the interlayer insulating film 300 is exposed by, for example, the CMP method. The Cu wiring (power supply line) 302a which is electrically connected to the power supply potential VDD is thereby embedded in the interlayer insulating film 300. Besides, the Cu wiring (power supply line) 302b which is electrically connected to the ground potential VSS is embedded in the interlayer insulating film 300. Besides, the Cu wiring (signal line) 302c is embedded in the interlayer insulating film 300. Besides, the Cu electric conductor 302d is formed also on the electric conductor 298c connecting between the gate electrode 202 and the well tap region 238. Besides, the Cu electric conductor 302d is formed also on the electric conductor 298c connecting between the gate electrode 204 and the well tap region 240. Besides, the Cu wiring 302e which is electrically connected to the source region 210 of the P-channel type DTMOS transistor 24 is embedded in the interlayer insulating film 300. Besides, the Cu wiring 302f which is electrically connected to the source region 216 of the N-channel type DTMOS transistor 26 is embedded in the interlayer insulating film 300 (refer to FIG. 77 and FIG. 78).

Next, an interlayer insulating film 346 of a silicon oxide film to which carbon is added with a film thickness of, for example, approximately 350 nm to 500 nm is formed by, for example, the CVD method.

Next, contact holes 348 respectively reaching the wirings 302e, 302f are formed at the interlayer insulating film 346 by using the photolithography technique.

Next, grooves 352 to embed wirings 350a, 350b are formed at the interlayer insulating film 346 by using the photolithography technique.

Next, a Ta barrier metal film (not-illustrated) with a film thickness of, for example, approximately 2 nm to 5 nm is formed at the whole surface by, for example, the sputtering method.

Next, a Cu seed layer (not-illustrated) with a film thickness of, for example, approximately 3 nm to 7 nm is formed at the whole surface by, for example, the sputtering method.

Next, a Cu film with a film thickness of, for example, approximately 800 nm to 1 μm is formed at the whole surface by, for example, the electrolytic plating method.

Next, the Cu film and the barrier metal film are polished until a surface of the interlayer insulating film 346 is exposed by, for example, the CMP method. The Cu wiring (power supply line) 350a which is electrically connected to the power supply potential VDD and a via (conductive plug) 354 are thereby integrally embedded in the interlayer insulating film 346. Besides, the Cu wiring (power supply line) 350b which is electrically connected to the ground potential VSS and the via 354 are integrally embedded in the interlayer insulating film 346.

The semiconductor device according to the present embodiment is thereby manufactured.

[Modified Embodiment]

Various modifications without being limited to the above-stated embodiments are available.

For example, in the above-stated embodiments, the buffer circuit 10a, the AND circuit 10b, the OR circuit 10c, and the flipflop circuit 10d are cited as the examples of the logic cell 10, but kinds of the logic cell 10 is not limited thereto. It is possible to apply to various kinds of logic cells 10.

Besides, in the above-stated embodiments, it is described by exemplifying the case when the NMOS transistor 14 and the PMOS transistor 12 form the inverter circuit, and the N-channel type DTMOS transistor 26 and the P-channel type DTMOS transistor 24 form the inverter circuit. However, the present invention is not limited thereto. Namely, the NMOS transistor 14 and the PMOS transistor 12 may not form the inverter circuit. Besides, the N-channel type DTMOS transistor 26 and the P-channel type DTMOS transistor 24 may not form the inverter circuit. The region 14A where the NMOS transistor is formed and the region 24A where the P-channel type DTMOS transistor is formed are to be adjacently disposed. Besides, the region 12A where the PMOS transistor is formed and the region 26A where the N-channel type DTMOS transistor is formed are to be adjacently disposed. Even if the inverter circuit and so on are not formed, it is possible to integrally form the well 170a, and to enable small-sizing as long as the region 14A where the NMOS transistor is formed and the region 24A where the P-channel type DTMOS transistor is formed are adjacently disposed. Besides, even if the inverter circuit and so on are not formed, it is possible to integrally form the well 158a, and to enable small-sizing as long as the region 12A where the PMOS transistor is formed and the region 26A where the N-channel type DTMOS transistor is formed are adjacently disposed.

According to a disclosed semiconductor device and a manufacturing method thereof, a first region where a MOS transistor in a second conductivity type which is not a dynamic threshold voltage MOS transistor is formed and a fourth region where a dynamic threshold voltage MOS transistor in a first conductivity type is formed are adjacently disposed. Besides, a second region where a MOS transistor in the first conductivity type which is not the dynamic threshold voltage MOS transistor is formed and a third region where a dynamic threshold voltage MOS transistor in the second conductivity type is formed are adjacently disposed. Accordingly, it is possible to integrally form a first well in the first conductivity type formed at the first region and a fourth well in the first conductivity type formed at the fourth region. Besides, it is possible to integrally form a second well in the second conductivity type formed at the second region and a third well in the second conductivity type formed at the third region. It is therefore possible to make a distance between an element region where the MOS transistor in the second conductivity type which is not the dynamic threshold voltage MOS transistor is formed and an element region where the dynamic threshold voltage MOS transistor in the first conductivity type is formed small. Besides, it is possible to make a distance between an element region where the MOS transistor in the first conductivity type which is not the dynamic threshold voltage MOS transistor is formed and an element region where the dynamic threshold voltage MOS transistor in the second conductivity type is formed small. Accordingly, it is possible to make an area of a memory cell small. It is possible to reduce power consumption by using the dynamic threshold voltage MOS transistor, and to reduce the area of the memory cell, and therefore, it is possible to provide a small-sized semiconductor device whose power consumption is low.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A manufacturing method of a semiconductor device, comprising:
    forming a first well of a first conductivity type in a first region of a semiconductor substrate;
    forming a second well of a second conductivity type that is opposite to the first conductivity type in a second region of the semiconductor substrate;
    forming a third well of the second conductivity type in a third region of the semiconductor substrate;
    forming a fourth well of the first conductivity type in a fourth region of the semiconductor substrate;
    forming a fifth well of the first conductivity type that is shallower than the third well in the third region;
    forming a sixth well of the second conductivity type that is shallower than the fourth well at the fourth region;
    forming a first gate electrode of a first transistor of a first complementary transistor pair on the first well;
    forming a second gate electrode of a second transistor of the complementary transistor pair on the second well;
    forming a third gate electrode of a third transistor of a second complementary transistor pair on the fifth well;
    forming a fourth gate electrode of a fourth transistor of the second complementary transistor pair on the sixth well;
    forming a first source/drain region of the second conductivity type in the first well and of the first transistor;
    forming a second source/drain region of the first conductivity type in the second well and of the second transistor;
    forming a third source/drain region of the second conductivity type in the fifth well and of the third transistor;
    forming a fourth source/drain region of the first conductivity type in the sixth well and of the fourth transistor;
    connecting the first well to a first power supply line, and connecting the third well to a second power supply line;
    forming a first electric conductor electrically connecting the third gate electrode to the fifth well; and
    forming a second electric conductor electrically connecting the fourth gate electrode to the sixth well,
    wherein the semiconductor device includes a logic cell that includes the first complementary transistor pair and the second complementary transistor pair,
    the first complementary transistor pair is electrically connected to an input terminal of the logic cell, and
    the second complementary transistor pair is electrically connected to an output terminal of the logic cell.

2. The manufacturing method of the semiconductor device according to claim 1, wherein:
    the third region is adjacent to the second region;
    the fourth region is adjacent to the first region;
    the third well is connected to the second well;
    the fourth well is connected to the first well.

3. The manufacturing method of the semiconductor device according to claim 1,
    wherein the logic cell is a buffer circuit, an AND circuit, an OR circuit, or a flipflop circuit.

4. The manufacturing method of the semiconductor device according to claim 1,
    wherein the first complementary transistor pair includes a first output node,
    the first output node is electrically connected to the third gate electrode and the fourth gate electrode.

5. The manufacturing method of the semiconductor device according to claim 4, wherein the first output node is electrically connected to the first source/drain region and the second source/drain region.

* * * * *